(12) United States Patent
Shibata et al.

(10) Patent No.: US 11,407,944 B2
(45) Date of Patent: *Aug. 9, 2022

(54) LIGHT-ABSORBING ANISOTROPIC FILM, OPTICAL LAMINATE, AND IMAGE DISPLAY DEVICE

(71) Applicant: FUJIFILM Corporation, Tokyo (JP)

(72) Inventors: Naoya Shibata, Kanagawa (JP); Naoya Nishimura, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 138 days.

This patent is subject to a terminal disclaimer.

(21) Appl. No.: 16/903,802

(22) Filed: Jun. 17, 2020

(65) Prior Publication Data

US 2020/0318011 A1 Oct. 8, 2020

Related U.S. Application Data

(63) Continuation of application No. PCT/JP2018/048379, filed on Dec. 27, 2018.

(30) Foreign Application Priority Data

Dec. 28, 2017 (JP) .............................. JP2017-253980
Apr. 16, 2018 (JP) .............................. JP2018-078719

(51) Int. Cl.
| | | |
|---|---|---|
| *G02F 1/1333* | (2006.01) | |
| *C09K 19/20* | (2006.01) | |
| *C09K 19/60* | (2006.01) | |
| *G02B 5/00* | (2006.01) | |
| *G02B 5/22* | (2006.01) | |
| *G02F 1/1335* | (2006.01) | |
| *G02F 1/1343* | (2006.01) | |
| *C09K 19/04* | (2006.01) | |

(52) U.S. Cl.
CPC ........ *C09K 19/2007* (2013.01); *C09K 19/601* (2013.01); *G02B 5/003* (2013.01); *G02B 5/22* (2013.01); *G02F 1/133512* (2013.01); *G02F 1/134336* (2013.01); *C09K 2019/0448* (2013.01); *C09K 2019/2042* (2013.01); *C09K 2019/2078* (2013.01); *G02F 2202/043* (2013.01)

(58) Field of Classification Search
CPC .............. C09K 19/2007; C09K 19/601; C09K 2019/0448; C09K 2019/2042; C09K 2019/2078; G02F 1/133512; G02F 1/134336; G02F 1/1333; G02B 5/003
See application file for complete search history.

(56) References Cited

U.S. PATENT DOCUMENTS

| | | | | |
|---|---|---|---|---|
| 8,927,070 B2 * | 1/2015 | Iwahashi | ................. | C09B 31/04 |
| | | | | 428/1.31 |
| 10,280,181 B2 * | 5/2019 | Katoh | ................. | C09K 19/601 |
| 10,927,260 B2 * | 2/2021 | Hoshino | ................. | C08F 20/34 |
| 2013/0187090 A1 | 7/2013 | Goto | | |
| 2015/0378068 A1 | 12/2015 | Hatanaka | | |
| 2017/0369783 A1 | 12/2017 | Horiguchi et al. | | |
| 2018/0066189 A1 | 3/2018 | Ishii et al. | | |
| 2018/0346633 A1 | 12/2018 | Hoshino et al. | | |
| 2018/0362768 A1 | 12/2018 | Hoshino et al. | | |
| 2020/0318011 A1 * | 10/2020 | Shibata | ..................... | G09F 9/00 |

FOREIGN PATENT DOCUMENTS

| | | |
|---|---|---|
| CN | 102822142 A | 12/2012 |
| CN | 103305022 A | 9/2013 |
| JP | 55-23169 A | 2/1980 |
| JP | 2011-237513 A | 11/2011 |
| JP | 5437744 B2 | 12/2013 |
| JP | 5923941 B2 | 4/2016 |
| JP | 2017-186232 A | 10/2017 |
| KR | 10-2016-0000862 A | 1/2016 |
| WO | 2016/104317 A1 | 6/2016 |
| WO | 2016/114347 A1 | 7/2016 |

(Continued)

OTHER PUBLICATIONS

Office Action, issued by the State Intellectual Property Office dated Aug. 17, 2021, in connection with Chinese Patent Application No. 201880083664.5.
International Search Report issued in PCT/JP2018/048379 dated Apr. 2, 2019.
Written Opinion issued in PCT/JP2018/048379 dated Apr. 2, 2019.
International Preliminary Report on Patentability completed by WIPO dated Jun. 30, 2020 in connection with International Patent Application No. PCT/JP2018/048379.

(Continued)

*Primary Examiner* — Geraldina Visconti
(74) *Attorney, Agent, or Firm* — Edwards Neils LLC; Jean C. Edwards, Esq.

(57) ABSTRACT

An object of the present invention is to provide a light-absorbing anisotropic film having an excellent degree of alignment of a dichroic azo coloring agent; an optical laminate including the same; and an image display device using the same. The light-absorbing anisotropic film according to an embodiment of the present invention is a light-absorbing anisotropic film which is formed of a liquid crystal composition containing a dichroic azo coloring agent compound, a liquid crystalline compound, and a compound represented by Formula (1) and has a front transmittance of 60% or less, and in which a content mass ratio of the dichroic azo coloring agent compound to the liquid crystalline compound is 5% to 35% by mass.

(1)

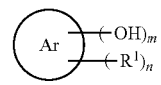

20 Claims, 1 Drawing Sheet

(56) References Cited

FOREIGN PATENT DOCUMENTS

WO 2017/154695 A1 9/2017
WO 2017/154907 A1 9/2017

OTHER PUBLICATIONS

Notice of Reasons for Refusal issued by the Japanese Patent Office dated Mar. 2, 2021, in connection with Japanese Patent Application No. 2019-562490.
Office Action, issued by the State Intellectual Property Office dated Apr. 13, 2022, in connection with Chinese Patent Application No. 201880083664.5.

* cited by examiner

LIGHT-ABSORBING ANISOTROPIC FILM, OPTICAL LAMINATE, AND IMAGE DISPLAY DEVICE

CROSS-REFERENCE TO RELATED APPLICATIONS

This application is a Continuation of PCT International Application No. PCT/JP2018/048379 filed on Dec. 27, 2018, which was published under Article 21(2) in Japanese, and which claims priority under 35 U.S.C. § 119(a) to Japanese Patent Application No. 2017-253980 filed on Dec. 28, 2017 and Japanese Patent Application No. 2018-078719 filed on Apr. 16, 2018. The above applications are hereby expressly incorporated by reference, in their entirety, into the present application.

BACKGROUND OF THE INVENTION

1. Field of the Invention

The present invention relates to a light-absorbing anisotropic film, an optical laminate, and an image display device.

2. Description of the Related Art

In recent years, development of an organic light emitting diode (OLED) has been in process and enhancement of flexibility for each member used has been in progress. Above all, a circularly polarizing plate used for preventing the reflection of external light is required to have a high degree of polarization and flexibility.

In the related art, an iodine polarizer has been used in the circularly polarizing plate, but since the iodine polarizer is produced by dissolving or adsorbing iodine in or onto a high-molecular material such as polyvinyl alcohol to stretch the film at a high ratio in one direction into a shape of a film, sufficient flexibility was not attained.

In this regard, a polarizer in which a dichroic coloring agent is applied onto a substrate such as a transparent film and aligned using an intermolecular interaction or the like has been studied.

For example, JP5923941B proposes a polarizing element which has a high dichroic ratio by compatibilizing a dichroic azo coloring agent in a liquid crystal matrix having high alignment properties.

Moreover, JP5437744B proposes a polarizer which has a high concentration, is a thin film, and a high degree of polarization by using a dichroic azo coloring agent.

SUMMARY OF THE INVENTION

The present inventors have conducted a study on a coating-type polarizer (light-absorbing anisotropic film) using a dichroic azo coloring agent, and as a result, it has been clarified that a degree of alignment is insufficient as compared with a level of an iodine polarizer and there is room for improvement.

Therefore, an object of the present invention is to provide a light-absorbing anisotropic film having an excellent degree of alignment of a dichroic azo coloring agent compound; an optical laminate; and an image display device using the same.

The present inventors have conducted intensive studies to achieve the above object, and as a result, have found that by using a liquid crystal composition obtained by formulating a predetermined compound together with a dichroic azo coloring agent compound and a liquid crystalline compound, a light-absorbing anisotropic film having a high degree of alignment can be formed, thereby completing the present invention.

That is, the present inventors have found that the object can be achieved by the following configuration.

[1] A light-absorbing anisotropic film in which the light-absorbing anisotropic film is formed of a liquid crystal composition containing a dichroic azo coloring agent compound, a liquid crystalline compound, and a compound represented by Formula (1), and has a front transmittance of 60% or less, and a content mass ratio of the dichroic azo coloring agent compound to the liquid crystalline compound is 5% to 35% by mass.

$$Ar \underset{(R^1)_n}{\overset{(OH)_m}{\diagup}} \quad (1)$$

In Formula (1),

Ar represents an aromatic hydrocarbon ring having any one ring structure of a monocyclic structure, a condensed ring structure, or a polycyclic structure.

$R^1$ represents any one group selected from the group consisting of an alkyl group, an alkenyl group, an alkynyl group, an aryl group, a monovalent heterocyclic group, and a silyl group.

m represents an integer of 1 to 3.

n represents an integer of 1 to 6, and in a case where n is an integer of 2 to 6, a plurality of $R^1$'s may be the same as or different from each other and may be bonded to each other to form a ring.

[2] The light-absorbing anisotropic film as described in [1], in which the content mass ratio of the dichroic azo coloring agent compound to the liquid crystalline compound is 5% to 25% by mass.

[3] The light-absorbing anisotropic film as described in [1] or [2], in which the content mass ratio of the dichroic azo coloring agent compound to the liquid crystalline compound is more than 10% by mass and 25% by mass or less.

[4] The light-absorbing anisotropic film as described in any one of [1] to [3], in which a content molar ratio of the compound represented by Formula (1) to the dichroic azo coloring agent compound is 1% to 50% by mole.

[5] The light-absorbing anisotropic film as described in any one of [1] to [4], in which the content molar ratio of the compound represented by Formula (1) to the dichroic azo coloring agent compound is 3.5% to 10% by mole.

[6] The light-absorbing anisotropic film as described in any one of [1] to [5], in which m in Formula (1) is 1.

[7] The light-absorbing anisotropic film as described in any one of [1] to [6], in which the liquid crystal composition contains a dichroic azo coloring agent compound represented by Formula (3).

$$C^1-M^1-Ar^1-N=N-\underset{R^1}{\overset{S}{\diagdown}}\underset{S}{\overset{N}{\diagdown}}-N=N-Ar^2-\underset{E}{\overset{(R^2)_n}{|}}-M^2-C^2 \quad (3)$$

In Formula (3),

C¹ and C² each independently represent a monovalent substituent, provided that at least one of C¹ or C² represents a crosslinkable group, M¹ and M² each independently represent a divalent linking group, provided that the number of atoms in a main chain of at least one of M¹ or M² is 4 or more.

Ar¹ and Ar² each independently represent any one group of a phenylene group which may have a substituent, a naphthylene group which may have a substituent, or a hiphenylene group which may have a substituent.

E represents any one atom of a nitrogen atom, an oxygen atom, or a sulfur atom.

R¹ represents a hydrogen atom or a substituent.

R² represents a hydrogen atom or an alkyl group which may have a substituent.

n represents 0 or 1, provided that in a case where E is a nitrogen atom, n is 1 and in a case where E is an oxygen atom or a sulfur atom, n is 0.

[8] The light-absorbing anisotropic film as described in any one of [1] to [7], in which the liquid crystal composition contains a high-molecular liquid crystalline compound having a repeating unit represented by Formula (6).

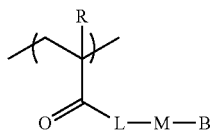

(6)

In Formula (6),

R represents a hydrogen atom or a methyl group.

L represents a single bond or a divalent linking group.

B represents a hydrogen atom, a halogen atom, a cyano group, an alkyl group, an alkoxy group, an amino group, an oxycarbonyl group, an acyloxy group, an acylamino group, an alkoxycarbonylamino group, a sulfonylamino group, a sulfamoyl group, a carbamoyl group, an alkylthio group, a sulfonyl group, a sulfinyl group, a ureido group, or a crosslinkable group.

M represents a mesogenic group represented by Formula (1-1).

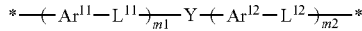

(1-1)

In Formula (1-1), $Ar^{11}$ and $Ar^{12}$ each independently represent a phenylene group or a biphenylene group which may have a substituent.

$L^{11}$ and $L^{12}$ each independently represent a single bond or a divalent linking group including no azo group.

Y represents an imino group, a —OCO—CH=CH— group, or a —CH=CH—CO₂— group.

m1 and m2 each independently represent an integer of 1 to 3.

In a case where m1 is an integer of 2 or 3, a plurality of $Ar^{11}$'s may be the same as or different from each other and a plurality of $L^{11}$'s may be the same as or different from each other.

In a case where m2 is an integer of 2 or 3, a plurality of $Ar^{12}$'s may be the same as or different from each other and a plurality of $L^{12}$'s may be the same as or different from each other.

[9] The light-absorbing anisotropic film as described in any one of [1] to [8], in which the compound represented by Formula (I) is dibutylhydroxytoluene.

[10] An optical laminate comprising: the light-absorbing anisotropic film as described in any one of [1] to [9]; and a photo-alignment layer, in Which the light-absorbing anisotropic film is formed on the photo-alignment layer.

[11] An optical laminate comprising, in the following order: a first oxygen shielding layer; the light-absorbing anisotropic film as described in any one of [1] to [9] or the optical laminate as described in [10]; and a second oxygen shielding layer.

[12] The optical laminate as described in [10] or [11], further comprising a λ/4 plate.

[13] An image display device comprising: the light-absorbing anisotropic film as described in any one of [1] to [9] or the optical laminate as described in any one of [10] to [12]; and an image display element.

According to the present invention, it is possible to provide a light-absorbing anisotropic film having an excellent degree of alignment of a dichroic azo coloring agent; an optical laminate including the same; and an image display device using the same.

DESCRIPTION OF THE PREFERRED EMBODIMENTS

Figure 1A:
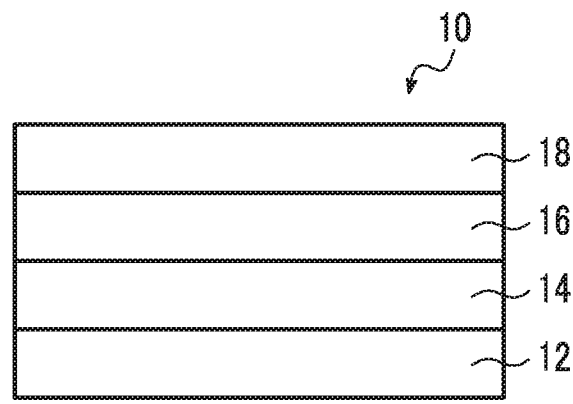
FIG. 1A is a schematic cross-sectional view showing an example of an optical laminate according to an embodiment of the present invention.

Hereinafter, the present invention will be described in detail.

Description of configuration requirements described below may be made based on representative embodiments of the present invention, but the present invention is not limited to such an embodiment.

Furthermore, in the present specification, a numerical range expressed using "to" means a range which includes the preceding and succeeding numerical values of "to" as a lower limit value and an upper limit value, respectively.

In addition, in the present specification, as each component, a substance corresponding to each component may be used alone or in combination of two or more kinds thereof. Here, in a case where two or more kinds of substances are used in combination for each component, a content of the component refers to a total content of the substances used in combination unless otherwise specified.

Moreover, in the present specification, "(meth)acrylate" is a notation representing "acrylate" or "methacrylate", "(meth)acryl" is a notation representing "acryl" or "methacryl", and "(meth)acryloyl" is a notation representing "acryloyl" or "methacryloyl".

In a preferred embodiment, a light-absorbing anisotropic film according to the embodiment of the present invention is used as a polarizer and is combined with a phase difference film (optically anisotropic layer). Accordingly, terms used in the description of the phase difference film will be described.

<Slow Axis>

In the present specification, a "slow axis" means a direction in which a refractive index is maximized in a plane.

Moreover, a slow axis of a phase difference film means a slow axis of the entire phase difference film.

<Re(λ) and Rth(λ)>

In the present specification, Re(λ) and Rth(λ) represent an in-plane retardation and a thickness direction retardation at a wavelength of λ, respectively. Unless otherwise specified, the wavelength of λ is 550 nm.

In the present specification, Re(λ) and Rth(λ) are values measured at the wavelength of λ in AxoScan (manufactured by Axometrics, Inc.).

Specifically, by inputting an average refractive index (nx+ny+nz)/3) and a film thickness (d (μm)) to AxoScan, it is possible to calculate:

Slow Axis Direction (°)

$Re(\lambda)=R0(\lambda)$ $Rth(\lambda)=((nx+ny)/2-nz)\times d.$

In addition, R0(λ) is expressed in a numerical value calculated with AxoScan, but means Re(λ).

<A-Plate and C-Plate>

In the present specification, an A-plate and a C-plate are defined as follows.

The A-plate has two types, that is, a positive A-plate and a negative A-plate, and in a case where a refractive index in a slow axis direction (direction in which a refractive index in a plane is maximized) in a film plane is nx, a refractive index in a direction orthogonal to an in-plane slow axis in a plane is ny, and a refractive index in the thickness direction is nz, the positive A-plate satisfies a relationship of Expression (A1) and the negative A-plate satisfies a relationship of Expression (A2). Moreover, the positive A-plate has Rth of a positive value and the negative A-plate has Rth of a negative value, $nx>ny\approx nz$  Expression (A1)

$ny<nx\approx nz$  Expression (A2)

Furthermore, the above "≈" includes not only a case where both are completely the same as each other but also a case where both are substantially the same as each other. For example, "substantially the same" indicates that a case where (ny−nz)×d (provided that d is a thickness of a film) is −10 to 10 nm and preferably −5 to 5 nm is also included in "ny≈nz", and a case where (nx−nz)×d is −10 to 10 am and preferably −5 to 5 nm is also included in "nx≈nz".

The C-Plate has two types, that is, a positive C-Plate and a negative C-Plate, the positive C-Plate satisfies a relationship of Expression (C1), and the negative C-Plate satisfies a relationship of Expression (C2). Moreover, the positive C-Plate has Rth of a negative value and the negative C-Plate has Rth of a positive value.

$nz>nx\approx ny$  Expression (C1)

$nz<nx\approx ny$  Expression (C2)

Furthermore, the above "≈" includes not only a case where both are completely the same as each other but also a case where both are substantially the same as each other. For example, "substantially the same" indicates that a case where (nx−ny)×d (provided that d is a thickness of a film) is 0 to 10 nm and preferably 0 to 5 nm is also included in "nx≈ny".

<Reverse Wavelength Dispersibility>

In the present specification, reverse wavelength dispersibility refers to a relationship of Re(450)<Re(550)<Re(650).

Specifically, Re(450)/Re(550) is preferably in a range of 0.8 to 0.9, and Re(650)/Re(550) is preferably in a range of 1.03 to 1.25.

Furthermore, regarding the above-described C-plate, the fact that the C-plate has reverse wavelength dispersibility refers to a relationship of Rth(450)<Rth(550)<Rth(650).

[Light-Absorbing Anisotropic Film]

The light-absorbing anisotropic film (layer) according to the embodiment of the present invention is formed of a liquid crystal composition containing a dichroic azo coloring agent compound, a liquid crystalline compound, and a compound (hereinafter, also simply referred to as a "specific compound (1)") represented by Formula (1).

In the present invention, from the viewpoint of improvement in a degree of alignment of the dichroic azo coloring agent compound, a content mass ratio of the dichroic azo coloring agent compound to the liquid crystalline compound is 5% to 35% by mass, preferably 5% to 25% by mass, and more preferably more than 10% by mass and 25% by mass or less.

Furthermore, the light-absorbing anisotropic film according to the embodiment of the present invention is assumed to be a polarizer, and has a front transmittance of 60% or less, preferably 25% to 60%, and more preferably 35% to 55%.

As described above, by forming the light-absorbing anisotropic film according to the embodiment of the present invention using the liquid crystal composition containing the dichroic azo coloring agent compound and liquid crystalline compound and further containing the specific compound (1), the degree of alignment of the dichroic azo coloring agent compound can be improved.

Details of a reason thereof are not yet clear, but the present inventors presume that the reason is as follows.

It is thought that mesogenic moieties of the liquid crystalline compound and the dichroic azo coloring agent compound form a micro-alignment region, which affects the degree of alignment of the dichroic azo coloring agent compound as viewed macroscopically. Moreover, it is estimated that by filling an alignment space of the mesogenic moieties of the liquid crystalline compound and the dichroic azo coloring agent compound or eliminating a distortion, the specific compound (1) supports micro alignment of the mesogenic moieties of the liquid crystalline compound and the dichroic azo coloring agent compound, which affects improvement in the degree of alignment of the dichroic azo coloring agent compound as viewed macroscopically.

[Liquid Crystal Composition]

Hereinafter, respective components contained in the liquid crystal composition used for forming the light-absorbing anisotropic film according to the embodiment of the present invention will be described in detail.

<Specific Compound (1)>

The specific compound (1) contained in the liquid crystal composition is a compound represented by the following Formula (1).

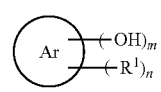

(1)

In Formula (1), Ar represents an aromatic hydrocarbon ring having any one ring structure of a monocyclic structure, a condensed ring structure, or a polycyclic structure.

R[1] represents any one group selected from the group consisting of an alkyl group, an alkenyl group, an alkynyl group, an aryl group, a monovalent heterocyclic group, and a silyl group.

m represents an integer of 1 to 3.

n represents an integer of 1 to 6, and in a case where n is an integer of 2 to 6, a plurality of R[1]'s may be the same as or different from each other and may be bonded to each other to form a ring.

m in Formula (1) represents an integer of 1 to 3 as described above, and is preferably 1.

Specific examples of the monocyclic structure represented by one aspect of Ar in Formula (1) include benzene and toluene.

Moreover, specific examples of the condensed ring structure represented by another aspect include a structure in which 2 or 3 rings are fused, such as naphthalene and anthracene.

Furthermore, specific examples of the polycyclic structure represented by still another aspect include a structure in which 2 or 3 rings are linked, such as biphenyl and terphenyl.

Among these, a monocyclic structure is preferable and a benzene ring is more preferable.

The alkyl group represented by one aspect of R[1] in Formula (1) is preferably an alkyl group having 1 to 15 carbon atoms, more preferably an alkyl group having 1 to 10 carbon atoms, and particularly preferably an alkyl group having 1 to 5 carbon atoms. The alkyl group may be linear, branched, or cyclic, and may further have a substituent. Specific examples of the alkyl group include a methyl group, an ethyl group, an n-propyl group, an isopropyl group, a t-butyl group, an n-octyl group, an eicosyl group, a 2-ethylhexyl group, a cyclohexyl group, a cyclopentyl group, a 4-n-dodecylcyclohexyl group, a bicyclo[1.2.2]heptan-2-yl group, and a bicyclo[2.2.2]octan-3-yl group. Among these, a methyl group, an ethyl group, an n-propyl group, an isopropyl group, and a t-butyl group are preferable.

The alkenyl group represented by one aspect of R[1] in Formula (1) is preferably an alkenyl group having 2 to 15 carbon atoms, more preferably an alkenyl group having 2 to 10 carbon atoms, and particularly preferably an alkenyl group having 2 to 5 carbon atoms. The alkenyl group may be linear, branched, or cyclic, and may further have a substituent. Specific examples of the alkenyl group include a vinyl group, a 1-propenyl group, a 1-butenyl group, a 1-methyl-1-propenyl group, a 1-cyclopentenyl group, and a 1-cyclohexenyl group, and among these, a vinyl group, a 1-propenyl group, and a 1-butenyl group are preferable.

The alkynyl group represented by one aspect of R[1] in Formula (1) is preferably an alkynyl group having 2 to 15 carbon atoms, more preferably an alkynyl group having 2 to 10 carbon atoms, and particularly preferably an alkynyl group having 2 to 5 carbon atoms. The alkynyl group may be linear, branched, or cyclic, and may further have a substituent. Specific examples of the alkynyl group include an ethynyl group, a 1-propynyl group, a 1-butynyl group, and a 1-octynyl group, and among these, an ethynyl group, a 1-propynyl group, and a 1-butynyl group are preferable.

The aryl group represented by one aspect of R[1] in Formula (1) is preferably an aryl group having 6 to 18 carbon atoms, more preferably an aryl group having 6 to 14 carbon atoms, and particularly preferably an aryl group having 6 to 10 carbon atoms. Specific examples of the aryl group include a phenyl group, a naphthyl group, an anthranyl group, and a pyrenyl group, and among these, a phenyl group and a naphthyl group are preferable.

The monovalent heterocyclic group represented by one aspect of R[1] in Formula (1) is preferably a heterocyclic group having 1 to 10 carbon atoms, more preferably a heterocyclic group having 2 to 7 carbon atoms, and particularly preferably 5- or 6-membered heterocyclic group. The heterocyclic group may be a fused ring, and an aromatic ring and a heterocycle may be fused. Specific examples of the heterocyclic group include a 4-pyridyl group, a 2-furyl group, a 2-thienyl group, a 2-pyrimidinyl group, and a 2-benzothiazolyl group, and among these, a 4-pyridyl group and a 2-furyl group are preferable. Moreover, as a heteroatom, a nitrogen atom, a sulfur atom, and an oxygen atom are preferable, and a sulfur atom is more preferable.

The silyl group represented by one aspect of R[1] in Formula (1) is preferably a silyl group having 3 to 15 carbon atoms, more preferably a silyl group having 3 to 10 carbon atoms, and particularly preferably a silyl group having 3 to 6 carbon atoms. Specific examples of the silyl group include a trimethylsilyl group, a 1-butyldimethylsilyl group, and a phenyldimethylsilyl group, and among these, a trimethylsilyl group is preferable.

In a case of a group having a hydrogen atom among the above-described alkyl groups, alkenyl groups, alkynyl groups, aryl groups, heterocyclic groups, and silyl groups, the hydrogen atom may be substituted with the following substituents.

Examples of the substituent include a halogen atom, an alkyl group (including a cycloalkyl group and a bicycloalkyl group), an alkenyl group (including a cycloalkenyl group and a bicycloalkenyl group), an alkynyl group, an aryl group, a heterocyclic group, a hydroxyl group, a nitro group, a carboxyl group, an alkoxy group, an aryloxy group, a silyloxy group, a heterocyclic oxy group, an acyloxy group, a carbamoyloxy group, an alkoxycarbonyloxy group, aryloxycarbonyloxy group, an oxyalkylene group, an amino group (including an anilino group), an acylamino group, an aminocarbonylamino group, an alkoxycarbonylamino group, an aryloxycarbonylamino group, a sulfamoylamino group, an alkyl and aryl sulfonylamino group, a mercapto group, an alkylthio group, an arylthio group, a heterocyclic thio group, a sulfamoyl group, a sulfo group, an alkyl and aryl sulfinyl group, an alkyl and aryl sulfonyl group, an acyl group, an aryloxycarbonyl group, an alkoxycarbonyl group, a carbamoyl group, an aryl and heterocyclic azo group, an imido group, a phosphino group, a phosphinyl group, a phosphinyloxy group, a phosphinylamino group, and a silyl group. Two or more substituents may be contained, or the substituent may consist of one or more kinds thereof.

R[1] in Formula (1) is preferably the alkyl group among the above-described alkyl group, alkenyl group, alkynyl group, aryl group, monovalent heterocyclic group, and silyl group.

n in Formula (1) represents an integer of 1 to 6 as described above, and is preferably 2 to 4 and more preferably 3.

Specific examples of the specific compound (1) include the following compounds. Among these, dibutylhydroxytoluene is preferred.

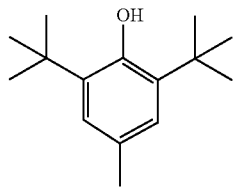

-continued

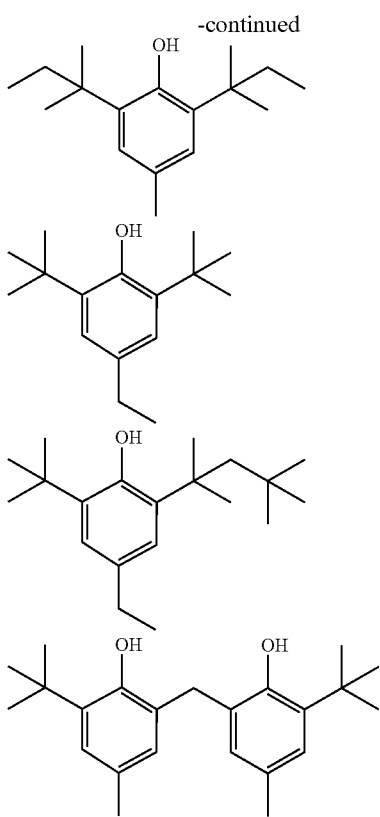

A content of the specific compound (1) is preferably 1% to 500% by mole, more preferably 1% to 50% by mole, still more preferably 2% to 50% by mole, and particularly preferably 3.5% to 10% by mole, in terms of a molar ratio with respect to the dichroic azo coloring agent compound.

<Dichroic Azo Coloring Agent Compound>

The dichroic azo coloring agent compound contained in the liquid crystal composition is not particularly limited, a dichroic azo coloring agent known in the related art can be used, and one kind of dichroic azo coloring agent compound may be contained alone or two or more kinds thereof may be contained.

In the present invention, the dichroic coloring agent compound means a coloring agent having different absorbances depending on a direction.

The dichroic coloring agent compound may or may not exhibit liquid crystallinity.

In a case where the dichroic coloring agent compound exhibits the liquid crystallinity; the liquid crystallinity may exhibit any one of nematicity or smecticity. A temperature range showing the liquid crystal phase is preferably room temperature (about 20° C. to 24° C.) to 300° C., and from the viewpoint of handleability and manufacturing suitability, is more preferably 50° C. to 200° C.

In the present invention, from the viewpoint that a color of the light-absorbing anisotropic film is close to black, for example, at least one kind of coloring agent compound (first dichroic coloring agent) having a maximum absorption wavelength in a wavelength range of 370 to 550 nm and at least one kind of coloring agent compound (second dichroic coloring agent) having a maximum absorption wavelength in a wavelength range of 500 to 700 nm are preferably used in combination.

In the present invention, for a reason that pressing resistance is further improved, it is preferable that the dichroic azo coloring agent compound has a crosslinkable group.

Specific examples of the crosslinkable group include a (meth)acryloyl group, an epoxy group, an oxetanyl group, and a styryl group, and among these, a (meth)acryloyl group is preferable.

In the present invention, from the viewpoint that balance between the degree of alignment of the light-absorbing anisotropic film and uniformity is improved, a content of the dichroic azo coloring agent compound contained in the liquid crystal composition is preferably 5% to 25% by mass, more preferably 5% to 20% by mass, and still more preferably 10% to 15% by mass, in terms of a solid content proportion.

The dichroic azo coloring agent compound is preferably a dichroic coloring agent compound (hereinafter, also simply referred to as a "specific dichroic coloring agent compound") represented by Formula (2).

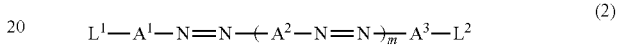

Here, in Formula (2), $A^1$, $A^2$, and $A^3$ each independently represent a divalent aromatic group which may have a substituent.

In Formula (2), $L^1$ and $L^2$ each independently represent a substituent,

In Formula (2), m represents an integer of 1 to 4, and in a case where m is an integer of 2 to 4, a plurality of $A^2$'s may be the same as or different from each other. Moreover, m is preferably 1 or 2.

In Formula (2), the "divalent aromatic groups which may have a substituent" represented by $A^1$, $A^2$, and $A^3$ will be described.

Examples of the substituent include the substituent group G described in paragraphs [0237] to [0240] of JP2011-237513A, and among these, suitable examples thereof include a halogen atom, an alkyl group, an alkoxy group, an alkoxycarbonyl group (for example, methoxycarbonyl and ethoxycarbonyl), and an aryloxycarbonyl group (for example, phenoxycarbonyl, 4-methylphenoxycarbonyl, and 4-methoxyphenylcarbonyl), more suitable examples thereof include an alkyl group, and still more suitable examples thereof include an alkyl group having 1 to 5 carbon atoms.

On the other hand, examples of the divalent aromatic group include a divalent aromatic hydrocarbon group and a divalent aromatic heterocyclic group.

Examples of the divalent aromatic hydrocarbon group include an arylene group having 6 to 12 carbon atoms, and specific examples thereof include a phenylene group, a cumenylene group, a mesitylene group, a tolylene group, and a xylylene group. Among these, a phenylene group is preferable.

Furthermore, as the divalent aromatic heterocyclic group, a group derived from a monocyclic or bicyclic heterocycle is preferable. Examples of an atom constituting the aromatic heterocyclic group, other than carbon, include a nitrogen atom, a sulfur atom, and an oxygen atom. In a case where the aromatic heterocyclic group has a plurality of atoms constituting a ring other than carbon, these atoms may be the same as or different from each other. Specific examples of the aromatic heterocyclic group include a pyridylene group (pyridine-diyl group), a quinolylene group (quinoline-diyl group), an isoquinolylene group (isoquinoline-diyl group), a benzothiadizole-diyl group, a phthalimido-diyl group, and a thienothiazole-diyl group (hereinafter, simply referred to as a "thienothiazole group").

Among the divalent aromatic groups, a divalent aromatic hydrocarbon group is preferable.

Here, it is also preferable that any one of $A^1$, $A^2$, or $A^3$ is a divalent thienothiazole group which may have a substituent. Moreover, specific examples of the substituent of the divalent thienothiazole group are the same as those of the substituent in the "divalent aromatic group which may have a substituent" described above, and preferred aspects thereof are also the same.

Furthermore, it is more preferable that among $A^1$, $A^2$, and $A^3$, $A^2$ is a divalent thienothiazole group. In this case, $A^1$ and $A^2$ each represent a divalent aromatic group which may have a substituent.

In a case where $A^2$ is a divalent thienothiazole group, it is preferable that at least one of $A^1$ or $A^2$ is a divalent aromatic hydrocarbon group which may have a substituent, and more preferable that both $A^1$ and $A^2$ are divalent aromatic hydrocarbon groups which may have a substituent.

In Formula (2), the "substituents" represented by $L^1$ and $L^2$ will be described.

As the substituent, a group introduced to enhance a solubility or nematic liquid crystallinity, a group having electron donating properties or electron withdrawing properties and introduced to adjust a tone as a coloring agent, or a group having a crosslinkable group (polymerizable group) and introduced to fix alignment is preferable.

Examples of the substituent include an alkyl group (preferably an alkyl group having 1 to 20 carbon atoms, more preferably an alkyl group having 1 to 12 carbon atoms, and particularly preferably an alkyl group having 1 to 8 carbon atoms; and examples of the alkyl group include a methyl group, an ethyl group, an isopropyl group, a tert-butyl group, an n-octyl group, an n-decyl group, an n-hexadecyl group, a cyclopropyl group, a cyclopentyl group, and a cyclohexyl group), an alkenyl group (preferably an alkenyl group having 2 to 20 carbon atoms, more preferably an alkenyl group having 2 to 12 carbon atoms, and particularly preferably an alkenyl group having 2 to 8 carbon atoms; and examples of the alkenyl group include a vinyl group, an allyl group, a 2-butenyl group, and a 3-pentenyl group), an alkynyl group (preferably an alkynyl group having 2 to 20 carbon atoms, more preferably an alkynyl group having 2 to 12 carbon atoms, and particularly preferably an alkynyl group having 2 to 8 carbon atoms; and examples of the alkynyl group include a propargyl group and a 3-pentynyl group), an aryl group (preferably an aryl group having 6 to 30 carbon atoms, more preferably an aryl group having 6 to 20 carbon atoms, and particularly preferably an aryl group having 6 to 12 carbon atoms; and examples of the aryl group include a phenyl group, a 2,6-diethylphenyl group, a 3,5-ditrifluoromethylphenyl group, a styryl group, a naphthyl group, and a biphenyl group), a substituted or unsubstituted amino group (preferably an amino group having 0 to 20 carbon atoms, more preferably an amino group having 0 to 10 carbon atoms, and particularly preferably an amino group having 0 to 6 carbon atoms; and examples of the amino group include an unsubstituted amino group, a methylamino group, a dimethylamino group, a diethylatnino group, and an anilino group), an alkoxy group (preferably an alkoxy group having 1 to 20 carbon atoms and more preferably an alkoxy group having 1 to 15 carbon atoms; and examples of the alkoxy group include a methoxy group, an ethoxy group, and a butoxy group), an oxycarbonyl group (preferably an oxycarbonyl group having 2 to 20 carbon atoms, more preferably an oxycarbonyl group having 2 to 15 carbon atoms, and particularly preferably an oxycarbonyl group having 2 to 10 carbon atoms; and examples of the oxycarbonyl group include a methoxycarbonyl group, an ethoxycarbonyl group, and a phenoxycarbonyl group), an acyloxy group (preferably an acyloxy group having 2 to 20 carbon atoms, more preferably an acyloxy group having 2 to 10 carbon atoms, and particularly preferably an acyloxy group having 2 to 6 carbon atoms; and examples of the acyloxy group include an acetoxy group, a benzoyloxy group, an acryloyl group, and a methactyloyl group), an acylamino group (preferably an acylamino group having 2 to 20 carbon atoms, more preferably an acylamino group having 2 to 10 carbon atoms, and particularly preferably an acylamino group having 2 to 6 carbon atoms; and examples of the acylamino group include an acetylamino group and a henzoylamino group), an alkoxycarbonylamino group (preferably an alkoxycarbonylamino group having 2 to 20 carbon atoms, more preferably an alkoxycarbonylamino group having 2 to 10 carbon atoms, and particularly preferably an alkoxycarbonylamino group having 2 to 6 carbon atoms; and examples of the alkoxycarbonylamino group include a methoxycarbonylamino group), an aryloxycarbonylamino group (preferably an aryloxycarbonylamino group having 7 to 20 carbon atoms, more preferably an aryloxycarbonylamino group having 7 to 16 carbon atoms, and particularly preferably an aryloxycarbonylamino group having 7 to 12 carbon atoms; and examples of the aryloxycarbonylamino group include a phenyloxycarbonylamino group), a sulfonylamino group (preferably a sulfonylamino group having 1 to 20 carbon atoms, more preferably a sulfonylamino group having 1 to 10 carbon atoms, and particularly preferably a sulfonylamino group having 1 to 6 carbon atoms; and examples of the sulfonylamino group include a methanesulfonylamino group and a benzenesulfonylamino group), a sulfamoyl group (preferably a sulfamoyl group having 0 to 20 carbon atoms, more preferably a sulfamoyl group having 0 to 10 carbon atoms, and particularly preferably a sulfamoyl group having 0 to 6 carbon atoms; and examples of the sulfamoyl group include a sulfamoyl group, a methylsulfamoyl group, a dimethylsulfamoyl group, and a phenylsulfamoyl group), a carbamoyl group (preferably a carbamoyl group having 1 to 20 carbon atoms, more preferably a carbamoyl group having 1 to 10 carbon atoms, and particularly preferably a carbamoyl group having 1 to 6 carbon atoms; and examples of the carbamoyl group include an unsubstituted carbamoyl group, a methylcarbamoyl group, a diethylcarbamoyl group, and a phenylcarbamoyl group), an alkylthio group (preferably an alkylthio group having 1 to 20 carbon atoms, more preferably an alkylthio group having 1 to 10 carbon atoms, and particularly preferably an alkylthio group having 1 to 6 carbon atoms; and examples of the alkylthio group include a methylthio group and an ethylthio group), an arylthio group (preferably an arylthio group having 6 to 20 carbon atoms, more preferably an arylthio group having 6 to 16 carbon atoms, and particularly preferably an arylthio group having 6 to 12 carbon atoms; and examples of the arylthio group include a phenylthio group), a sulfonyl group (preferably a sulfonyl group having 1 to 20 carbon atoms, more preferably a sulfonyl group having 1 to 10 carbon atoms, and particularly preferably a sulfonyl group having 1 to 6 carbon atoms; and examples of the sulfonyl group include a mesyl group and a tosyl group), a sulfinyl group (preferably a sulfinyl group having 1 to 20 carbon atoms, more preferably a sulfinyl group having 1 to 10 carbon atoms, and particularly preferably a sulfinyl group having 1 to 6 carbon atoms; and examples of the sulfinyl group include a methanesulfinyl group and a benzenesulfinyl group), a ureido group (preferably a ureido group having 1 to 20 carbon atoms, more preferably a ureido group having 1 to 10 carbon atoms, and particularly preferably a ureido group having 1 to 6 carbon atoms; and examples of the ureido group include an unsubstituted ureido group, a methylureido group, and a phenylureido group), a phosphoric acid amido group (preferably a phosphoric acid amido group having 1 to 20 carbon atoms, more preferably a phosphoric acid amido group having 1 to 10 carbon atoms, and particularly preferably a phosphoric acid amido group having 1 to 6 carbon atoms; and examples of the phosphoric acid amido group include a diethyl phosphoric acid amido group and a phenyl phosphoric acid amido group), a hydroxy group, a mercapto group, a halogen atom (for example, a fluorine atom, a chlorine atom, a bromine atom, and an iodine atom), a cyano group, a nitro group, a hydroxamic acid group, a sulfino group, a hydrazino group, an imino group, an azo group, a heterocyclic group (preferably a heterocyclic group having 1 to 30 carbon atoms and more preferably a heterocyclic group having 1 to 12 carbon atoms, for example, a heterocyclic group having a heteroatom such as a nitrogen atom, an oxygen atom, and a sulfur atom; and examples of the heterocyclic group include an epoxy group, an oxetanyl group, an imidazolyl group, a pyridyl group, a quinolyl group, a furyl group, a piperidyl group, a morpholino group, a benzoxazolyl group, a benzimidazolyl group, and a benzothiazolyl group), and a silyl group (preferably a silyl group having 3 to 40 carbon atoms, more preferably a silyl group having 3 to 30 carbon atoms, and particularly preferably a silyl group having 3 to 24 carbon atoms; and examples of the silyl group include a trimethylsilyl group and a triphenylsilyl group).

These substituents may be further substituted with these substituents. Moreover, in a case where two or more of the substituents are contained, the substituents may be the same as or different from each other. Furthermore, if possible, the substituents may be bonded to each other to form a ring.

The substituent represented by $L^1$ or $L^2$ is preferably an alkyl group which have a substituent, an alkenyl group which may have a substituent, an alkynyl group which may have a substituent, an aryl group which may have a substituent, an alkoxy group which may have a substituent, an oxycarbonyl group which may have a substituent, an acyloxy group which may have a substituent, an acylamino group which may have a substituent, an amino group which may have a substituent, an alkoxycarbonylamino group which may have a substituent, a sulfonylamino group which may have a substituent, a sulfamoyl group which may have a substituent, a carbamoyl group which may have a substituent, an alkylthio group which may have a substituent, a sulfonyl group which may have a substituent, a ureido group which may have a substituent, a nitro group, a hydroxy group, a cyano group, an imino group, an azo group, a halogen atom, and a heterocyclic group, and more preferably an alkyl group which may have a substituent, an alkenyl group which may have a substituent, an aryl group which may have a substituent, an alkoxy group which may have a substituent, an oxycarbonyl group which may have a substituent, an acyloxy group which may have a substituent, an amino group which may have a substituent, a nitro group, an imino group, and an azo group.

It is preferable that at least one of $L^1$ or $L^2$ contains a crosslinkable group (polymerizable group), and more preferable that both $L^1$ and $L^2$ contain a crosslinkable group.

Specific examples of the crosslinkable group include the polymerizable groups described in paragraphs [0040] to [0050] of JP2010-244038A, and from the viewpoint of reactivity and synthesis suitability, an acryloyl group, a methacryloyl group, an epoxy group, an oxetanyl group, and a styryl group are preferable and an acryloyl group and a methacryloyl group are more preferable.

Examples of suitable aspects of $L^1$ and $L^2$ include an alkyl group substituted with the crosslinkable group, a dialkylamino group substituted with the crosslinkable group, and an alkoxy group substituted with the crosslinkable group.

(Second Dichroic Azo Coloring Agent)

In the present invention, for a reason that a high degree of alignment can be achieved on a long wavelength side, the liquid crystal composition preferably contains a dichroic azo coloring agent compound represented by Formula (3) as the above-described second dichroic coloring agent.

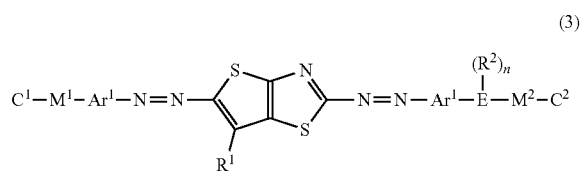

(3)

In Formula (3), $C^1$ and $C^2$ each independently represent a monovalent substituent, provided that at least one of $C^1$ or $C^2$ represents a crosslinkable group.

In Formula (3), $M^1$ and $M^2$ each independently represent a divalent linking group, provided that the number of atoms in a main chain of at least one of $M^1$ or $M^2$ is 4 or more.

In Formula (3), $Ar^1$ and $Ar^2$ each independently represent any one group of a phenylene group which may have a substituent, a naphthylene group which may have a substituent, or a biphenylene group which may have a substituent.

In Formula (3), E represents any one atom of a nitrogen atom, an oxygen atom, or a sulfur atom.

In Formula (3), $R^1$ represents a hydrogen atom or a substituent.

In Formula (3), $R^2$ represents a hydrogen atom or an alkyl group which may have a substituent.

In Formula (3), n represents 0 or 1, provided that in a case where E is a nitrogen atom, n is 1 and in a case where E is an oxygen atom or a sulfur atom, n is 0.

In Formula (3), the monovalent substituents represented by $C^1$ and $C^2$ will be described.

As the monovalent substituent represented by $C^1$ or $C^2$, a group introduced to enhance a solubility of an azo compound or nematic liquid crystallinity, a group having electron donating properties or electron withdrawing properties and introduced to adjust a tone as a coloring agent, or a crosslinkable group (polymerizable group) introduced to fix alignment is preferable.

Examples of the substituent include an alkyl group (preferably an alkyl group having 1 to 20 carbon atoms, more preferably an alkyl group having 1 to 12 carbon atoms, and particularly preferably an alkyl group having 1 to 8 carbon atoms; and examples of the alkyl group include a methyl group, an ethyl group, an isopropyl group, a tert-butyl group, an n-octyl group, an n-decyl group, an n-hexadecyl group, a cyclopropyl group, a cyclopentyl group, and a cyclohexyl group), an alkenyl group (preferably an alkenyl group having 2 to 20 carbon atoms, more preferably an alkenyl group having 2 to 12 carbon atoms, and particularly preferably an alkenyl group having 2 to 8 carbon atoms; and examples of the alkenyl group include a vinyl group, an allyl group, a 2-butenyl group, and a 3-pentenyl group), an alkynyl group (preferably an alkynyl group having 2 to 20 carbon atoms, more preferably an alkynyl group having 2 to 12 carbon atoms, and particularly preferably an alkynyl group having 2 to 8 carbon atoms; and examples of the alkynyl group include a propargyl group and a 3-pentynyl group), an aryl group (preferably an aryl group having 6 to 30 carbon atoms, more preferably an aryl group having 6 to 20 carbon atoms, and particularly preferably an aryl group having 6 to 12 carbon atoms; and examples of the aryl group include a phenyl group, a 2,6-diethylphenyl group, a 3,5-ditrifluoromethylphenyl group, a styryl group, a naphthyl group, and a biphenyl group), a substituted or unsubstituted amino group (preferably an amino group having 0 to 20 carbon atoms, more preferably an amino group having 0 to 10 carbon atoms, and particularly preferably an amino group having 0 to 6 carbon atoms; and examples of the amino group include an unsubstituted amino group, a methylamino group, a dimethylamino group, a diethylamino group, and an anilino group), an alkoxy group (preferably an alkoxy group having 1 to 20 carbon atoms and more preferably an alkoxy group having 1 to 15 carbon atoms; and examples of the alkoxy group include a methoxy group, an ethoxy group, and a butoxy group), an oxycarbonyl group (preferably an oxycarbonyl group having 2 to 20 carbon atoms, more preferably an oxycarbonyl group having 2 to 15 carbon atoms, and particularly preferably an oxycarbonyl group having 2 to 10 carbon atoms; and examples of the oxycarbonyl group include a methoxycarbonyl group, an ethoxycarbonyl group, and a phenoxycarbonyl group), an acyloxy group (preferably an acyloxy group having 2 to 20 carbon atoms, more preferably an acyloxy group having 2 to 10 carbon atoms, and particularly preferably an acyloxy group having 2 to 6 carbon atoms; and examples of the acyloxy group include an acetoxy group, a benzoyloxy group, an acryloyl group, and a methacryloyl group), an acylamino group (preferably an acylamino group having 2 to 20 carbon atoms, more preferably an acylamino group having 2 to 10 carbon atoms, and particularly preferably an acylamino group having 2 to 6 carbon atoms; and examples of the acylamino group include an acetylamino group and a benzoylamino group), an alkoxycarbonylamino group (preferably an alkoxycarbonylamino group having 2 to 20 carbon atoms, more preferably an alkoxycarbonylamino group having 2 to 10 carbon atoms, and particularly preferably an alkoxycarbonylamino group having 2 to 6 carbon atoms; and examples of the alkoxycarbonylamino group include a methoxycarbonylamino group), an aryloxycarbonylamino group (preferably an aryloxycarbonylamino group having 7 to 20 carbon atoms, more preferably an aryloxycarbonylamino group having 7 to 16 carbon atoms, and particularly preferably an aryloxycarbonylamino group having 7 to 12 carbon atoms; and examples of the aryloxycarbonylamino group include a phenyloxycarbonylamino group), a sulfonylamino group (preferably a sulfonylamino group having 1 to 20 carbon atoms, more preferably a sulfonylamino group having 1 to 10 carbon atoms, and particularly preferably a sulfonylamino group having 1 to 6 carbon atoms; and examples of the sulfonylamino group include a methanesulfonylamino group and a benzenesulfonylamino group), a sulfamoyl group (preferably a sulfamoyl group having 0 to 20 carbon atoms, more preferably a sulfamoyl group having 0 to 10 carbon atoms, and particularly preferably a sulfamoyl group having 0 to 6 carbon atoms; and examples of the sulfamoyl group include a sulfamoyl group, a methylsulfamoyl group, a dimethylsulfamoyl group, and a phenylsulfamoyl group), a carbamoyl group (preferably a carbamoyl group having 1 to 20 carbon atoms, more preferably a carbamoyl group having 1 to 10 carbon atoms, and particularly preferably a carbamoyl group having 1 to 6 carbon atoms; and examples of the carbamoyl group include an unsubstituted carbamoyl group, a methylcarbamoyl group, a diethylcarbamoyl group, and a phenylcarbamoyl group), an alkylthio group (preferably an alkylthio group having 1 to 20 carbon atoms, more preferably an alkylthio group having 1 to 10 carbon atoms, and particularly preferably an alkylthio group having 1 to 6 carbon atoms; and examples of the alkylthio group include a methylthio group and an ethylthio group), an arylthio group (preferably an arylthio group having 6 to 20 carbon atoms, more preferably an arylthio group having 6 to 16 carbon atoms, and particularly preferably an arylthio group having 6 to 12 carbon atoms; and examples of the arylthio group include a phenylthio group), a sulfonyl group (preferably a sulfonyl group having 1 to 20 carbon atoms, more preferably a sulfonyl group having 1 to 10 carbon atoms, and particularly preferably a sulfonyl group having 1 to 6 carbon atoms; and examples of the sulfonyl group include a mesyl group and a tosyl group), a sulfinyl group (preferably a sulfinyl group having 1 to 20 carbon atoms, more preferably a sulfinyl group having 1 to 10 carbon atoms, and particularly preferably a sulfinyl group having 1 to 6 carbon atoms; and examples of the sulfinyl group include a methanesulfinyl group and a benzenesulfinyl group), a ureido group (preferably a ureido group having 1 to 20 carbon atoms, more preferably a ureido group having 1 to 10 carbon atoms, and particularly preferably a ureido group having 1 to 6 carbon atoms; and examples of the ureido group include an unsubstituted ureido group, a methylureido group, and a phenylureido group), a phosphoric acid amido group (preferably a phosphoric acid amido group having 1 to 20 carbon atoms, more preferably a phosphoric acid amido group having 1 to 10 carbon atoms, and particularly preferably a phosphoric acid amido group having 1 to 6 carbon atoms; and examples of the phosphoric acid amido group include a diethyl phosphoric acid amido group and a phenyl phosphoric acid amido group), a hydroxy group, a mercapto group, a halogen atom (for example, a fluorine atom, a chlorine atom, a bromine atom, and an iodine atom), a cyano group, a nitro group, a hydroxamic acid group, a sulfino group, a hydrazino group, an imino group, an azo group, a heterocyclic group (preferably a heterocyclic group having 1 to 30 carbon atoms and more preferably a heterocyclic group having 1 to 12 carbon atoms, for example, a heterocyclic group having a heteroatom such as a nitrogen atom, an oxygen atom, and a sulfur atom; and examples of the heterocyclic group include an epoxy group, an oxetanyl group, an imidazolyl group, a pyridyl group, a quinolyl group, a furyl group, a piperidyl group, a morpholino group, a benzoxazolyl group, a benzimidazolyl group, and a benzothiazolyl group), and a silyl group (preferably a silyl group having 3 to 40 carbon atoms, more preferably a silyl group having 3 to 30 carbon atoms, and particularly preferably a silyl group having 3 to 24 carbon atoms; and examples of the silyl group include a trimethylsilyl group and a triphenylsilyl group).

These substituents may be further substituted with these substituents. Moreover, in a case where two or more of the substituents are contained, the substituents may be the same as or different from each other. Furthermore, if possible, the substituents may be bonded to each other to form a ring.

In Formula (3), at least one of $C^1$ or $C^2$ represents a crosslinkable group, and from the viewpoint that durability of the light-absorbing anisotropic film is superior, it is preferable that both $C^1$ and $C^2$ are crosslinkable groups.

Specific examples of the crosslinkable group include the polymerizable groups described in paragraphs [0040] to [0050] of JP2010-244038A, and from the viewpoint of reactivity and synthesis suitability, an acryloyl group, a methacryloyl group, an epoxy group, an oxetanyl group, or a styryl group is preferable and an acryloyl group or a methacryloyl group is more preferable.

In Formula (3), the divalent linking groups represented by $M^1$ and $M^2$ will be described.

Examples of the divalent linking group include —O—, —S—, —CO—, —COO—, —OCO—, —O—CO—O—, —CO—$NR^N$—, —O—CO—$NR^N$—, —$SO_2$—, —SO—, an alkylene group, a cycloalkylene group, an alkenylene group, and a group obtained by combining two or more of these groups.

Among these, a group obtained by combining an alkylene group with one or more kinds of groups selected from the group consisting of —O—, —S—, —CO—, —COO—, —OCO—, —O—CO—O—, —CO—$NR^N$—, —O—CO—$NR^N$—, —$SO_2$—, and —SO— is preferable. Moreover, $R^N$ represents a hydrogen atom or an alkyl group.

In addition, the number of atoms in the main chain of at least one of $M^1$ or $M^2$ is 4 or more, preferably 7 or more, and more preferably 10 or more. Moreover, an upper limit value of the number of atoms in the main chain is preferably 20 or less and more preferably 15 or less.

Here, the "main chain" in $M^1$ refers to a portion necessary for directly linking "$C^1$" to "$Ar^1$" in Formula (3), and "the number of atoms in the main chain" refers to the number of atoms constituting the portion. Similarly, the "main chain" in $M^2$ refers to a portion necessary for directly linking "$C^2$" to "E" in Formula (3), and "the number of atoms in the main chain" refers to the number of atoms constituting the portion. Furthermore, "the number of atoms in the main chain" does not include the number of atoms in a branched chain described later.

Specifically, in Formula (D7), the number of atoms in the main chain of $M^1$ is 6 (the number of atoms in a frame shown by a dotted line on a left side of Formula (D7)), and the number of atoms in the main chain of $M^2$ is 7 (the number of atoms in a frame shown by a dotted line on a right side of Formula (D7)).

Formula (3). Similarly, the "branched chain" in $M^2$ refers to a portion other than the portion necessary for directly linking "$C^2$" to "E" in Formula (3).

The number of atoms in the branched chain is preferably 3 or less. In a case where the number of atoms in the branched chain is 3 or less, there is an advantage that the degree of alignment of the light-absorbing anisotropic film is further improved. Moreover, the number of atoms in the branched chain does not include the number of hydrogen atoms.

Examples of preferred structures of $M^1$ and $M^2$ are shown below, but the present invention is not limited to these examples. Moreover, "*" in the following structures represents a linking portion between $C^1$ and $Ar^1$ or a linking portion between $C^2$ and E.

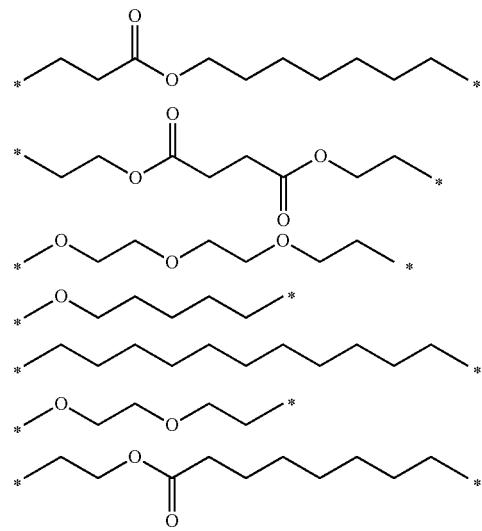

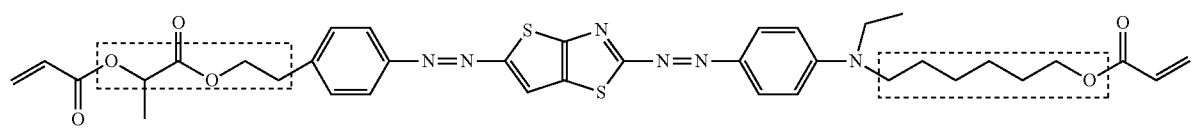

D7

In the present invention, at least one of $M^1$ or $M^2$ may be a group having 4 or more atoms in the main chain, and in a case where the number of atoms in the main chain of one of $M^1$ and $M^2$ is 4 or more, the number of atoms in the main chain of the other of $M^1$ and $M^2$ may be 3 or less.

The total number of atoms in the main chains of $M^1$ and $M^2$ is preferably 5 to 30 and more preferably 7 to 27. In a case where the total number of atoms in the main chains is 5 or more, the dichroic coloring agent compound is more easily polymerized, and in a case where the total number of atoms in the main chains is 30 or less, a light-absorbing anisotropic film having an excellent degree of alignment is obtained, or a light-absorbing anisotropic filch having excellent heat resistance is obtained due to an increase in a melting point of the dichroic azo coloring agent compound.

$M^1$ and $M^2$ may have a branched chain. Here, the "branched chain" in $M^1$ refers to a portion other than the portion necessary for directly linking "$C^1$" to "$Ar^1$" in -continued

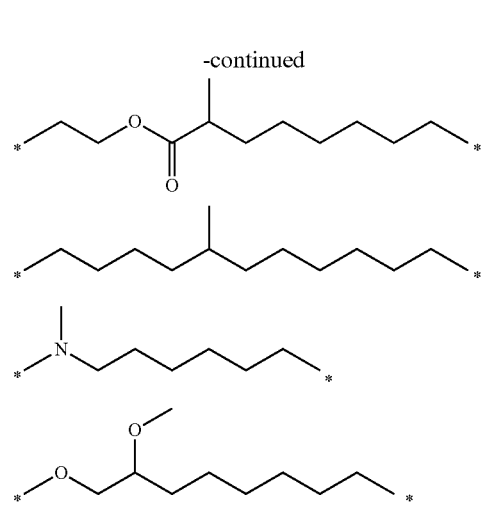

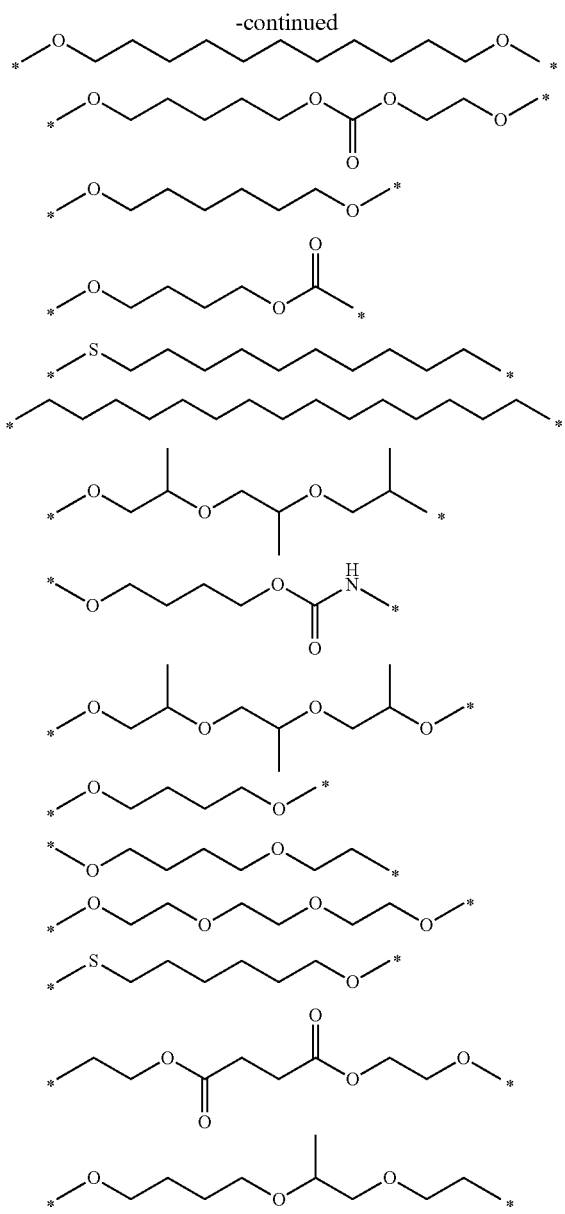

In the present invention, $M^1$ in Formula (3) preferably has an oxygen atom from the viewpoint of improvement in the degree of alignment.

The "phenylene group which may have a substituent", the "naphthylene group which may have a substituent", and the "biphenylene group which may have a substituent" represented by $Ar^1$ or $Ar^2$ in Formula (3) will be described.

The substituent is not particularly limited, and examples thereof include a halogen atom, an alkyl group, an alkyloxy group, an alkylthio group, an oxycarbonyl group, a thioalkyl group, an acyloxy group, an acylamino group, an alkoxycarbonylamino group, a sulfonylamino group, a sulfamoyl group, a carbamoyl group, a sulfinyl group, and a ureido group. These substituents may be further substituted with these substituents. Among these, an alkyl group is preferable, an alkyl group having 1 to 5 carbon atoms is more preferable, and from the viewpoint of easy availability of raw materials and the degree of alignment, a methyl group and an ethyl group are preferable.

$Ar^1$ and $Ar^2$ are each a phenylene group which may have a substituent, a naphthylene group which may have a substituent, or a biphenylene group which may have a substituent, but from the viewpoint of easy availability of raw materials and the degree of alignment, a phenylene group which may have a substituent is preferable.

In Formula (3), "$M^1$" and "N" linked to $Ar^1$ are preferably located at a para position in $Ar^1$. Moreover, "E" and "N" linked to $Ar^2$ are preferably located at a para position in $Ar^2$.

In Formula (3), E represents any one atom of a nitrogen atom, an oxygen atom, or a sulfur atom, and from the viewpoint of synthesis suitability, a nitrogen atom is preferable.

In addition, from the viewpoint that a dichroic coloring agent compound having absorption on a short wavelength side (for example, a compound having a maximum absorption wavelength around 500 to 530 nm) is easily obtained, E in Formula (3) is preferably an oxygen atom.

On the other hand, from the viewpoint that a dichroic coloring agent compound having absorption on a long wavelength side (for example, a compound having a maximum absorption wavelength around 600 nm) is easily obtained, E in Formula (3) is preferably a nitrogen atom.

In Formula (3), $R^1$ represents a hydrogen atom or a substituent.

Specific examples and suitable aspects of the "substituent" represented by $R^1$ are the same as those of the substituents in $Ar^1$ and $Ar^2$ described above, preferred aspects thereof are also the same, and thus descriptions thereof will be omitted.

In Formula (3), $R^2$ represents a hydrogen atom or an alkyl group which may have a substituent, and is preferably an alkyl group which may have a substituent.

Examples of the substituent include a halogen atom, a hydroxyl group, an ester group, an ether group, and a thioether group.

Examples of the alkyl group include a linear, branched, or cyclic alkyl group having 1 to 8 carbon atoms. Among these, a linear alkyl group having 1 to 6 carbon atoms is preferable, a linear alkyl group having 1 to 3 carbon atoms is more preferable, and a methyl group or an ethyl group is still more preferable.

Furthermore, in a case where E is a nitrogen atom, $R^2$ is a group existing in Formula (3) (that is, this means a case where n is 1). On the other hand, in a case where E is an oxygen atom or a sulfur atom, $R^2$ is a group which does not exist in Formula (3) (that is, this means a case where n is 0).

In Formula (3), n represents 0 or 1, provided that in a case where E is a nitrogen atom, n is 1 and in a case where E is an oxygen atom or a sulfur atom, n is 0.

Specific examples of the dichroic azo coloring agent compound represented by Formula (3) are shown below, but the present invention is not limited to these examples.

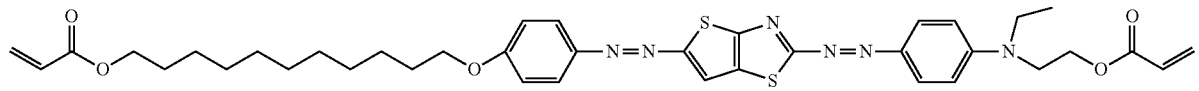

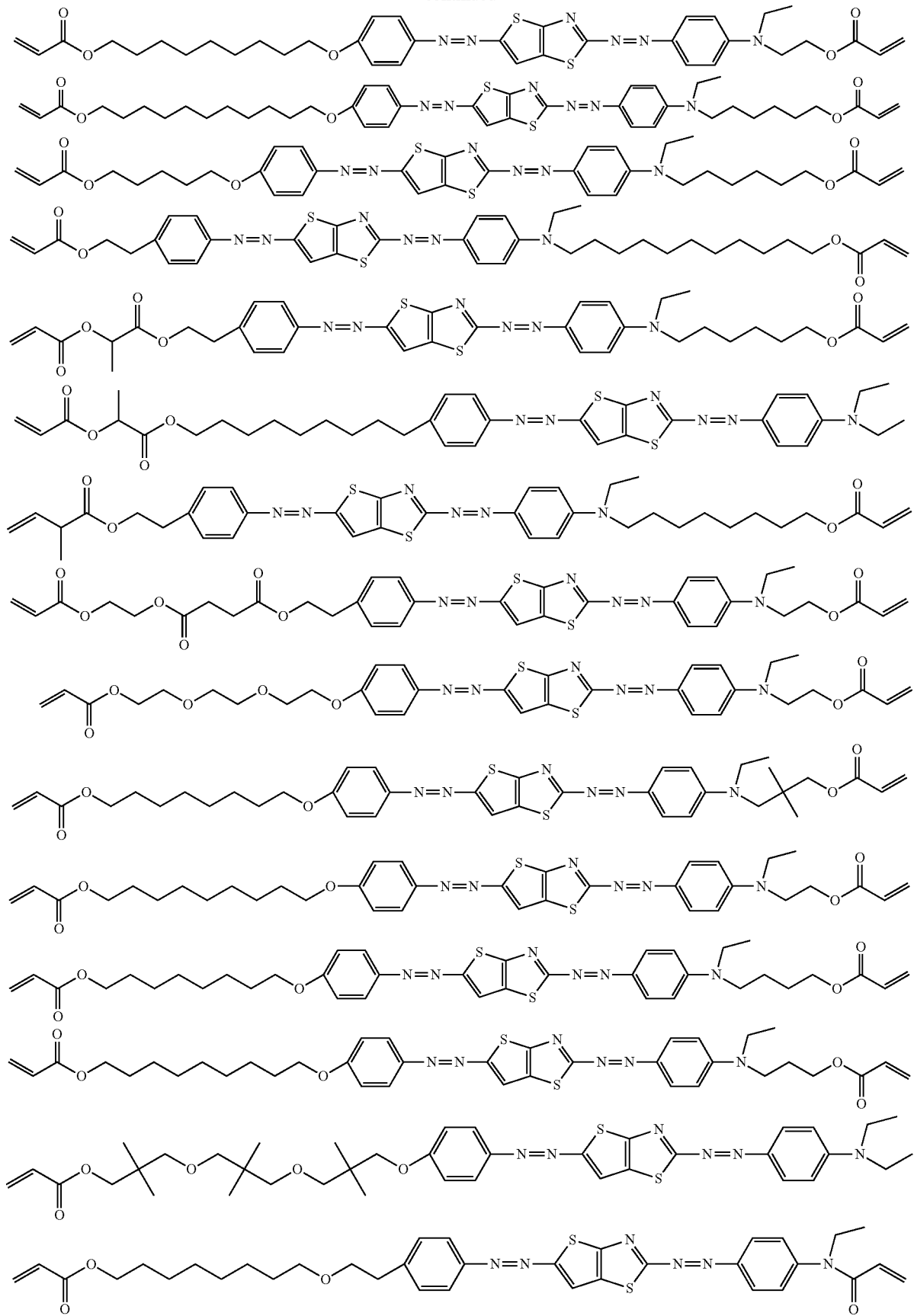

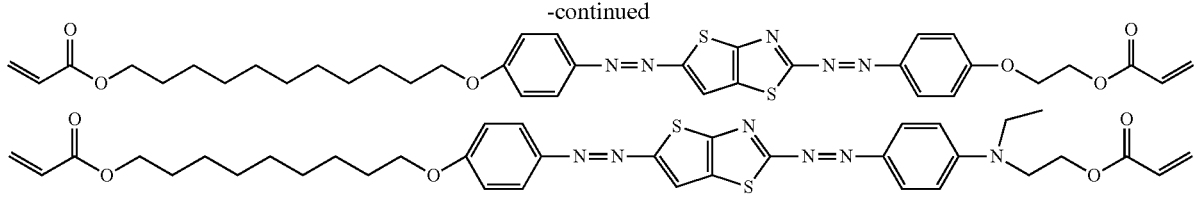

(First Dichroic Azo Coloring Agent)

In the present invention, for a reason that a high degree of alignment can be achieved on a short wavelength side, the liquid crystal composition preferably contains a dichroic azo coloring agent compound represented by Formula (4) as the above-described first dichroic coloring agent.

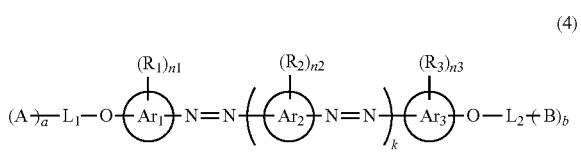

(4)

In Formula (4), A and B each independently represent a crosslinkable group.

In Formula (4), a and b each independently represent 0 or 1, provided that a+b≥1 is satisfied.

In Formula (4), in a case where a is 0, $L_1$ represents a monovalent substituent, and in a case where a is 1, $L_1$ represents a single bond or a divalent linking group. Moreover, in a case where b is 0, $L_2$ represents a monovalent substituent, and in a case where b is 1, $L_2$ represents a single bond or a divalent linking group.

In Formula (4), $Ar_1$ represents an (n1+2)-valent aromatic hydrocarbon group or heterocyclic group, $Ar_2$ represents an (n2+2)-valent aromatic hydrocarbon group or heterocyclic group, and $Ar_3$ represents an (n3+2)-valent aromatic hydrocarbon group or heterocyclic group.

In Formula (4), $R_1$, $R_2$, and $R_3$ each independently represent a monovalent substituent. In a case where n1≥2 is satisfied, a plurality of $R_1$'s may be the same as or different from each other, in a case where n2≥2 is satisfied, a plurality of $R_2$'s may be the same as or different from each other, and in a case where n3≥2 is satisfied, a plurality of $R_3$'s may be the same as or different from each other.

In Formula (4), k represents an integer of 1 to 4. In a case where k≥2 is satisfied, a plurality of $Ar_2$'s may be the same as or different from each other, and the plurality of $R_2$'s may be the same as or different from each other.

In Formula (4), n1, n2, and n3 each independently represent an integer of 0 to 4, provided that in a case where k=1 is satisfied, n1+n2+n3≥0 is satisfied, and in a case where k≥2 is satisfied, n1+n2+n3≥1 is satisfied.

Formula (4) is the same as Formula (1) in WO2017/195833A, and thus Formula (1) may be used as reference.

Specific examples of the dichroic coloring agent compound represented by Formula (4) are shown below, but the present invention is not limited to these examples. Moreover, in the following specific examples, n represents an integer of 1 to 10.

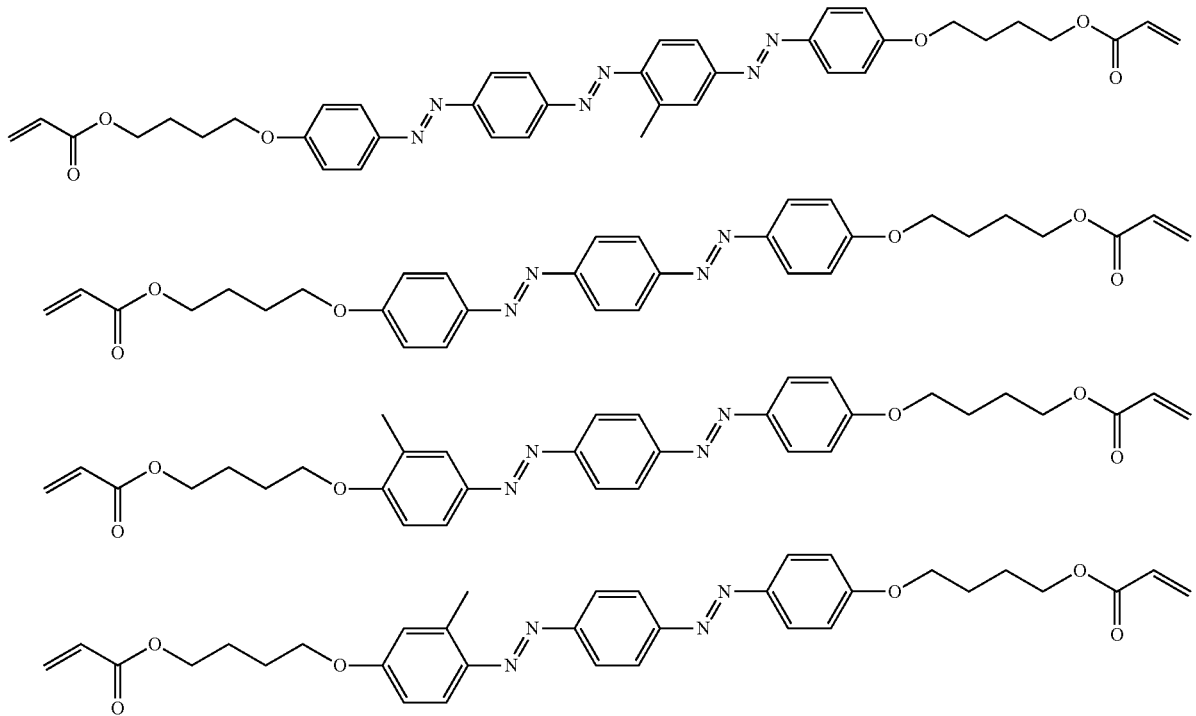

-continued
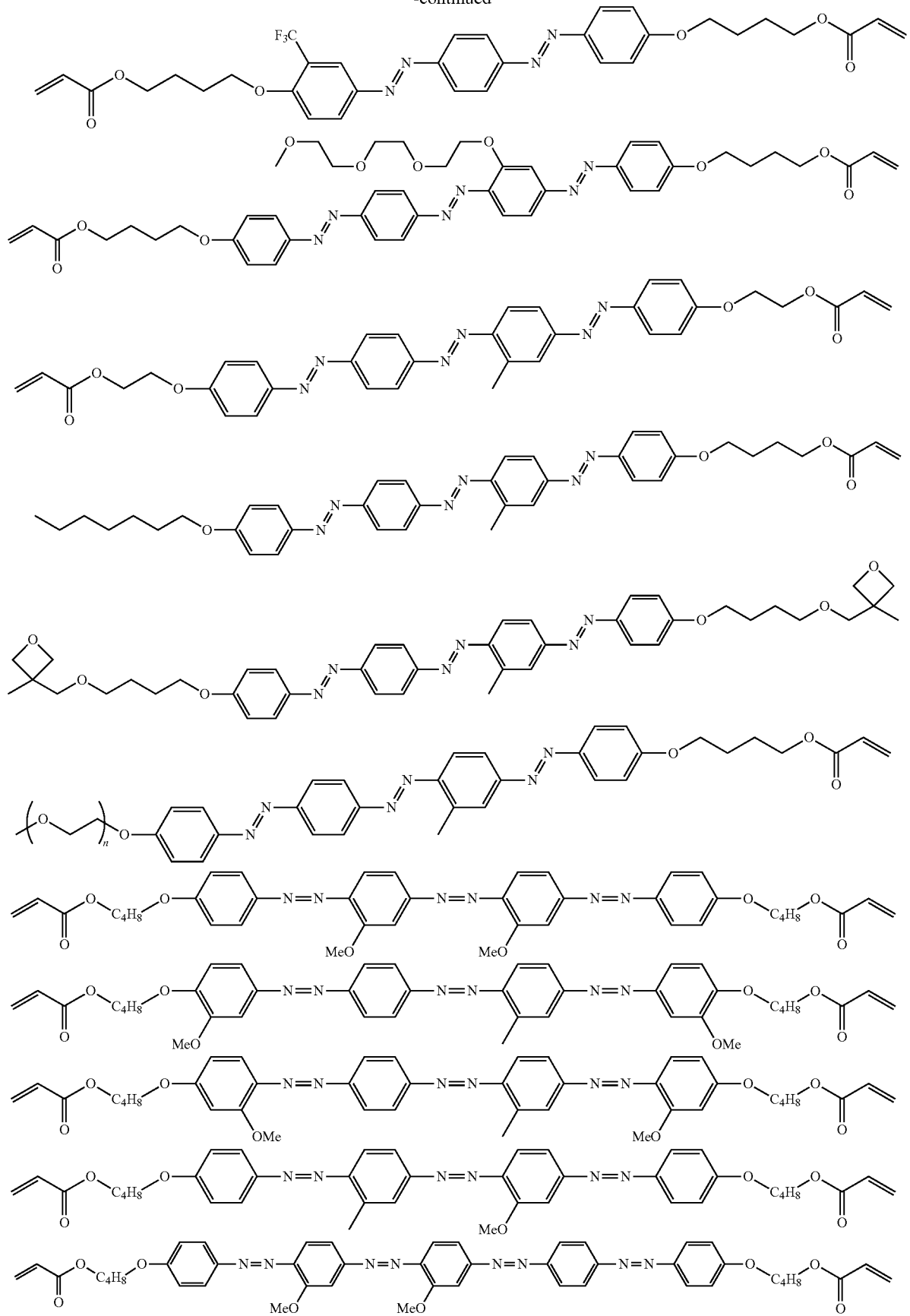

-continued

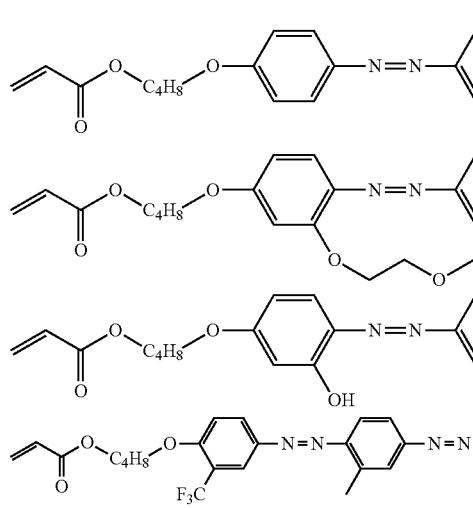
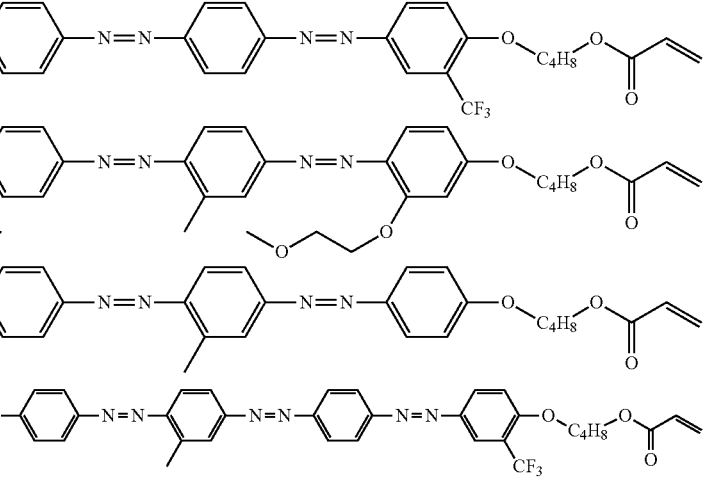

<Liquid Crystalline Compound>

The liquid crystal composition used for forming the light-absorbing anisotropic film according to the embodiment of the present invention contains a liquid crystalline compound. By containing the liquid crystalline compound, a dichroic coloring agent compound can be aligned at a high degree of alignment while restraining the dichroic coloring agent compound from being precipitated.

The liquid crystalline compound in the present invention is a liquid crystalline compound that does not exhibit dichroism.

As the liquid crystalline compound, both of a low-molecular liquid crystalline compound and a high-molecular liquid crystalline compound can be used. Here, the "low-molecular liquid crystalline compound" refers to a liquid crystalline compound having no repeating unit in the chemical structure. In addition, the "high-molecular liquid crystalline compound" refers to a liquid crystalline compound having a repeating unit in the chemical structure.

Examples of the low-molecular liquid crystalline compound include the liquid crystalline compound described in JP2013-228706A.

Examples of the high-molecular liquid crystalline compound include the thermotropic liquid crystalline polymers described in JP2011-237513A. Moreover, the high-molecular liquid crystalline compound may have a crosslinkable group (for example, an acryloyl group and a methacryloyl group) at the terminal.

The liquid crystalline compound may be used alone or in combination of two or more kinds thereof.

In a case where the liquid crystalline compound is contained, a content of the liquid crystalline compound is preferably 75 to 95 parts by mass, more preferably 75 to 90 parts by mass, and still more preferably 80 to 90 parts by mass, in terms of a solid content proportion. By setting the content of the liquid crystalline compound to be within the above range, a degree of alignment of the light-absorbing anisotropic film is further improved.

(Low-Molecular Liquid Crystalline Compound)

As the low-molecular liquid crystalline compound, a compound represented by Formula (5) is preferable.

$$U1\text{-}V1\text{-}W1\text{-}X1\text{-}Y1\text{-}X2\text{-}Y2\text{-}X3\text{-}W2\text{-}V2\text{-}U2 \quad (5)$$

[In Formula (5), X1, X2, and X3 each independently represent a 1,4-phenylene group which may have a substituent or a cyclohexane-1,4-diyl group which may have a substituent, provided that at least one of X1, X2, or X3 is a 1,4-phenylene group which may have a substituent. —$CH_2$— constituting the cyclohexane-1,4-diyl group may be substituted with —O—, —S—, or —NR—. R represents an alkyl group having 1 to 6 carbon atoms or a phenyl group.

Y1 and Y2 each independently represent —$CH_2CH_2$—, —$CH_2O$—, —COO—, —OCOO—, a single bond, —N=N—, —CRa=CRb—, —C≡C—, or CRa=N—. Ra and Rb each independently represent a hydrogen atom or an alkyl group having 1 to 4 carbon atoms.

U1 represents a hydrogen atom or a polymerizable group.

U2 represents a polymerizable group.

W1 and W2 each independently represent a single bond, —O—, —S—, —COO—, or OCOO—.

V1 and V2 each independently represent an alkanediyl group having 1 to 20 carbon atoms which may have a substituent, and —$CH_2$— constituting the alkanediyl group may be substituted with —O—, —S—, or NH—.]

Formula (5) is the compound represented by Formula (A) in JP2017-083843A, and thus the compound may be used as reference.

Specific examples of the low-molecular liquid crystalline compound include compounds represented by Formulae (B-1) to (B-25). In a case where the low-molecular liquid crystalline compound has a cyclohexane-1,4-diyl group, the cyclohexane-1,4-diyl group is preferably a trans-isomer.

(B-1)

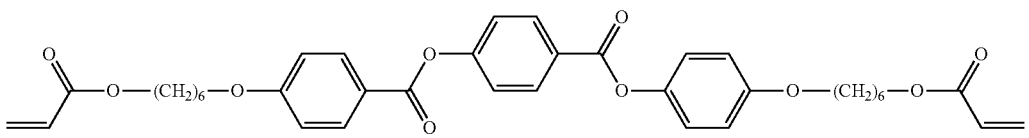

-continued
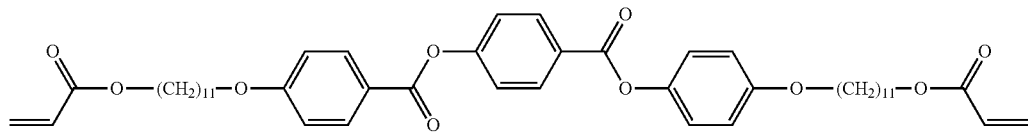
(B-2)
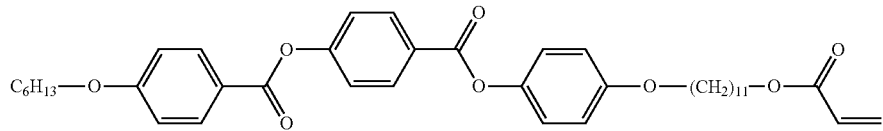
(B-3)
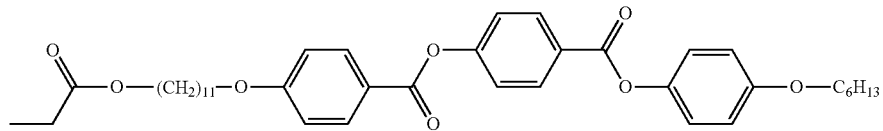
(B-4)
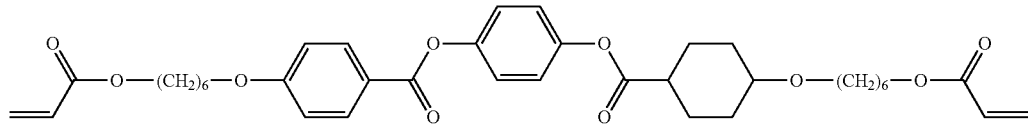
(B-5)
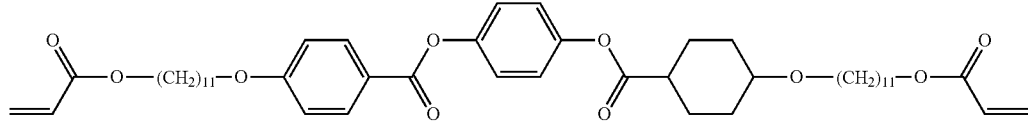
(B-6)
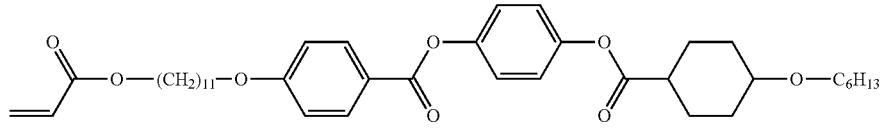
(B-7)
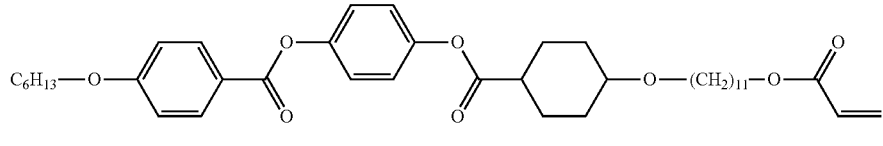
(B-8)
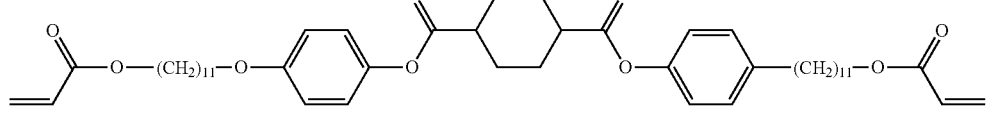
(B-9)
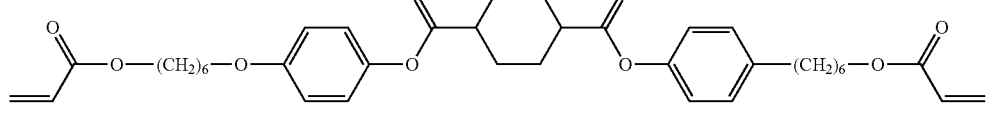
(B-10)
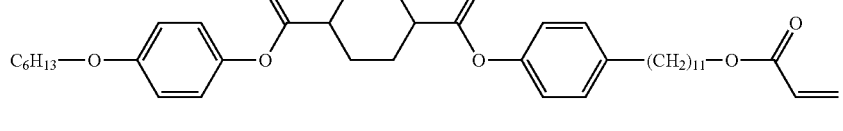
(B-11)
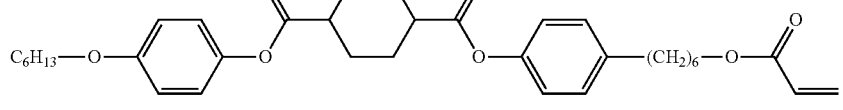
(B-12)

-continued
(B-13)
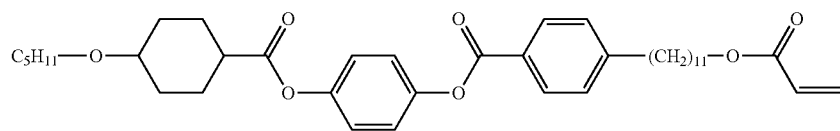
(B-14)
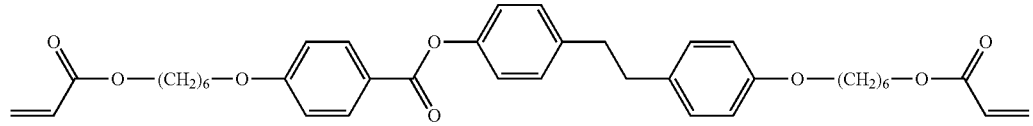
(B-15)
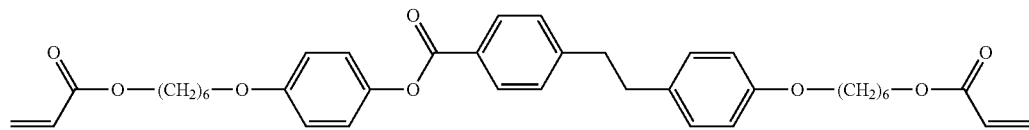
(B-16)
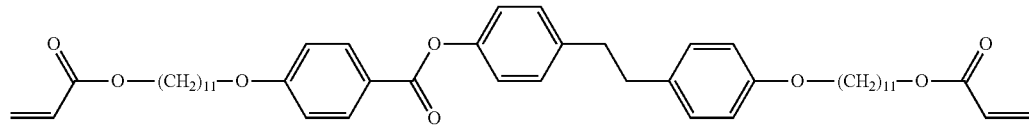
(B-17)
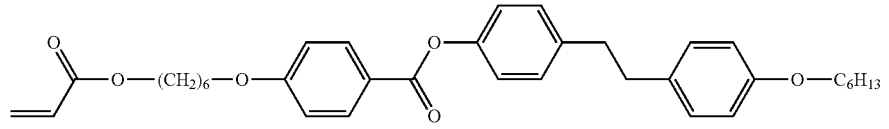
(B-18)
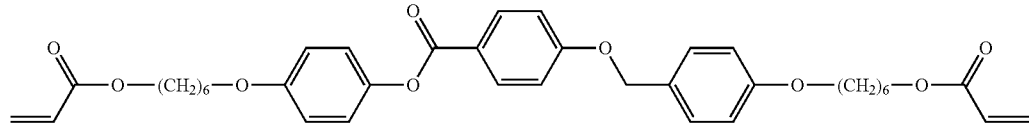
(B-19)
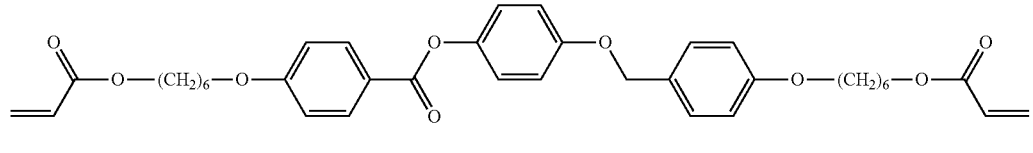
(B-20)
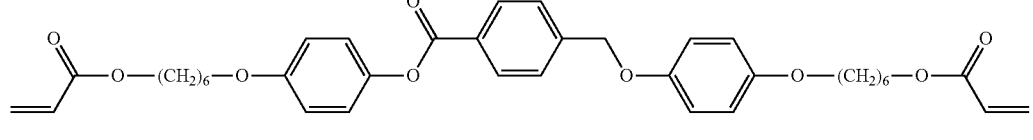
(B-21)
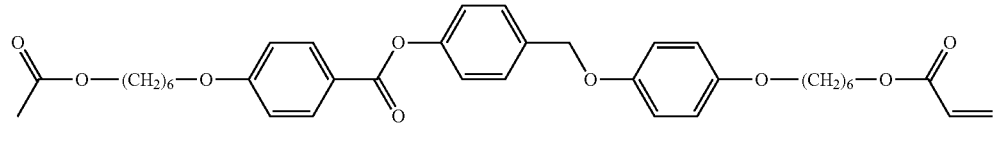
(B-22)
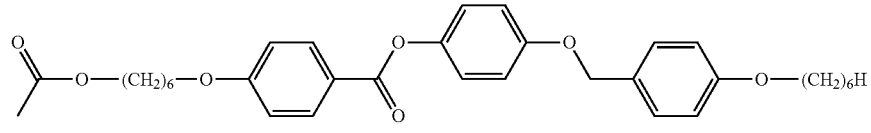
(B-23)
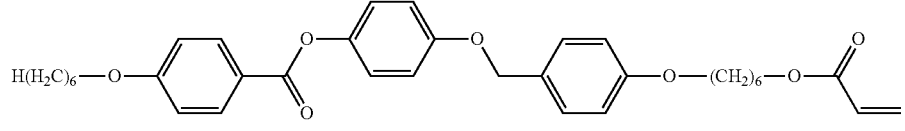

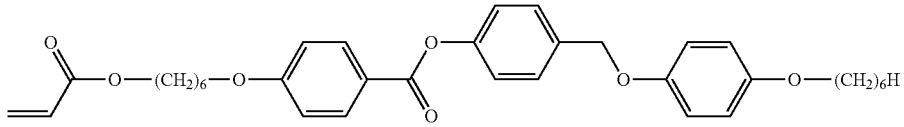

(B-24)

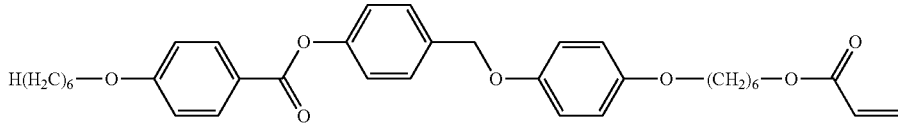

(B-25)

Among these, at least one kind of compound selected from the group consisting of compounds represented by Formula (B-2), Formula (B-3), Formula (B-4), Formula (B-5), Formula (B-6), Formula (B-7), Formula (B-8), Formula (B-13), Formula (B-14), Formula (B-15), Formula (B-16), and Formula (B-17) is preferable.

The exemplified low-molecular liquid crystalline compounds can be used alone or in combination. Moreover, in a case where two or more kinds of low-molecular liquid crystalline compounds are combined, it is preferable that at least one kind is a low-molecular liquid crystalline compound and more preferable that two or more kinds are low-molecular liquid crystalline compounds. In some cases, due to the combination, liquid crystallinity can be temporarily maintained even at a temperature equal to or lower than a liquid crystal-crystal phase transition temperature. A mixing ratio in a case where two kinds of low-molecular liquid crystalline compounds are combined is usually 1:99 to 50:50, preferably 5:95 to 50:50, and more preferably 10:90 to 50:50.

A liquid crystal state of the low-molecular liquid crystalline compound is preferably a smectic phase, and from the viewpoint that a polarizing layer having a higher degree of alignment order can be manufactured, is more preferably a higher-order smectic phase. The "higher-order smectic phase" means a smectic B phase, a smectic D phase, a smectic E phase, a smectic F phase, a smectic G phase, a smectic H phase, a smectic I phase, a smectic J phase, a smectic K phase, and a smectic L phase, and among these, a smectic B phase, a smectic F phase, and a smectic I phase are more preferable. In the polarizing layer having a high degree of alignment order, a Bragg peak derived from a higher-order structure such as a hexatic phase or a crystal phase is obtained in X-ray diffraction measurement. The "Bragg peak" means a peak derived from a planar periodic structure of molecular alignment, and a polarizing layer having a periodic interval of 3.0 to 5.0 Å is preferable.

For example, the low-molecular liquid crystalline compound is produced by a known method described in Lub et al. Recl. Trav. Chim. Pays-Bas, 115, 321 to 328 (1996) or JP4719156B.

(High-Molecular Liquid Crystalline Compound)

The liquid crystal composition preferably contains a high-molecular liquid crystalline compound.

As a structure of the high-molecular liquid crystalline compound, a high-molecular liquid crystalline compound containing a repeating unit represented by Formula (6) is preferably contained.

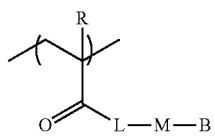

(6)

Here, in Formula (6),

R represents a hydrogen atom or a methyl group.

L represents a single bond or a divalent linking group.

B represents a hydrogen atom, a halogen atom, a cyano group, an alkyl group, an alkoxy group, an amino group, an oxycarbonyl group, an acyloxy group, an acylamino group, an alkoxycarbonylamino group, a sulfonylamino group, a sulfamoyl group, a carbamoyl group, an alkylthio group, a sulfonyl group, a sulfonyl group, a ureido group, or a crosslinkable group.

M represents a mesogenic group represented by Formula (1-1).

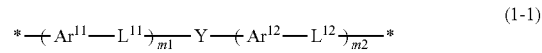

(1-1)

In Formula (1-1), $Ar^{11}$ and $Ar^{12}$ each independently represent a phenylene group or a biphenylene group which may have a substituent.

$L^{11}$ and $L^{12}$ each independently represent a single bond or a divalent linking group including no azo group.

Y represents an imino group, a —OCO—CH=CH— group, or a —CH=CH—CO$_2$— group.

m1 and m2 each independently represent an integer of 1 to 3.

In a case where m1 is an integer of 2 or 3, a plurality of $Ar^{11}$'s may be the same as or different from each other and a plurality of $L^{11}$'s may be the same as or different from each other.

In a case where m2 is an integer of 2 or 3, a plurality of $Ar^{12}$'s may be the same as or different from each other and a plurality of $L^{12}$'s may be the same as or different from each other.

The divalent linking group represented by L in Formula (6) will be described.

Examples of the divalent linking group include —O—, —S—, —COO—, —OCO—, —O—CO—O—, —NR$^N$CO—, —CONR$^N$—, an alkylene group, and a divalent group obtained by combining two or more of these groups. Moreover, R$^N$ represents a hydrogen atom or an alkyl group.

Among these, a divalent group obtained by combining one or more kinds of groups selected from the group consisting of —O—, —COO—, and —OCO—, and art alkylene group is preferable.

Furthermore, the number of carbon atoms in the alkylene group is preferably 2 to 16 from the viewpoint that liquid crystallinity is exhibited.

The mesogenic group represented by Formula (1-1), which is represented by M in Formula (6), will be described. Moreover, in Formula (1-1), * represents a bonding position to L or B in Formula (6).

In Formula (1-1), $Ar^{11}$ and $Ar^{12}$ each independently represent a phenylene group or a biphenylene group which may have a substituent.

Here, the substituent is not particularly limited, and examples thereof include a halogen atom, an alkyl group, an alkyloxy group, an alkylthio group, an oxycarbonyl group, a thioalkyl group, an acyloxy group, an acylamino group, an alkoxycarbonylamino group, a sulfonylamino group, a sulfamoyl group, a carbamoyl group, a sulfinyl group, and a ureido group.

In Formula (1-1), $L^{11}$ and $L^{12}$ each independently represent a single bond or a divalent linking group including no azo group.

Here, examples of the divalent linking group include —O—, —S—, —COO—, —OCO—, —O—CO—O—, —$NR^N$CO—, —$CONR^N$—, an alkylene group, and a divalent group obtained by combining two or more of these groups. Moreover, $R^N$ represents a hydrogen atom or an alkyl group.

In Formula (1-1), Y represents an imino group, a —OCO—CH=CH— group, or a —CH=CH—$CO_2$— group.

In Formula (1-1), m1 and m2 each independently represent an integer of 1 to 3.

Here, from the viewpoint that liquid crystallinity is exhibited, m1 and m2 are preferably an integer of 2 to 5 in total and more preferably an integer of 2 to 4 in total.

B in Formula (6) will be described.

B represents a hydrogen atom, a halogen atom, a cyano group, an alkyl group, an alkoxy group, an amino group, an oxycarbonyl group, an alkoxycarbonyl group, an acyloxy group, a (poly)alkyleneoxy group, an acylamino group, an alkoxycarbonylamino group, a sulfonylamino group, a sulfamoyl group, a carbamoyl group, an alkylthio group, a sulfonyl group, a sulfinyl group, or a ureido group.

Among these, from the viewpoint of exhibition of liquid crystallinity or adjustment of a phase transition temperature and the viewpoint of a solubility, a cyano group, an alkyl group, an alkoxy group, an oxycarbonyl group, an alkoxycarbonyl group, a (poly)alkyleneoxy group, or an alkylthio group is preferable, and an alkyl group, an alkoxy group, or a (poly)akyleneoxy group is more preferable.

Furthermore, in B, an alkyl group or the like except for a hydrogen atom, a halogen atom, and a cyano group has preferably 1 to 20 carbon atoms and more preferably 1 to 11 carbon atoms, from the viewpoint of exhibition of liquid crystallinity or adjustment of a phase transition temperature and the viewpoint of a solubility.

A case where B in Formula (6) represents a crosslinkable group will be described.

Examples of the crosslinkable group include the polymerizable groups described in paragraphs [0040] to [0050] of JP2010-244038A, and among these, from the viewpoint of reactivity and synthesis suitability, an acryloyl group, a methacryloyl group, an epoxy group, an oxetanyl group, or a styryl group is preferable, and an acryloyl group or a methacryloyl group (hereinafter, also simply referred to as a "(meth)acryloyl group") is more preferable.

Liquid crystallinity of the high-molecular liquid crystalline compound may exhibit any one of nematicity or smecticity, and preferably exhibits at least nematicity.

The temperature range at which a nematic phase is exhibited is preferably room temperature (23° C.) to 300° C., and from the viewpoint of handling or manufacturing suitability, is preferably 50° C. to 200° C.

In addition, in the present invention, a weight-average molecular weight (Mw) of the high-molecular liquid crystalline compound is preferably 1,000 to 100,000 and more preferably 2,000 to 60,000. Moreover, a number-average molecular weight (Mn) thereof is preferably 500 to 80,000 and more preferably 1,000 to 30,000.

Here, the weight-average molecular weight and the number-average molecular weight in the present invention are values measured by a gel permeation chromatography (GPC) method.

Solvent (eluent): tetrahydrofuran
Device name: TOSOH HLC-8220GPC
Column: three TOSOH TSKgel Super HZM-H (4.6 mm×15 cm) are connected and used
Column temperature: 25° C.
Sample concentration: 0.1% by mass
Flow rate: 0.35 ml/min
Calibration curve: calibration curve obtained by seven samples of TSK standard polystyrene manufactured by Tosoh Corporation having Mw of 2,800,000 to 1,050 (Mw/Mn=1.03 to 1.06) is used In the present invention, for a reason that absorption in a visible light range is small and the alignment of the dichroic coloring agent compound in the visible light range is more easily maintained, a maximum absorption wavelength of the high-molecular liquid crystalline compound is preferably 380 nm or less.

In addition, in the present invention, for a reason that a dichroic ratio of the light-absorbing anisotropic film is further improved, the number of benzene rings contained in the mesogenic group of the high-molecular liquid crystalline compound is preferably 3 or more.

Specific examples of the high-molecular liquid crystalline compound having the repeating unit represented by Formula (6) include high-molecular liquid crystalline compounds represented by the following structural formulae. Moreover, in the following structural formulae, R represents a hydrogen atom or a methyl group.

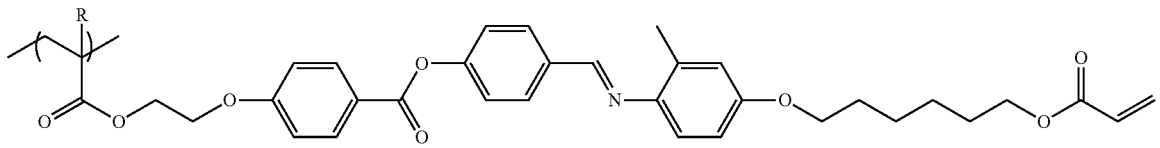

-continued

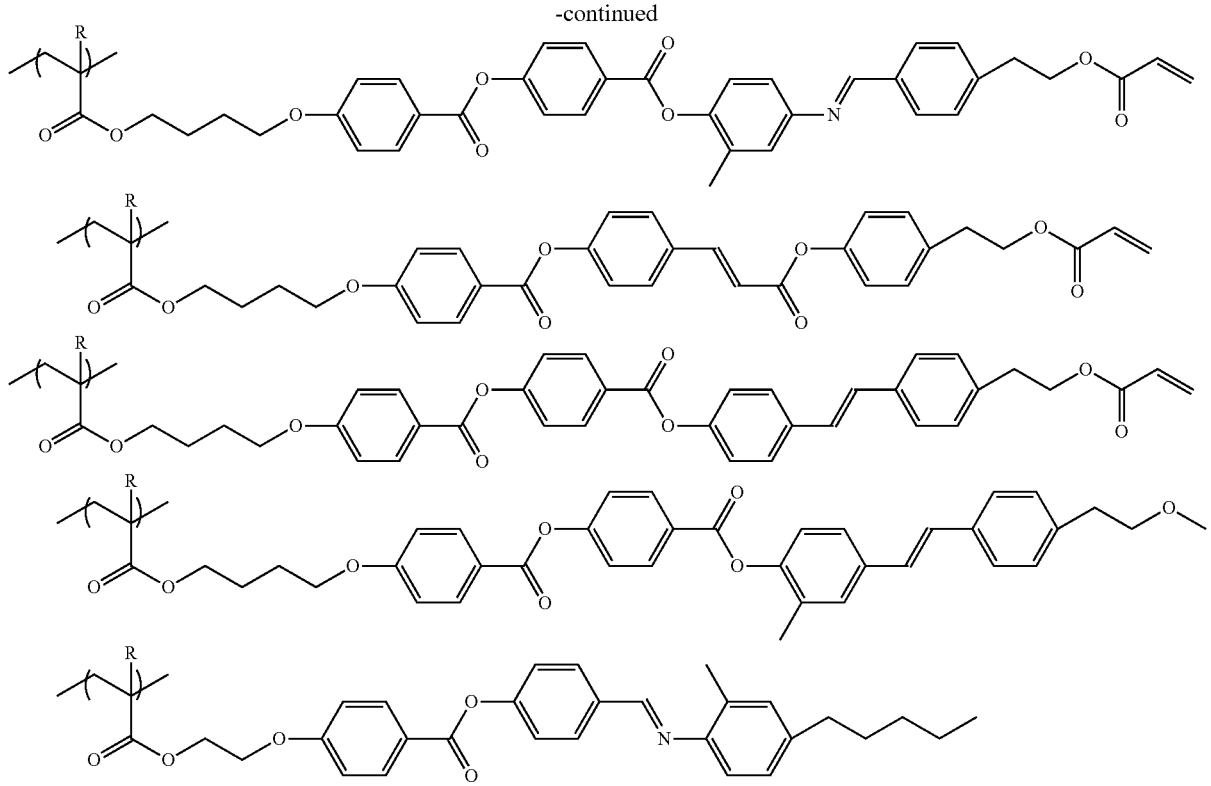

In the present invention, as a more preferred high-molecular liquid crystalline compound, a high-molecular liquid crystalline compound containing a repeating unit represented by Formula (7) is preferably contained. In Formula (7), a difference between a logP value of P1 (hereinafter, also referred to as a "main chain"), L1, and SP1 (hereinafter, also referred to as a "spacer group") and a logP value of M1 (hereinafter, also referred to as a "mesogenic group") is 4 or more.

By using the high-molecular liquid crystalline compound, a light-absorbing anisotropic film having a high degree of alignment can be formed. Details of a reason thereof are not clear, but are generally estimated as follows.

The logP value is an index expressing properties of hydrophilicity and hydrophobicity of a chemical structure. Since the logP value of the main chain, L1, and the spacer group is separated from the logP value of the mesogenic group by a predetermined value or more, the repeating unit represented by Formula (7) is in a state where compatibility between a structure from the main chain to the spacer group and the mesogenic group is low. Thereby, crystallinity of the high-molecular liquid crystalline compound is increased and it is presumed to be in a state where the degree of alignment of the high-molecular liquid crystalline compound is high. As described above, in a case where the degree of alignment of the high-molecular liquid crystalline compound is high, it is presumed that compatibility between the high-molecular liquid crystalline compound and the dichroic coloring agent compound is reduced (that is, crystallinity of the dichroic coloring agent is improved), and a degree of alignment of the dichroic coloring agent compound is improved. As a result, it is thought that the obtained degree of alignment of the light-absorbing anisotropic film is increased.

A preferred high-molecular liquid crystalline compound in the present invention contains the repeating unit represented by Formula (7) (in the present specification, also referred to as a "repeating unit (7)"). Moreover, in the repeating unit (7), the difference between the logP value of P1, L1, and SP1 and the logP value of M1 is 4 or more.

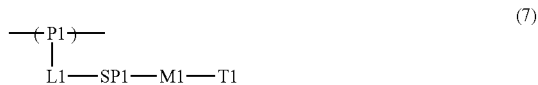

In Formula (7), P1 represents a main chain of the repeating unit, L1 represents a single bond or a divalent linking group, SP1 represents a spacer group, M1 represents a mesogenic group, and T1 represents a terminal group.

Provided that in a case where M1 has a linking group, an azo group is not included as a linking group.

Specific examples of the main chain of the repeating unit represented by P1 include groups represented by Formulae (P1-A) to (P1-D), and among these, from the viewpoint of a diversity of monomers used as raw materials and easy handling, a group represented by Formula (P1-A) is preferable.

-continued

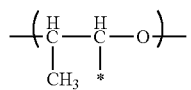
(P1-C)

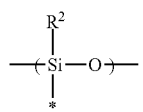
(P1-D)

In Formulae (P1-A) to (P1-D), "*" represents a bonding position to L1 in Formula (7). In Formula (P1-A), represents a hydrogen atom or a methyl group. In Formula (P1-D), $R^2$ represents an alkyl group.

A group represented by Formula (P1-A) is preferably one unit of a partial structure of poly(meth)acrylic acid ester obtained by polymerization of (meth)acrylic acid ester.

A group represented by Formula (P1-B) is preferably an ethylene glycol unit in polyethylene glycol obtained by polymerizing ethylene glycol.

A group represented by Formula (P1-C) is preferably a propylene glycol unit obtained by polymerizing propylene glycol.

A group represented by Formula (P1-D) is preferably a siloxane unit of a polysiloxane obtained by condensation polymerization of silanol. Here, silanol is a compound represented by a formula of $Si(R^2)_3(OH)$. In the formula, a plurality of $R^2$'s each independently represent a hydrogen atom or an alkyl group, provided that at least one of the plurality of $R^2$'s represents an alkyl group.

L1 is a single bond or a divalent linking group.

Examples of the divalent linking group represented by L1 include —C(O)O—, —OC(O)—, —O—, —S—, —C(O) $NR^3$—, —$NR^3$C(O)—, —$SO_2$—, and —$NR^3R^4$—. In the formulae, $R^3$ and $R^4$ each independently represent a hydrogen atom, or an alkyl group having 1 to 6 carbon atoms which may have a substituent.

In a case where P1 is a group represented by Formula (P1-A), L1 is preferably a group represented by —C(O)O—.

In a case where P1 is a group represented by each of Formulae (P1-B) to (P1-D), L1 is preferably a single bond.

For a reason of easy exhibition of liquid crystallinity or availability of a raw material, the spacer group represented by SP1 preferably contains at least one kind of structure selected from the group consisting of an oxyethylene structure, an oxypropylene structure, a polysiloxane structure, and an alkylene fluoride structure.

Here, the oxyethylene structure represented by SP1 is preferably a group represented by *—$(CH_2—CH_2O)_{n1}$—*. In the formula, n1 represents an integer of 1 to 20, and * represents a bonding position to L1 or M1.

The oxypropylene structure represented by SP1 is preferably a group represented by *—$(CH(CH_3)—CH_2O)_{n2}$—*. In the formula, n2 represents an integer of 1 to 3, and * represents a bonding position to L1 or M1.

The polysiloxane structure represented by SP1 is preferably a group represented by *—$(Si(CH_3)_2—O)_{n3}$—*. In the formula, n3 represents an integer of 6 to 10, and * represents a bonding position to L1 or M1.

The alkylene fluoride structure represented by SP1 is preferably a group represented by *—$(CF_2—CF_2)_{n4}$—*. in the formula, n4 represents an integer of 6 to 10, and * represents a bonding position to L1 or M1.

The mesogenic group represented by M1 is a group indicating a main skeleton of a liquid crystal molecule which contributes to liquid crystal formation. The liquid crystal molecule exhibits liquid crystallinity which is an intermediate state (mesophase) between a crystalline state and an isotropic liquid state. The mesogenic group is not particularly limited, and reference can be made to, for example, "Flussige Kristalle in Tabellen II" (VEB Deutsche Verlag fur Grundstoff Industrie, Leipzig, published in 1984), particularly the descriptions on pages 7 to 16, and Editorial committee of Liquid Crystal Handbook, liquid crystal handbook (Maruzen Publishing Co., Ltd., published in 2000), particularly the descriptions in Chapter 3.

As the mesogenic group, for example, a group having at least one kind of cyclic structure selected from the group consisting of an aromatic hydrocarbon group, a heterocyclic group, and an alicyclic group is preferable.

As the mesogenic group, from the viewpoint of exhibition of liquid crystallinity, adjustment of a liquid crystal phase transition temperature, availability of a raw material, and synthesis suitability, a group represented by Formula (M1-A) or Formula (M1-B) is preferable.

(M1-A)

(M1-B)

In Formula (M1-A), A1 is a divalent group selected from the group consisting of an aromatic hydrocarbon group, a heterocyclic group, and an alicyclic group. These groups may be substituted with an alkyl group, an alkyl fluoride group, an alkoxy group, or a substituent.

The divalent group represented by A1 is preferably a 4- to 6-membered ring. Moreover, the divalent group represented by A1 may be a single ring or a condensed ring.

* represents a bonding position to SP1 or T1.

Examples of the divalent aromatic hydrocarbon group represented by A1 include a phenylene group, a naphthylene group, a fluorene-diyl group, an anthracene-diyl group, and a tetracene-diyl group, and from the viewpoint of a diversity of design of a mesogenic skeleton or availability of a raw material, a phenylene group or a naphthylene group is preferable and a phenylene group is more preferable.

The divalent heterocyclic group represented by A1 may be either aromatic or non-aromatic, but is preferably a divalent aromatic heterocyclic group from the viewpoint that the degree of alignment is further improved.

Examples of an atom constituting the divalent aromatic heterocyclic group, other than carbon, include a nitrogen atom, a sulfur atom, and an oxygen atom. In a case where the aromatic heterocyclic group has a plurality of atoms constituting a ring other than carbon, these atoms may be the same as or different from each other.

Specific examples of the divalent aromatic heterocyclic group include a pyridylene group (pyridine-diyl group), a pyridazine-diyl group, an imidazole-diyl group, thienylene group (thiophene-diyl group), a quinolylene group (quinoline-diyl group), an isoquinolylene group (isoquinoline-diyl group), an oxazole-diyl group, a thiazole-diyl group, an oxadiazole-diyl group, a benzothiazole-diyl group, a benzothiadiazole-diyl group, a phthalimido-diyl group, a thienothiazole-diyl group, a thiazolothiazole-diyl group, a thienothiophene-diyl group, and a thienooxazole-diyl group.

Specific examples of the divalent alicyclic group represented by A1 include a cyclopentylene group and a cyclohexylene group.

In Formula (M1-A), a1 represents an integer of 1 to 10. In a case where a1 is 2 or more, a plurality of A1's may be the same as or different from each other.

In Formula (M1-B), A2 and A3 are each independently a divalent group selected from the group consisting of an aromatic hydrocarbon group, a heterocyclic group, and an alicyclic group. Specific examples and suitable aspects of A2 and A3 are the same as those of A1 in Formula (M1-A), and thus descriptions thereof will be omitted.

In Formula (M1-B), a2 represents an integer of 1 to 10, and in a case where a2 is 2 or more, a plurality of A2's may be the same as or different from each other, a plurality of A3's may be the same as or different from each other, and a plurality of LA1's may be the same as or different from each other.

In Formula (M1-B), in a case where a2 is 1, LA1 is a divalent linking group. In a case where a2 is 2 or more, the plurality of LA1's are each independently a single bond or a divalent linking group, and at least one among the plurality of LA1's is a divalent linking group.

In Formula (M1-B), examples of the divalent linking group represented by LA1 include —O—, —(CH$_2$)$_g$—, —(CF$_2$)$_g$—, —(Si(CH$_3$)$_2$—, —(Si(CH$_3$)$_2$O)$_g$—, —(OSi(CH$_3$)$_2$)$_g$— (g represents an integer of 1 to 10), —N(Z)—, —C(Z)=C(Z')—, —C(Z)=N—, —N=C(Z)—, —C(Z)$_2$—C(Z')$_2$—, —C(O)—, —OC(O)—, —C(O)O—, —O—C(O)O—, —N(Z)C(O)—, —C(O)N(Z)—, —C(Z)=C(Z')—C(O)O—, —O—C(O)—C(Z)=C(Z')—, —C(Z)=N—, —N=C(Z)—, —C(Z)=C(Z')—C(O)N(Z")—, —N(Z")—C(O)—C(Z)=C(Z')—, —C(Z)=C(Z')—C(O)—S—, —S—C(O)—C(Z)=C(Z')— (Z, Z', and Z" independently represent hydrogen, a C1 to C4 alkyl group, a cycloalkyl group, an aryl group, a cyano group, or a halogen atom), —C≡C—, —S—, —S(O)—, —S(O)(O)—, —(O)S(O)O—, —O(O)S(O)O—, —SC(O)—, and —C(O)S—. LA1 may be a group obtained by combining two or more of these groups.

Specific examples of M1 include the following structures. Moreover, in the following specific examples, "Ac" represents an acetyl group.

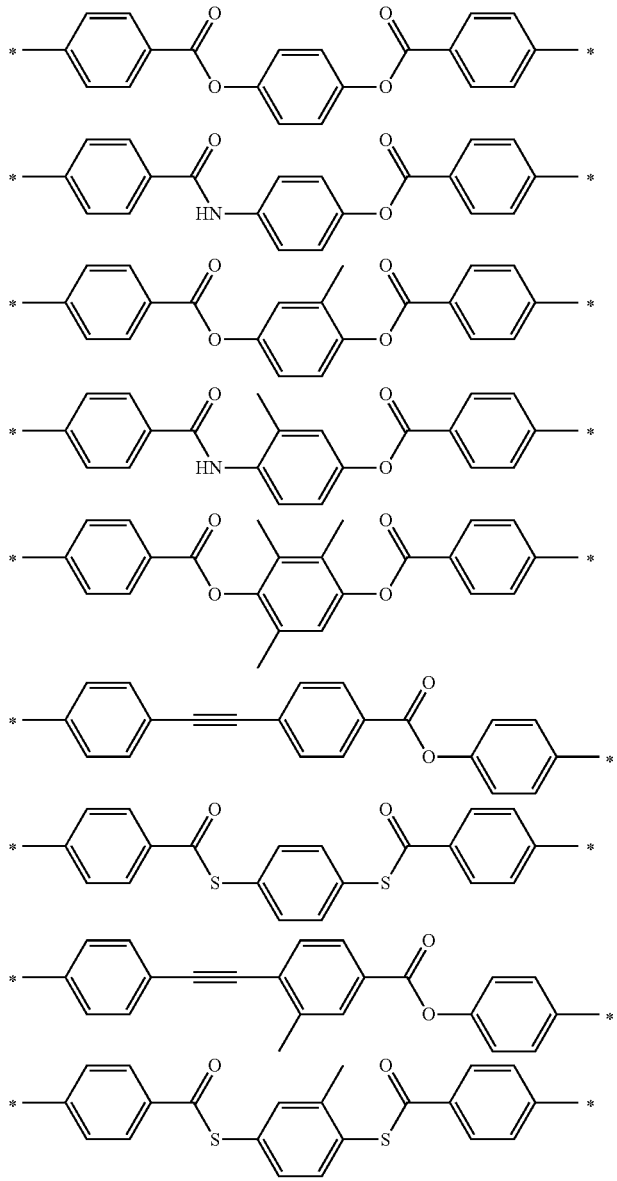

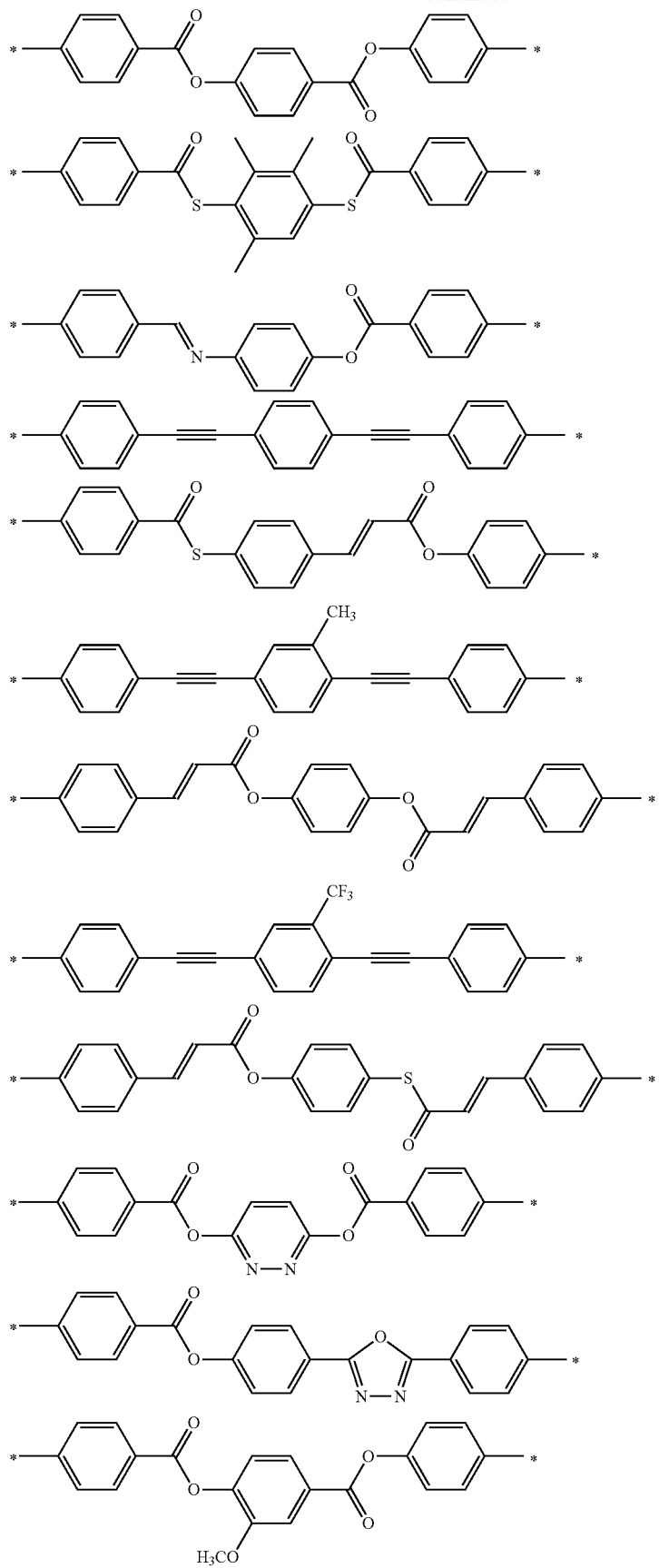

-continued
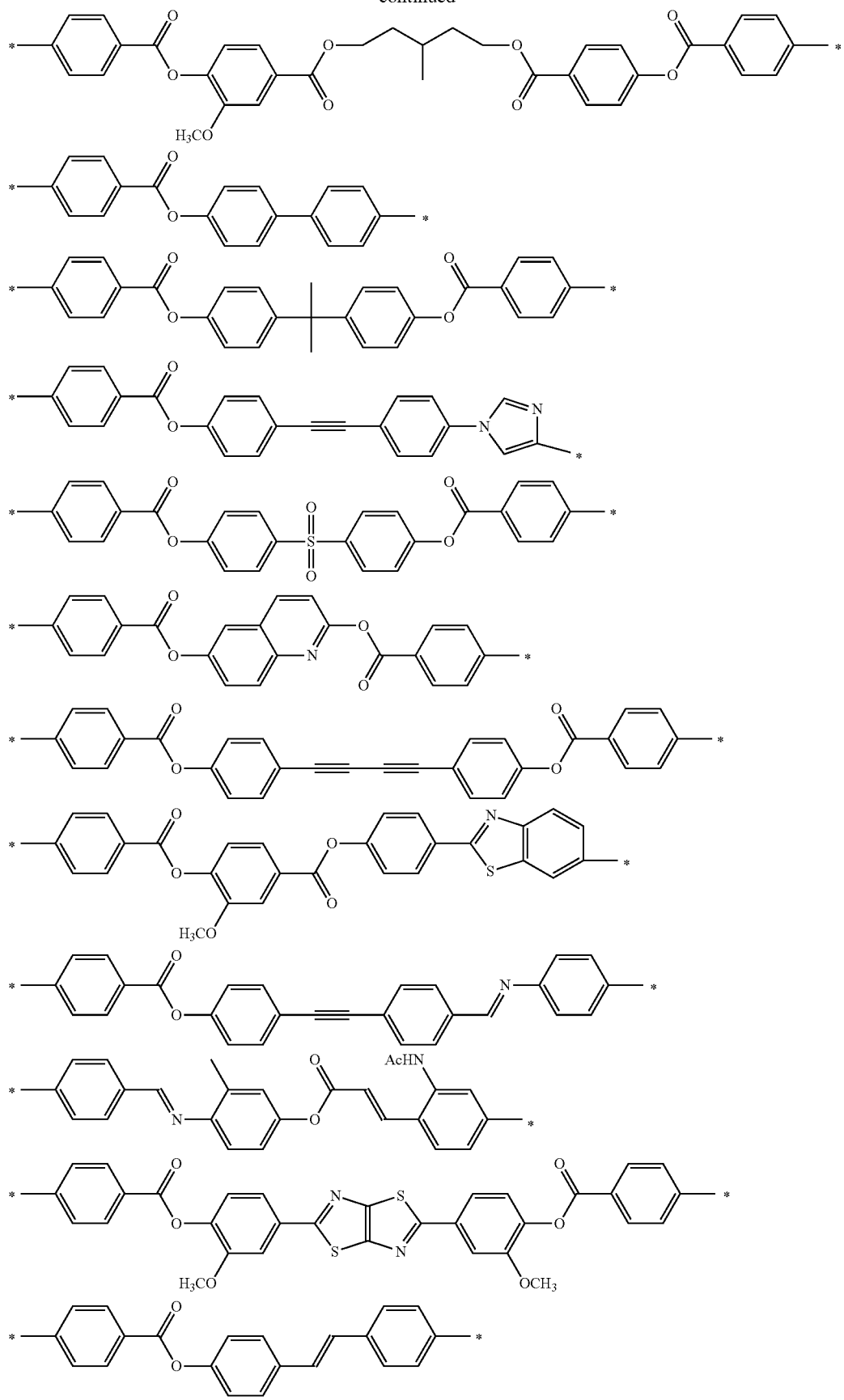

-continued

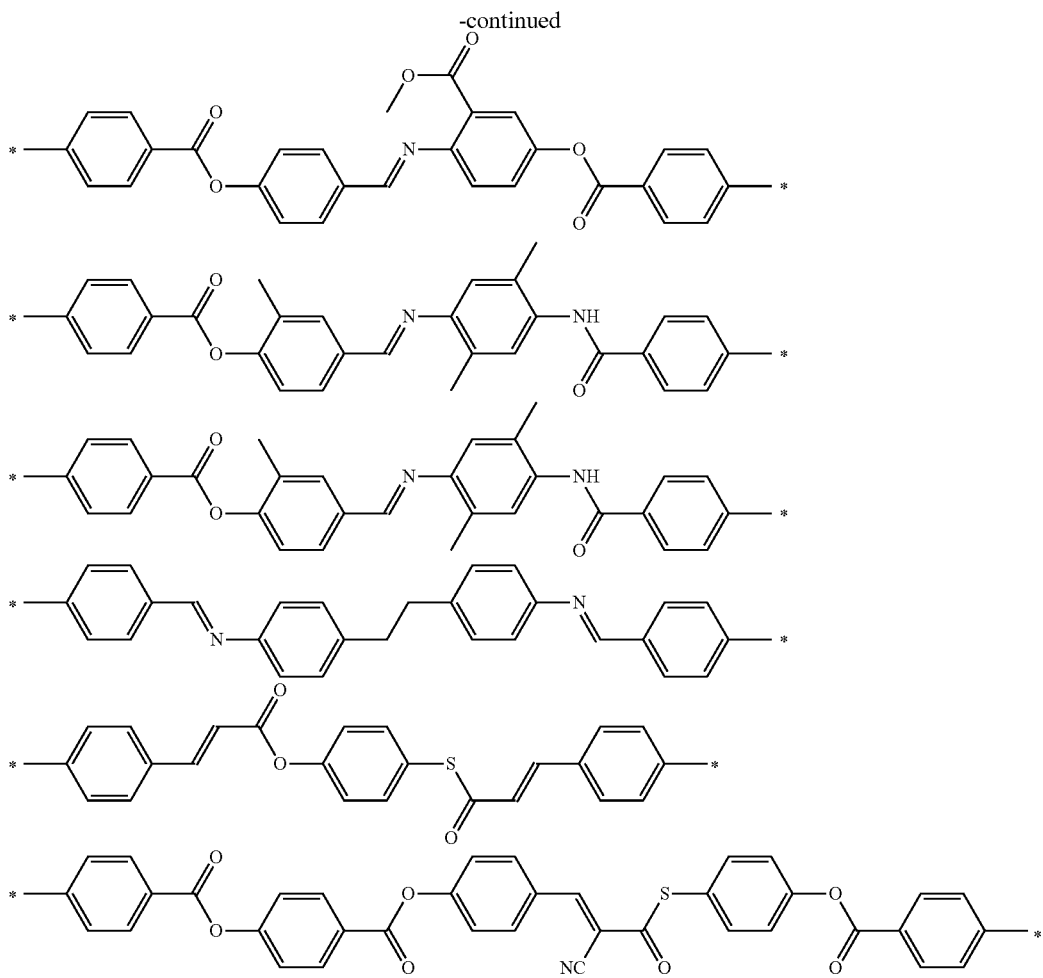

Examples of the terminal group represented by T1 include a hydrogen atom, a halogen atom, a cyano group, a nitro group, a hydroxy group, an alkyl group having 1 to 10 carbon atoms, an alkoxy group having 1 to 10 carbon atoms, an alkylthio group having 1 to 10 carbon atoms, an oxycarbonyl group having 1 to 10 carbon atoms, an acyloxy group having 1 to 10 carbon atoms, an acylamino group having 1 to 10 carbon atoms, an alkoxycarbonyl group having 1 to 10 carbon atoms, an alkoxycarbonylamino group having 1 to 10 carbon atoms, a sulfonylamino group having 1 to 10 carbon atoms, a sulfamoyl group having 1 to 10 carbon atoms, a carbamoyl group having 1 to 10 carbon atoms, a sulfinyl group having 1 to 10 carbon atoms, and a ureide group having 1 to 10 carbon atoms. These terminal groups may be further substituted with these groups or the polymerizable group described in JP2010-244038A.

The number of atoms in a main chain of T1 is preferably 1 to 20, more preferably 1 to 15, still more preferably 1 to 10, and particularly preferably 1 to 7. In a case where the number of atoms in the main chain of T1 is 20 or less, the degree of alignment of the light-absorbing anisotropic film is further improved. Here, the "main chain" in T1 means the longest molecular chain bonded to M1, and the number of hydrogen atoms is not counted as the number of atoms in the main chain of T1. For example, in a case where T1 is an n-butyl group, the number of atoms in the main chain is 4, and in a case where T1 is a sec-butyl group, the number of atoms in the main chain is 3.

A content of the repeating unit (7) is preferably 20% to 100% by mass, more preferably 30% to 99.9% by mass, and still more preferably 40% to 99.0% by mass with respect to 100% by mass of all the repeating units in the high-molecular liquid crystalline compound.

In the present invention, a content of each repeating unit contained in the high-molecular liquid crystalline compound is calculated based on a charged amount (mass) of each monomer used to obtain each repeating unit.

The high-molecular liquid crystalline compound may contain one kind of repeating unit (7) alone or two or more kinds thereof. In a ease where the high-molecular liquid crystalline compound contains two or more kinds of the repeating units (7), there are advantages such as improvement in a solubility of the high-molecular liquid crystalline compound in a solvent and easy adjustment of the liquid crystal phase transition temperature. In a ease where two or more kinds of the repeating units (7) are contained, a total amount thereof is preferably within the above range.

In a case where two or more kinds of the repeating units (7) are contained, a repeating unit (7) containing no polymerizable group in T1 and a repeating unit (7) containing a polymerizable group in T1 may be used in combination. Thereby, curability of the light-absorbing anisotropic film is further improved.

In this case, in the high-molecular liquid crystalline compound, a ratio (repeating unit (7) containing a polymerizable group in T1/repeating unit (7) containing no polymerizable group in TI) of the repeating unit (7) containing a polymerizable group in T1 to the repeating unit (7) containing no polymerizable group in T1 is preferably 0.005 to 4 and more preferably 0.01 to 2.4, in terms of a mass ratio. In a case where the mass ratio is 4 or less, there is an advantage that the degree of alignment is excellent. In a case where the mass ratio is 0.05 or more, the curability of the light-absorbing anisotropic film is further improved.

(LogP Value)

In Formula (7), the difference ($|logP_1-logP_2|$) between the logP value of P1, L1, and SP1 (hereinafter, also referred to as "logP1") and the logP value of M1 (hereinafter, also referred to as "$logP_2$") is 4 or more, and from the viewpoint that the degree of alignment of the light-absorbing anisotropic film is further improved, is preferably 4.25 or more and more preferably 4.5 or more.

In addition, an upper limit value of the difference is preferably 15 or less, more preferably 12 or less, and still more preferably 10 or less, from the viewpoint of adjustment of the liquid crystal phase transition temperature and synthesis suitability.

Here, the logP value is an index expressing properties of hydrophilicity and hydrophobicity of a chemical structure, and may be called a hydrophilic-hydrophobic parameter. The logP value can be calculated using software such as ChemBioDraw Ultra or HSPiP (Ver. 4.1.07). Moreover, the logP value can also be obtained experimentally by a method of OECD Guidelines for the Testing of Chemicals, Sections 1, Test No. 117 or the like. In the present invention, unless otherwise specified, a value calculated by inputting a structural formula of a compound into HSPiP (Ver. 4.1.07) is employed as a logP value.

As described above, $logP_1$ means the logP value of P1, L1, and SP1. The "logP value of P1, L1, and SP1" means a logP value of a structure in which P1, L1, and SP1 are integrated and is not a sum of respective logP values of P1, L1, and SP1. Specifically, $logP_1$ is calculated by inputting a series of structural formulae from P1 to SP1 in Formula (7) into the software.

However, in the calculation of $logP_1$, regarding a part of the group represented by P1 in the series of structural formulae from P1 to SP1, the structure (for example, Formulae (P1-A) to (P1-D)) of the group represented by P1 as it is may be used, or a structure of a group which can become P1 after polymerizing a monomer used to obtain a repeating unit represented by Formula (7) may be used.

Here, specific examples of the latter (group which can become P1) are as follows. In a case where P1 is obtained by polymerization of (meth)acrylic acid ester, the above group is a group represented by $CH_2=C(R^1)-$ ($R^1$ represents a hydrogen atom or a methyl group). In a case where P1 is obtained by polymerization of ethylene glycol, the above group is ethylene glycol, and in a case where P1 is obtained by polymerization of propylene glycol, the above group is propylene glycol. In a case where P1 is obtained by condensation polymerization of silanol, the above group is silanol (the compound represented by the formula of $Si(R^2)_3(OH)$, the plurality of $R^2$'s each independently represent a hydrogen atom or an alkyl group, provided that at least one of the plurality of $R^2$'s represents an alkyl group).

As long as the difference between $logP_1$ and $logP_2$ described above is 4 or more, $logP_1$ may be lower than $logP_2$ or higher than $logP_2$.

Here, a logP value ($logP_2$ described above) of a general mesogenic group tends to be within a range of 4 to 6. At this time, in a case where $logP_1$ is lower than $logP_2$, the value of $logP_1$ is preferably 1 or less and more preferably 0 or less. On the other hand, in a case where $logP_1$ is higher than $logP_2$, the value of $logP_1$ is preferably 8 or more and more preferably 9 or more.

In a case where P1 in Formula (7) is obtained by polymerization of (meth)acrylic acid ester and $logP_1$ is lower than $logP_2$, the logP value of SP1 in Formula (7) is preferably 0.7 or less and more preferably 0.5 or less. On the other hand, in a case where P1 in Formula (7) is obtained by polymerization of (meth)acrylic acid ester and $logP_1$ is higher than $logP_2$, the logP value of SP1 in Formula (7) is preferably 3.7 or more and more preferably 4.2 or more.

In addition, examples of a structure having a logP value of 1 or less include an oxyethylene structure and an oxypropylene structure. Examples of a structure having a logP value of 6 or more include a polysiloxane structure and an alkylene fluoride structure.

The weight-average molecular weight (Mw) of the high-molecular liquid crystalline compound is preferably 1,000 to 500,000, more preferably 3,000 to 100,000, and still more preferably 5,000 to 50,000. In a case where Mw of the high-molecular liquid crystalline compound is within the above range, handling of the high-molecular liquid crystalline compound becomes easy.

In particular, from the viewpoint of suppression of cracks during application, the weight-average molecular weight (Mw) of the high-molecular liquid crystalline compound is preferably 10,000 or more and more preferably 10,000 to 100,000.

Furthermore, from the viewpoint of a temperature latitude of the degree of alignment, the weight-average molecular weight (Mw) of the high-molecular liquid crystalline compound is preferably less than 50,000 and more preferably 3,000 or more and less than 50,000.

Here, the weight-average molecular weight and the number-average molecular weight in the present invention are values measured by a gel permeation chromatography (GPC) method as described above.

Liquid crystallinity of the high-molecular liquid crystalline compound may exhibit any one of nematicity or smecticity, and preferably exhibits at least nematicity.

The temperature range at which a nematic phase is exhibited is preferably room temperature (23° C.) to 450° C., and from the viewpoint of handling or manufacturing suitability, is preferably 50° C. to 400° C.

<Interface Modifier>

The liquid crystal composition used for forming the light-absorbing anisotropic film according to the embodiment of the present invention preferably contains an interface modifier. By incorporation of the interface modifier, it is anticipated that the smoothness of the coating surface is improved to improve the degree of alignment, or cissing and unevenness are suppressed to improve the in-plane uniformity.

As the interface modifier, a material having a liquid crystalline compound horizontal on the coating surface side is preferable, and the compounds (horizontal alignment agents) described in paragraphs [0253] to [0293] of JP2011-237513A can be used.

In a case where the liquid crystal composition contains the interface modifier, a content of the interface modifier is preferably 0.001 to 5 parts by mass and more preferably 0.01 to 3 parts by mass with respect to 100 parts by mass of the total amount of the dichroic coloring agent compound and the liquid crystalline compound in the liquid crystal composition.

<Polymerization Initiator>

The liquid crystal composition used for forming the light-absorbing anisotropic film according to the embodiment of the present invention may contain a polymerization initiator.

The polymerization initiator is not particularly limited, but is preferably a photosensitive compound, that is, a photopolymerization initiator.

As the photopolymerization initiator, various kinds of compounds can be used with no particular limitation. Examples of the photopolymerization initiator include α-carbonyl compounds (each of the specifications of U.S. Pat. Nos. 2,367,661A and 2,367,670A), acyloin ether (the specification of U.S. Pat. No. 2,448,828A), α-hydrocarbon-substituted aromatic acyloin compounds (the specification of U.S. Pat. No. 2,722,512A), polynuclear quinone compounds (each of the specifications of U.S. Pat. Nos. 3,046,127A and 2,951,758A), combinations of triarylimidazole dimers and p-aminophenyl ketones (the specification of U.S. Pat. No. 3,549,367A), acridine and phenazine compounds (JP1985-105667A (JP-S60-105667A) and the specification of U.S. Pat. No. 4,239,850A), oxadiazole compounds (the specification of U.S. Pat. No. 4,212,970A), and acylphosphine oxide compounds (JP1988-040799B (JP-S63-040799B), JP1993-029234B (JP-H05-029234B), JP1998-095788A (JP-H10-095788A), and JP1998-029997A (JP-H10-029997A)).

A commercially available product can also be used as such a photopolymerization. initiator, and examples thereof include IRGACURE184, IRGACURE907, IRGACURE369, IRGACURE651, IRGACURE819, and IRGACURE OXE-01, which are manufactured by BASF SE.

In a case where the liquid crystal composition contains the polymerization initiator, a content of the polymerization initiator is preferably 0.01 to 30 parts by mass and more preferably 0.1 to 15 parts by mass with respect to 100 parts by mass of the total amount of the dichroic coloring agent compound and the liquid crystalline compound in the liquid crystal composition. In a case where the content of the polymerization initiator is 0.01 parts by mass or more, the curability of the light-absorbing anisotropic film is improved, and in a case where the content of the polymerization initiator is 30 parts by mass or less, the alignment of the light-absorbing anisotropic film is improved.

<Solvent>

The liquid crystal composition used for forming the light-absorbing anisotropic film according to the embodiment of the present invention preferably contains a solvent from the viewpoint of workability or the like.

Examples of the solvent include organic solvents such as ketones (for example acetone, 2-butanone, methyl isobutyl ketone, cyclopentanone, and cyclohexanone), ethers (for example, dioxane and tetrahydrofuran), aliphatic hydrocarbons (for example, hexane), alicyclic hydrocarbons (for example, cyclohexane), aromatic hydrocarbons (for example, benzene, toluene, xylene, and trimethylbenzene), halocarbons (for example, dichloromethane, trichloromethane, dichloroethane, dichlorobenzene, and chlorotoluene), esters (for example, methyl acetate, ethyl acetate, and butyl acetate), alcohols (for example, ethanol, isopropanol, butanol, and cyclohexanol), cellosolves (for example, methyl cellosolve, ethyl cellosolve, and 1,2-dimethoxyethane), cellosolve acetates, sulfoxides (for example, dimethyl sulfoxide), amides (for example, dimethylformamide and dimethylacetamide), and heterocyclic compounds (for example, pyridine), and water. These solvents may be used alone or in combination of two or more kinds thereof.

Among these solvents, the organic solvents are preferably used, and the halocarbons or the ketones are more preferably used.

In a case where the liquid crystal composition contains the solvent, a content of the solvent is preferably 80% to 99% by mass, more preferably 83% to 97% by mass, and still more preferably 85% to 95% by mass with respect to the total mass of the liquid crystal composition.

<Other Components>

The liquid crystal composition used for forming the light-absorbing anisotropic film according to the embodiment of the present invention may further contain a dichroic coloring agent compound other than the specific dichroic coloring agent compound, or a plurality of the specific dichroic coloring agent compounds. In a case where a plurality of dichroic coloring agent compounds are contained, from the viewpoint that the liquid crystal composition is further cured, it is preferable that a dichroic coloring agent compound having a crosslinkable group which crosslinks with the specific dichroic coloring agent compound is contained and more preferable that the plurality of the specific dichroic coloring agent compounds are contained.

<Formation Method>

A method for forming a light-absorbing anisotropic film using the above-described liquid crystal composition is not particularly limited, and examples thereof include a method including a step (hereinafter, also referred to as a "coating film formation step") of applying the liquid crystal composition onto a transparent support to form a coating film and a step (hereinafter, also referred to as an "alignment step") of aligning liquid crystalline components contained in the coating film, in this order.

Furthermore, the liquid crystalline component is a component containing not only the above-described liquid crystalline compound but also the dichroic coloring agent compound having liquid crystallinity in a case where the above-described dichroic coloring agent compound has liquid crystallinity.

(Coating Film Formation Step)

The coating film formation step is a step of applying a liquid crystal composition on a transparent support to form a coating film.

By using a liquid crystal composition containing the above-described solvent or using a liquid material such as a molten liquid obtained by heating or the like of a liquid crystal composition, the liquid crystal composition can be easily applied onto the transparent support.

Specific examples of a method for applying the liquid crystal composition include known methods such as a roll coating method, a gravure printing method, a spin coating method, a wire bar coating method, an extrusion coating method, a direct gravure coating method, a reverse gravure coating method, a die-coating method, a spray method, and an ink jet method.

Furthermore, in the present aspect, an example in which the liquid crystal composition is applied onto the transparent support is shown, but the present invention is not limited to the example, and for example, the liquid crystal composition may be applied onto an alignment layer provided on the transparent support. Details of the alignment layer will be described later.

(Alignment Step)

The alignment step is a step of aligning liquid crystalline components contained in the coating film. Thereby, a light-absorbing anisotropic film is obtained.

The alignment step may include a drying treatment. Components such as a solvent can be removed from the coating film by the drying treatment. The drying treatment may be performed by a method (for example, natural drying) of leaving the coating film at room temperature for a predetermined time or a method of heating and/or blowing.

Here, the liquid crystalline components contained in the liquid crystal composition may be aligned by the above-described coating film formation step or drying treatment. For example, in an aspect in which the liquid crystal composition is prepared as a coating liquid containing a solvent, by drying the coating film and removing the solvent from the coating film, a coating film (that is, tight-absorbing anisotropic film) having a light absorption anisotropy is obtained.

In a case where the drying treatment is performed at a temperature equal to or higher than a transition temperature of the liquid crystalline component contained in the coating film to a liquid crystal phase, a heating treatment described later may not be performed.

The transition temperature of the liquid crystalline component contained in the coating film to a liquid crystal phase is preferably 10° C. to 250° C. and more preferably 25° C. to 190° C. from the viewpoint of manufacturing suitability or the like. In a case where the transition temperature is 10° C. or higher, a cooling treatment or the like for lowering the temperature to a temperature range in which a liquid crystal phase is exhibited is not required, which is preferable. Moreover, in a case where the transition temperature is 250° C. or lower, a high temperature is not required even in a case of once reaching an isotropic liquid state having a temperature higher than the temperature range in which a liquid crystal phase is exhibited and waste of heat energy and deformation and deterioration of a substrate can be reduced, which is preferable.

The alignment step preferably includes a heating treatment. Thereby, the liquid crystalline components contained in the coating film can be aligned, and thus the coating film after the heating treatment can be suitably used as a light-absorbing anisotropic film.

The heating treatment is preferably 10° C. to 250° C. and more preferably 25° C. to 190° C. from the viewpoint of manufacturing suitability or the like. Moreover, a heating time is preferably 1 to 300 seconds and more preferably 1 to 60 seconds.

The alignment step may include a cooling treatment performed after the heating treatment. The cooling treatment is a treatment for cooling the heated coating film to about room temperature (20° C. to 25° C.). Thereby, the alignment of the liquid crystalline components contained in the coating film can be fixed. A cooling method is not particularly limited, and can be performed by a known method.

Through the above steps, a light-absorbing anisotropic film can be obtained.

Furthermore, in the present aspect, as a method of aligning the liquid crystalline components contained in the coating film, a drying treatment and a heating treatment are mentioned, but the method is not limited to the treatments and can be performed by a known alignment treatment.

(Other Steps)

The method for manufacturing the light-absorbing anisotropic film may include a step (hereinafter, also referred to as a "curing step") of curing the light-absorbing anisotropic film, after the alignment step.

In a case where the light-absorbing anisotropic film has a crosslinkable group (polymerizable group), the curing step is performed, for example, by heating and/or light irradiation (exposure). Among these, the curing step is preferably performed by light irradiation.

As a light source used for curing, various light sources such as an infrared ray, visible light, and an ultraviolet ray can be used, but an ultraviolet ray is preferable. Moreover, at the time of curing, ultraviolet rays may be radiated while heating, or ultraviolet rays may be radiated through a filter which transmits only a specific wavelength.

In a case where exposure is performed while heating, a heating temperature at the time of exposure depends on the transition temperature of the liquid crystalline component contained in the light-absorbing anisotropic film to a liquid crystal phase, but is preferably 25° C. to 140° C.

Furthermore, the exposure may be performed under a nitrogen atmosphere. In a case where curing of the light-absorbing anisotropic film proceeds by radical polymerization, inhibition of polymerization due to oxygen is reduced, and thus the exposure is preferably performed under a nitrogen atmosphere.

In the present invention, a thickness of the light-absorbing anisotropic film is not particularly limited, but is preferably 0.1 to 5.0 μm and more preferably 0.3 to 1.5 μm.

[Optical Laminate]

The optical laminate according to the embodiment of the present invention is an optical laminate which includes the above-described light-absorbing anisotropic film according to the embodiment of the present invention and an alignment layer (particularly, a photo-alignment layer) and in which the light-absorbing anisotropic film is formed on the alignment layer.

Furthermore, the optical laminate according to the embodiment of the present invention may include a transparent support, an oxygen shielding layer, and a λ/4 plate.

Here, "transparent" in the present invention indicates that a transmittance of visible light is 60% or more, preferably 80% or more, and particularly preferably 90% or more.

Figure 1B:
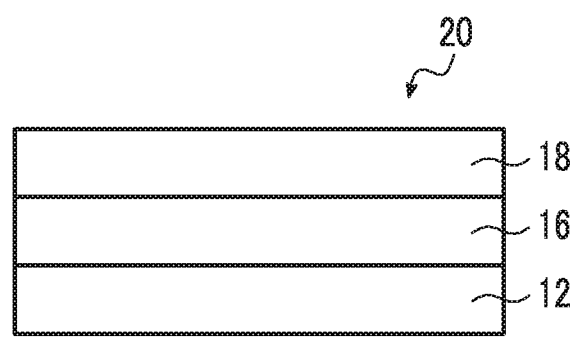
FIG. 1B is a schematic cross-sectional view showing another example of the optical laminate according to the embodiment of the present invention.

FIGS. 1A and 1B are schematic cross-sectional views showing an example of the optical laminate according to the embodiment of the present invention.

Here, an optical laminate 10 shown in FIG. 1A is an optical laminate having a layer configuration (hereinafter, also simply referred to as a "configuration A") including a transparent support 12, an oxygen shielding layer 14, a photo-alignment layer 16, and a light-absorbing anisotropic film 18 in this order.

Moreover, an optical laminate 20 shown in FIG. 1B is an optical laminate having a layer configuration (hereinafter, also simply referred to as a "configuration B") including the transparent support 12, the photo-alignment layer 16, and the light-absorbing anisotropic film 18 in this order.

[Alignment Layer]

In the present invention, the alignment layer is preferably provided below the above-described light-absorbing anisotropic film according to the embodiment of the present invention.

The alignment layer may be any layer as long as the dichroic azo coloring agent compound contained in the liquid crystal composition can be brought into a desired alignment state on the alignment layer.

In addition, the alignment layer can be provided by a method such as a rubbing treatment of an organic compound (preferably a polymer) on a film surface, oblique vapor deposition of an inorganic compound, formation of a layer having microgrooves, and accumulation of an organic compound (for example, ω-tricosanoic acid, dioctadecyl methylammonium chloride, and methyl stearate) by a Langmuir-Blodgett method (LB film). Moreover, an alignment layer in which an alignment function is generated by application of an electric field, application of a magnetic field, or light irradiation is also known.

Among these, from the viewpoint of easy control of a pretilt angle of the alignment layer, an alignment layer formed by a rubbing treatment is preferable, and from the viewpoint of uniformity of alignment, a photo-alignment layer formed by light irradiation is more preferable.

<Rubbing-Treated Alignment Layer>

Polymer materials used for the alignment layer formed by the rubbing treatment are described in many documents, and a large number of commercially available products can be acquired. In the present invention, polyvinyl alcohol or polyimide, and derivatives thereof are preferably used. Regarding the alignment layer, reference can be made to the descriptions on page 43, line 24 to page 49, line 8 of WO2001/088574A1. A thickness of the alignment layer is preferably 0.01 to 10 μm and more preferably 0.01 to 1 μm.

<Photo-Alignment Layer>

In the present invention, from the viewpoint of improvement in the degree of alignment of the dichroic azo coloring agent compound, a photo-alignment layer containing a photoactive compound is preferably utilized.

The photo-alignment layer refers to an alignment layer to which alignment regulating force is imparted by applying a composition (hereinafter, sometimes referred to as a "composition for forming a photo-alignment layer") containing a compound having a photoreactive group and a solvent to a substrate and performing irradiation with polarized light (preferably polarized ultraviolet rays (UV)).

The photoreactive group refers to a group generating a liquid crystal alignment capability by irradiation with light. Specifically, the photoreactive group causes alignment induction of molecules (called a photoactive compound) generated by irradiation with light, or a photoreaction which is an origin of a liquid crystal alignment capability, such as an isomerization reaction, a dimerization reaction, a photocrosslinking reaction, or a photodegradation reaction.

The photoreactive group preferably has an unsaturated bond, particularly a double bond, and a group having at least one bond selected from the group consisting of a carbon-carbon double bond (C=C bond), a carbon-nitrogen double bond (C=N bond), a nitrogen-nitrogen double bond (N=N bond), and a carbon-oxygen double bond (C=O bond) is more preferable.

Examples of the photoreactive group having a C=C bond include a vinyl group, a polyene group, a stilbene group, a stilbazole group, a stilbazolium group, a chalcone group, and a cinnamoyl group.

Examples of the photoreactive group having a C=N bond include a group having a structure of an aromatic Schiff's base, an aromatic hydrazone, or the like.

Examples of the photoreactive group having a C=O bond include a benzophenone group, a coumarine group, an anthraquinone group, and a maleimide group.

Examples of the photoreactive group having an N=N bond include an azobenzene group, an azonaphthalene group, an aromatic heterocyclic azo group, a bisazo group, a formazan group, and a group having azoxybenzene as a basic structure.

These groups may have a substituent such as an alkyl group, an alkoxy group, an aryl group, an allyloxy group, a cyano group, an alkoxycarbonyl group, a hydroxyl group, a sulfonic acid group, and a halogenated alkyl group.

Among these groups, a cinnamoyl group or an azobenzene group is preferable since a polarization irradiation amount required for photo-alignment is relatively small and a photo-alignment layer having excellent heat stability or temporal stability is easily obtained. Specific compounds are described in paragraphs [0211] to [0263] of JP5300776B, and are preferably used.

The photoactive compound having an azobenzene group is particularly preferably a photoactive compound represented by General Formula (1).

General Formula (I)

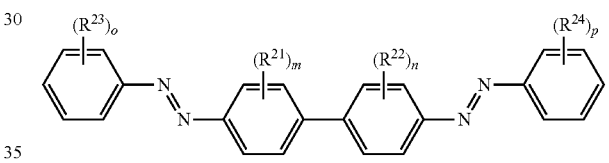

In the formula, $R^{21}$ to $R^{24}$ each independently represent a hydrogen atom or a substituent, provided that at least one of the groups represented by $R^{21}$ to $R^{24}$ represents a carboxyl group or a sulfo group; and m represents an integer of 1 to 4, n represents an integer of 1 to 4, o represents an integer of 1 to 5, p represents an integer of 1 to 5, but in a case where m, n, o, and p represent an integer of 2 or more, a plurality of $R^{21}$'s to $R^{24}$'s may be the same as or different from each other, respectively.

Specific examples of the compound represented by General Formula (1) are shown below, but the compound is not limited to the following specific examples.

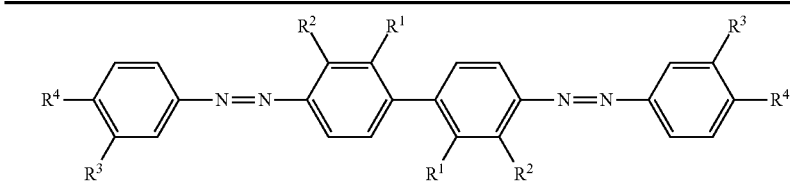

| No. | $R^1$ | $R^2$ | $R^3$ | $R^4$ |
|-----|-------|-------|-------|-------|
| E-1 | —SO$_2$Na | —H | —COOH | —OH |
| E-2 | —H | —SO$_3$Na | —COOH | —OH |
| E-3 | —SO$_3$Na | —H | —COONa | —OH |
| E-4 | —H | —SO$_3$Na | —COONa | —OH |
| E-5 | —CH$_3$ | —H | —COONa | —OH |
| E-6 | —H | —CH$_3$ | —COONa | —OH |
| E-7 | —H | —OCH$_3$ | —COONa | —OH |
| E-8 | —H | —OCF$_3$ | —COONa | —OH |
| E-9 | —H | —Cl | —COONa | —OH |

-continued

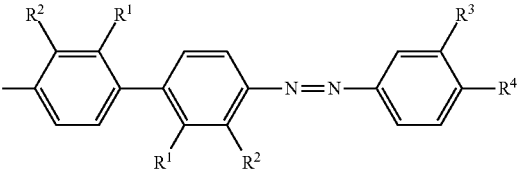

| No. | R¹ | R² | R³ | R⁴ |
|---|---|---|---|---|
| E-10 | —H | —CN | —COONa | —OH |
| E-11 | —H | —NO₂ | —COONa | —OH |
| E-12 | —COOCH₃ | —H | —COONa | —OH |
| E-13 | —CONH₂ | —H | —COONa | —OH |
| E-14 | —SO₂NH₂ | —H | —COONa | —OH |
| E-15 | —SO₃Na | —H | —COONa | —OH |
| E-16 | —SO₃Na | —H | —CH₂OH | —OH |
| E-17 | —H | —SO₂Na | —CH₂OH | —OH |
| E-18 | —SO₂Na | —H | —COOH | 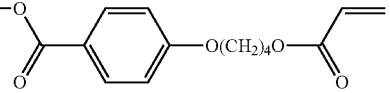 |
| E-19 | —H | —SO₃Na | —COOH | 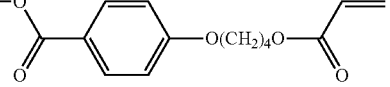 |
| E-20 | —CH₃ | —H | —COONa | 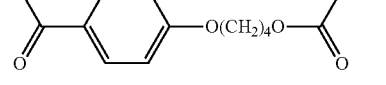 |
| E-21 | —H | —CH₃ | —COONa | 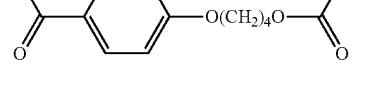 |
| E-22 | —SO₃Na | —H | —CF₃ | 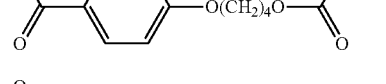 |
| 5-23 | —H | —SO₃Na | —CF₃ |  |
| E-24 | —SO₃Na | —H | —COOH |  |
| E-25 | —CH₃ | —H | —COONa |  |
| E-26 | —SO₃Na | —H | —CF₃ | 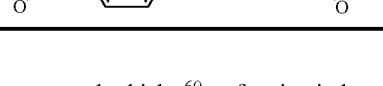 |

Among these, a low-molecular-weight compound which is represented by each of E-1 to E-17 and does not have a polymerizable group is preferable from the viewpoint of an excellent degree of alignment.

The alignment layer is preferably an alignment layer having an average refractive index at a wavelength of 550 nm of 1.55 to 1.8. From the viewpoint that antireflection performance is further improved, in order to reduce a refractive index difference from a light-absorbing anisotropic film, the average refractive index at a wavelength of 550 nm is more preferably 1.55 to 1.7.

In the alignment layer, an in-plane refractive index anisotropy Δn at a wavelength of 550 nm is preferably 0.05 to 0.45. The in-plane refractive index anisotropy Δn is more preferably 0.1 to 0.4 and still more preferably 0.1 to 0.3.

By appropriately controlling the refractive index anisotropy of the alignment layer, an antireflection function can be further improved.

A thickness of the alignment layer is preferably in a range of 10 nm to 10,000 nm, more preferably in a range of 10 nm to 1,000 nm, and still more preferably in a range of 10 to 300 nm. By appropriately controlling the thickness of the alignment layer, interference is utilized and the antireflection performance can be further enhanced.

The composition for forming a photo-alignment layer may contain one or more kinds of other additives in addition to the photoactive compound. For example, the additive is added for the purpose of adjustment of a refractive index of the composition for forming a photo-alignment layer.

From the viewpoint of compatibility with the photoactive compound, the additive is preferably a compound having a hydrophilic group and a (meth)acryloyloxy group, and can be added to an extent such that an alignment capability is not remarkably lowered. Examples of the hydrophilic group include a hydroxyl group, a carboxyl group, a sulfo group, and an amino group.

In a case where the additive is used for the purpose of adjustment of the refractive index of the composition for forming a photo-alignment layer, a refractive index of the additive is preferably 1.4 to 1.6 and more preferably 1.4 to 1.55.

As a method of applying the composition for forming a photo-alignment layer onto the substrate, a known method including a coating method such as a spin coating method, an extrusion method, a gravure coating method, a die-coating method, a bar coating method, and an applicator method, or a printing method such as a flexographic method is employed. Furthermore, in a ease where the manufacturing of the polarizer is performed by a continuous manufacturing method in a roll-to-roll mode, as an application method, the gravure coating method, the die-coating method, or the printing method such as the flexographic method is usually employed.

The photo-alignment layer formed of the materials is irradiated with a linearly polarized light or non-polarized light to manufacture a photo-alignment layer.

In the present specification, "irradiation with linearly polarized light" and "irradiation with non-polarized light" are operations for causing a photoreaction to occur in a photo-alignment material. A wavelength of the light to be used depends on the photo-alignment material to be used, and is not particularly limited as long as the wavelength is a wavelength necessary for the photoreaction. A peak wavelength of light used for light irradiation is preferably 200 nm to 700 nm, and ultraviolet light having a peak wavelength of light of 400 nm or less is more preferable.

As a light source used for light irradiation, a generally used light source can be used, for example, a lamp such as a tungsten lamp, a halogen lamp, a xenon lamp, a xenon flash lamp, a mercury lamp, a mercury xenon lamp, and a carbon arc lamp, various lasers [for example, a semiconductor laser, a helium neon laser, an argon ion laser, a helium cadmium laser, and an yttrium-aluminum-garnet (YAG) laser], a light emitting diode, and a cathode ray tube can be exemplified.

As a method for obtaining linearly polarized light, a method using a polarizing plate (for example, an iodine polarizing plate, a two-color coloring agent polarizing plate, and a wire grid polarizing plate), a method using a prism-based element (for example, a Glan-Thompson prism) or a reflective-type polarizer utilizing Brewster's angle, or a method using light emitted from a laser light source having polarized light can be employed. Moreover, only light having a required wavelength may be selectively radiated using a filter, a wavelength conversion element, or the like.

In a case where the light to be radiated is linearly polarized light, a method of irradiating an alignment layer with light from an upper surface or a back surface and irradiating a surface of the alignment layer with light perpendicularly or obliquely is employed, An incidence angle of the light varies depending on the photo-alignment material, but is preferably 0° to 90° (perpendicular) and more preferably 40° to 90°.

In a case of non-polarized light, the alignment layer is irradiated with non-polarized light obliquely. An incidence angle thereof is preferably 10° to 80°, more preferably 20° to 60°, and still more preferably 30° to 50°.

An irradiation time is preferably 1 minute to 60 minutes and more preferably 1 minute to 10 minutes.

In a case where patterning is necessary, a method of performing light irradiation using a photo mask as many times as necessary for pattern production or a method of writing a pattern by laser light scanning can be employed.

[Oxygen Shielding Layer]

The optical laminate according to the embodiment of the present invention may include an oxygen shielding layer on a side of the photo-alignment layer opposite to the light-absorbing anisotropic film and a side of the light-absorbing anisotropic film opposite to the photo-alignment layer, for the purpose of improving light resistance.

In particular, in a case of a smartphone with a glass surface, the glass also has an oxygen shielding function, but in order to realize flexibility, it is necessary to replace surface glass and a glass substrate with a resin and an oxygen shielding function is required. For example, in a case where glass is not used on a front side of a television (TV) or the like and a glass substrate is used, it is possible to provide an oxygen shielding layer only on the front side.

The "oxygen shielding layer" is an oxygen shielding film having an oxygen shielding function, and specific examples thereof include a layer containing an organic compound such as polyvinyl alcohol, polyethylene vinyl alcohol, polyvinyl ether, polyvinyl pyrrolidone, polyacrylamide, polyacrylic acid, cellulose ether, polyamide, polyimide, a styrene-maleic acid copolymer, gelatin, vinylidene chloride, and cellulose nanofiber.

Furthermore, the oxygen shielding function in the present specification is not limited to a state where oxygen is not passed at all, but also includes a state where oxygen is slightly passed depending on desired performance.

For example, it is also preferable that the oxygen shielding function is imparted to other functional layers such as the alignment layer or a surface film and the functions are integrated. In a case where the oxygen shielding layer is provided on the transparent support and the photo-alignment layer having the azobenzene compound represented by General Formula (1) is provided thereon, from the viewpoint that the alignment properties are enhanced, polyvinyl alcohol having a degree of saponification of 95 mol % or more or modified polyvinyl alcohol having a degree of saponification of 95 mol % or more is preferably used for the oxygen shielding layer.

In addition, a thin layer (thin metal compound layer) consisting of a metal compound is also exemplified. As a method for forming the thin metal compound layer, any method can be used as long as a desired thin layer can be formed by the method. For example, a sputtering method, a vacuum deposition method, an ion plating method, and a plasma chemical vapor deposition (CVD) method are suitable, and specifically, the formation methods described in JP3400324B, JP2002-322561A, and JP2002-361774A can be employed.

A component contained in the thin metal compound layer is not particularly limited as long as the component exhibits the oxygen shielding function, and for example, an oxide, a nitride, an oxynitride, or the like containing one or more kinds of metals selected from Si, Al, In, Sn, Zn, Ti, Cu, Ce, and Ta can be used. Among these, an oxide, a nitride, or an oxynitride of a metal selected from Si, Al, In, Sn, Zn, and Ti is preferable, and an oxide, a nitride, or an oxynitride of a metal selected from Si, Al, Sn, and Ti is particularly preferable. The oxide, the nitride, or the oxynitride may contain other elements as secondary components. A layer consisting of a reaction product of an aluminum compound and a phosphorus compound as described in JP2016-155255A is also preferable.

In addition, the oxygen shielding layer may be in a form in which a layer containing the organic material and the thin metal compound layer are laminated, for example, as described in U.S. Pat. No. 6,413,645B, JP2015-226995A, JP2013-202971A, JP2003-335880A, JP1978-012953B (JP-S53-012953B), and JP1983-217344A (JP-S58-217344A), or may be a layer in which an organic compound and an inorganic compound are hybridized, as described in WO2011/011836A, JP2013-248832A, and JP3855004B.

In a case where the optical laminate according to the embodiment of the present invention includes a λ/4 plate described later and the λ/4 plate is a phase difference film in which an optically anisotropic layer having a λ/4 function is provided on a support, the oxygen shielding layer may also serve as an alignment layer of the optically anisotropic layer having a λ/4 function. In such a case, an oxygen shielding layer containing polyvinyl alcohol, polyamide, or polyimide is preferable.

In a case of the layer containing the organic compound, a film thickness of the oxygen shielding layer is preferably 0.1 to 10 μm and more preferably 0.5 to 5.5 μm. In a case of the thin metal compound layer, the film thickness of the oxygen shielding layer is preferably 5 nm to 500 nm and more preferably 10 nm to 200 nm.

[Adhesive Layer]

Any appropriate adhesive layer or a pressure sensitive adhesive layer described later can be used for lamination of respective layers constituting the optical laminate according to the embodiment of the present invention As an adhesive constituting the adhesive layer, any appropriate form of the adhesive can be employed. Specific examples thereof include an aqueous adhesive, a solvent-type adhesive, an emulsion-based adhesive, a solventless-type adhesive, an active energy ray curing-type adhesive, and a thermosetting-type adhesive. Examples of the active energy ray curing-type adhesive include an electron beam curing-type adhesive, an ultraviolet ray curing-type adhesive, and a visible ray curing-type adhesive. An aqueous adhesive and an active energy ray curing-type adhesive can be suitably used. Specific examples of the aqueous adhesive include an isocyanate-based adhesive, a polyvinyl alcohol-based adhesive (PVA-based adhesive), a gelatin-based adhesive, vinyl-based latex, aqueous polyurethane, and aqueous polyester. Specific examples of the active energy ray curing-type adhesive include a (meth)acrylate-based adhesive. Moreover, the (meth)acrylate means acrylate and/or methacrylate. Examples of a curable component in the (meth) acrylate-based adhesive include a compound having a (meth)acryloyl group and a compound having a vinyl group. Furthermore, a compound having an epoxy group or an oxetanyl group can also be used as a cationic polymerization curing-type, adhesive. The compound having an epoxy group is not particularly limited as long as the compound has at least two epoxy groups in a molecule, and various curable epoxy compounds generally known can be used. Preferred examples of the epoxy compound include a compound (aromatic epoxy compound) having at least two epoxy groups and at least one aromatic ring in the molecule and a compound (alicyclic epoxy compound) having at least two epoxy groups in the molecule, at least one of which is formed between two adjacent carbon atoms constituting an alicyclic ring.

In one embodiment, a PVA-based adhesive is used as the adhesive constituting the adhesive layer. By using the PVA-based adhesive, even in a case where materials which do not transmit active energy rays are used, the materials can be adhered to each other. In another embodiment, an active energy ray curing-type adhesive is used as the adhesive constituting the adhesive layer. In a case where the active energy ray curing-type adhesive is used, sufficient interlayer peeling force can be obtained even with materials whose surfaces are hydrophobic and which are adhered to each other with a PVA-based adhesive.

A storage elastic modulus of the adhesive layer is preferably $1.0 \times 10^6$ Pa or more and more preferably $1.0 \times 10^7$ Pa or more in a region of 70° C. or lower. The upper limit of the storage elastic modulus of the adhesive layer is, for example, $1.0 \times 10^{10}$ Pa.

Typically, a thickness of the adhesive layer is preferably 0.01 μm to 7 μm and more preferably 0.01 μm to 5 μm.

In the active energy ray curing-type adhesive, selection of an initiator and a photosensitizer is also important, and as a specific example, the (meth)acrylate-based adhesive is described in Examples of JP2018-017996A and the cationic polymerization curing-type adhesive can be produced with reference to the descriptions in JP2018-035361A and JP2018-041079A.

In the circularly polarizing plate which is one aspect of the present invention, suppression of internal reflection is important, and it is also preferable that index matching is performed with an adhesive layer. For example, in JP2018-017996A, specific examples of an adhesive having a refractive index of 1.52 to 1.64 are described.

[Pressure Sensitive Adhesive Layer]

The optical laminate according to the embodiment of the present invention may include a pressure sensitive adhesive layer on the side of the above-described oxygen shielding layer opposite to the light-absorbing anisotropic film side, from the viewpoint of adhering other functional layers (for example, a λ/4 plate described later).

Examples of a pressure sensitive adhesive contained in the pressure sensitive adhesive layer include a rubber-based pressure sensitive adhesive, an acrylic pressure sensitive adhesive, a silicone-based pressure sensitive adhesive, a urethane-based pressure sensitive adhesive, a vinylalkyl ether-based pressure sensitive adhesive, a polyvinyl alcohol-based pressure sensitive adhesive, a polyvinylpyrrolidone-based pressure sensitive adhesive, a polyacrylamide-based pressure sensitive adhesive, and a cellulose-based pressure sensitive adhesive.

Among these, from the viewpoint of transparency, weather fastness, and heat resistance, an acrylic pressure sensitive adhesive (pressure-sensitive adhesive) is preferable.

The acrylic pressure sensitive adhesive is preferably a copolymer of (meth)acrylate (hereinafter, acrylate and methacrylate may be collectively referred to as "(meth)acrylate and acrylic acid and methacrylic acid may be collectively referred to as "(meth)acrylic acid") in which an alkyl group in an ester portion is an alkyl group having 20 or less carbon atoms, such as a methyl group, an ethyl group, and a butyl group and a (meth)acrylic monomer having a functional group such as (meth)acrylic acid and hydroxyethyl (meth) acrylate.

The pressure sensitive adhesive containing such a copolymer has excellent pressure sensitive adhesive properties, and can be relatively easily peeled without causing adhesive residues or the like on the display device even in a case of being adhered to a display device and then being peeled off, and thus the pressure sensitive adhesive is preferable. A glass transition temperature of the acrylic polymer is preferably 25° C. or lower and more preferably 0° C. or lower. A weight-average molecular weight of such an acrylic polymer is preferably 100,000 or more.

In addition, the pressure sensitive adhesive may contain a light diffusing agent. The light diffusing agent is for imparting light diffusing properties to the pressure sensitive adhesive layer and may be fine particles having a refractive index different from that of the polymer contained in the pressure sensitive adhesive layer, and examples of the light diffusing agent include fine particles consisting of an inorganic compound and fine particles consisting of an organic compound (polymer). Since a base polymer constituting the pressure sensitive adhesive layer, including an acrylic polymer, exhibits a refractive index of about 1.4, the light diffusing agent may be appropriately selected from light diffusing agents having a refractive index of about 1 to 2. A refractive index difference between the light diffusing agent and a polymer which is contained as an active component in the pressure sensitive adhesive is usually 0.01 or less, and from the viewpoint of brightness and visibility of a liquid crystal display device, is suitably 0.01 to 0.5. The fine particles used as the light diffusing agent preferably have a spherical shape, which is also close to monodisperse, and for example, fine particles having an average particle diameter in a range of about 2 to 6 μm are suitably used.

The refractive index is measured by a general minimum deviation method or an Abbe refractometer. Examples of the fine particles consisting of an inorganic compound include aluminum oxide (refractive index of 1.76) and silicon oxide (refractive index of 1.45).

In addition, examples of the fine particles consisting of an organic compound (polymer) include melamine heads (refractive index of 1.57), polymethyl methacrylate beads (refractive index of 1.49), methyl methacrylate-styrene copolymer resin beads (refractive index of 1,50 to 1.59), polycarbonate beads (refractive index of 1.55), polyethylene beads (refractive index of 1.53), polystyrene beads (refractive index of 1.6), polyvinyl chloride beads (refractive index of 1.46), and silicone resin beads (refractive index of 1.46).

An amount of the light diffusing agent formulated is appropriately determined in consideration of a haze value required for the pressure sensitive adhesive layer in which the light diffusing agent is dispersed or brightness of a display device to which the light diffusing agent is applied, but is generally about 3 to 30 parts by weight with respect to 100 parts by weight of the resin constituting the pressure sensitive adhesive layer.

From the viewpoint that blurring or blurriness of a display image is less likely to occur while securing brightness of a display device to which a circularly polarizing plate comprising the pressure sensitive adhesive layer is applied, the haze value of the pressure sensitive adhesive layer in which the light diffusing agent is dispersed is preferably in a range of 20% to 80%. The haze value is a value represented by (diffuse transmittance/total light transmittance)×100(%), and is measured according to JIS K 7105.

The pressure sensitive adhesive layer can be formed, for example, by a method in which a solution of the pressure sensitive adhesive is applied onto a release sheet and dried and then the resultant is transferred to a surface of a transparent resin layer; a method in which a solution of the pressure sensitive adhesive is directly applied onto a surface of a transparent resin layer and dried; or the like.

For example, the solution of the pressure sensitive adhesive is prepared as a solution of about 10% to 40% by mass in which the pressure sensitive adhesive is dissolved or dispersed in a solvent such as toluene or ethyl acetate.

As a coating method, a roll coating method such as reverse coating and gravure coating, a spin coating method, a screen coating method, a fountain coating method, a dipping method, and a spray method can be employed.

A primer layer may be provided between the polarizer or other functional layers and the pressure sensitive adhesive layer. The primer layer usually contains a transparent resin and is formed of a transparent resin solution. The primer layer can suppress defects of the polarizer or other functional layers in a case where the pressure sensitive adhesive layer is formed. As the transparent resin, a resin having excellent coating properties and having excellent transparency and adhesiveness after formation of the primer layer is preferable.

As a solvent of the transparent resin solution, a general organic solvent, for example, aromatic hydrocarbon solvents such as benzene, toluene, and xylene; ketone solvents such as acetone, methyl ethyl ketone, and methyl isobutyl ketone; ester solvents such as ethyl acetate and isobutyl acetate; chlorinated hydrocarbon solvents such as methylene chloride, trichloroethylene, and chloroform; and alcohol solvents such as ethanol, 1-propanol, 2-propanol, and 1-butanol can be used, depending on the solubility of transparent resin, but in a case where the primer layer is formed using a transparent resin solution containing an organic solvent, optical characteristics of a liquid crystal cured film may be affected. Therefore, it is preferable that the primer layer is formed of a solution using water as a solvent.

Examples of the transparent resin include an epoxy resin. The epoxy resin may be a one-liquid curing type or a two-liquid curing type. A water-soluble epoxy resin is particularly preferable. Examples of the water-soluble epoxy resin include a polyamido epoxy resin obtained by reacting epichlorohydrin with polyamido polyamine which is obtained by reacting a polyalkylene polyamine such as diethylene triamine or triethylene tetramine with a dicarboxylic acid such as adipic acid. Examples of a commercially available product of such a polyamido epoxy resin include SUMIREZ RESIN (registered trademark) 650(30) and SUMIREZ RESIN (registered trademark) 675 sold by Sumika Chemtex Co., Ltd.

In a case where a water-soluble epoxy resin is used as the transparent resin, in order to further improve coatability, another water-soluble resin such as a polyvinyl alcohol-based resin is preferably used in combination. The polyvinyl alcohol-based resin may be a modified polyvinyl alcohol-based resin such as partially saponified polyvinyl alcohol, completely saponified polyvinyl alcohol, carboxyl group-modified polyvinyl alcohol, acetoacetyl group-modified polyvinyl alcohol, methylol group-modified polyvinyl alcohol, and amino group-modified polyvinyl alcohol. Appropriate examples of a commercially available product of the polyvinyl alcohol-based resin include KL-318 (product name) which is anionic group-containing polyvinyl alcohol sold by KURARAY CO., LTD.

In a case where the primer layer is formed of a solution containing the water-soluble epoxy resin, an amount of the epoxy resin is preferably in a range of about 0.2 to 1.5 parts by weight with respect to 100 parts by weight of water. Moreover, in a case where the polyvinyl alcohol-based resin is formulated with the solution, an amount of the polyvinyl alcohol-based resin is preferably about 1 to 6 parts by weight with respect to 100 parts by weight of water. A thickness of the primer layer is preferably in a range of about 0.1 to 10 μm.

A method for forming the primer layer is not limited, and various known coating methods such as a direct gravure method, a reverse gravure method, a die-coating method, a comma coating method, and a bar coating method can be used.

The pressure sensitive adhesive layer can be formed by a method of applying a pressure sensitive adhesive to a surface of a phase difference layer, a polarizer, or a primer layer and drying the resultant, and also can be formed by a method of applying a pressure sensitive adhesive to a release-treated surface of a film subjected to a release treatment, drying the resultant to form a pressure sensitive adhesive layer, and then adhering a film with the pressure sensitive adhesive layer to a surface of a phase difference layer, a polarizer, or a primer layer so that a side of the pressure sensitive adhesive layer is an adhering surface. The surface of the primer layer on which the pressure sensitive adhesive layer is formed is preferably subjected to a corona discharge treatment in advance. Thereby, the adhesiveness between the primer layer and the pressure sensitive adhesive layer can be further improved.

In addition, examples of a constituent material of the release sheet include appropriate thin leaf-like materials, for example, a synthetic resin film such as polyethylene, polypropylene, and polyethylene terephthalate; a rubber sheet; paper; a fabric; a non-woven fabric; a net; a foam sheet; and a metal foil.

In the present invention, a thickness of any pressure sensitive adhesive layer is not particularly limited, but is preferably 3 μm to 50 μm, more preferably 4 μm to 40 μm, and still more preferably 5 μm to 30 μm.

A storage elastic modulus (G') of the pressure sensitive adhesive layer at 25° C. is preferably 0.01 MPa to 10.00 MPa, more preferably 0.05 MPa to 2.00 MPa, and still more preferably 0.05 MPa to 0.50 MPa. In a case where the storage elastic modulus of the pressure sensitive adhesive layer is within such a range, an optical laminate having extremely excellent bendability can be obtained. As a result, an organic EL display device which is bendable or foldable can be realized.

Examples of the method for producing the pressure sensitive adhesive include Example 1 of JP6123563B and Comparative Example 3 of JP2017-165941A. Moreover, as in Example 1 of JP2017-165941A, a coloring agent compound can be added to the pressure sensitive adhesive layer, and it is also possible to prevent deterioration of the organic EL and adjust the color tone of the light-emitting element. Furthermore, as in JP2016-105166A, it is also preferable that a barrier function against moisture or oxygen is imparted to the pressure sensitive adhesive.

JP6123563B describes a peeling strength of a circularly polarizing plate including a substrate, a first alignment layer, a polarizing layer, a second alignment layer, a phase difference layer, and a pressure sensitive adhesive layer in this order. An example of a design guide for a peeling strength is shown below.

A peeling strength between the pressure sensitive adhesive layer and the surface of the circularly polarizing plate is measured as follows.

A test piece of 25 mm width×about 200 mm length is cut from the circularly polarizing plate having a pressure sensitive adhesive layer on a surface, the pressure sensitive adhesive surface is adhered to a glass plate, then one end (one side having a width of 25 mm) of the test piece in a length direction is grabbed using a tensile tester, and a 90° peeling test is performed according to JIS K 6854-1:1999 "Adhesives-Determination of peel strength of bonded assemblies-Part 1:90° peel" under an atmosphere of a temperature of 23° C. and a relative humidity of 60%, at a crosshead speed (grab moving speed) of 200 mm/min.

In the circularly polarizing plate including a substrate, a first alignment layer, a polarizing layer, a second alignment layer, a phase difference layer, and a pressure sensitive adhesive layer in this order, a peeling strength (F1) between the substrate and the first alignment layer is preferably lower than a peeling strength (F2) between the first alignment layer and the polarizing layer, a peeling strength (F3) between the second alignment layer and the phase difference layer, or a peeling strength (F4) between the phase difference layer and the pressure sensitive adhesive layer. The peeling strength (F1) can be adjusted by the substrate and the first alignment layer.

For example, the substrate having a surface which contains a functional group forming a chemical bond with the alignment layer tends to have a higher peeling strength (F1) between the substrate and the first alignment layer. Therefore, as a substrate for lowering the peeling strength (F1), a substrate having a small number of functional groups on the surface is preferable, and a substrate which is not subjected to a surface treatment for forming a functional group on the surface is preferable.

In addition, the alignment layer having a functional group which forms a chemical bond with the substrate tends to have a higher peeling strength (F1) between the substrate and the first alignment layer. Therefore, as an alignment layer for lowering the peeling strength (F1), an alignment layer having a small number of functional groups which form a chemical bond with the substrate is preferable. Moreover, in order to lower peeling strength (F1), an alignment polymer composition or a composition for forming a photo-alignment layer preferably does not contain a reagent for cross-linking the substrate and the alignment layer, and preferably does not contain components, which dissolves the substrate, such as a solvent. By dissolving the substrate surface with the alignment polymer composition or the composition for forming a photo-alignment layer, the peeling strength (F1) between the substrate and the first alignment layer tends to be increased.

In order to increase the peeling strengths (F2), (F3), and (F4), a chemical bond may be formed between the first alignment layer and the polarizing layer, between the second alignment layer and the phase difference layer, and between the phase difference layer and the pressure sensitive adhesive layer.

By removing the substrate from the circularly polarizing plate having the pressure sensitive adhesive layer on the surface, a circularly polarizing film having the pressure sensitive adhesive layer can be obtained. Any method can be used as a method of removing the substrate.

[Optical Compensation Film]

An optical compensation film is suitably used for optical compensation application of a liquid crystal display device (LCD), and can suppress tint change in a case of being viewed from an oblique direction or light leakage during black display. For example, the optical compensation film can be provided between a polarizer and a liquid crystal cell of an IPS liquid crystal display device. In particular, in the optical compensation of the IPS liquid crystal, it is known that a remarkable effect can be obtained by using a laminate of a positive A-plate and a positive C-plate.

For example, by using the light-absorbing anisotropic film according to the embodiment of the present invention as a polarizer and laminating an optical compensation film thereon, the film can be used as a part of a polarizing plate.

In a case where the optical compensation film is configured with the positive A-plate and the positive C-plate, the optical compensation film may be laminated with the polarizer on a surface on the positive A-plate side, and may be laminated with the polarizer on a surface on an opposite side.

In a case where the optical film and the polarizer are laminated so that the polarizer, the positive A-plate, and the positive C-plate are provided in this order, an angle between a slow axis direction of the positive A-plate and an absorption axis direction of the polarizing film is preferably in a range of 90°±10°.

In a case where the optical film and the polarizing film are laminated so that the polarizer, the positive C-plate, and the positive A-plate are provided in this order, the slow axis direction of the positive A-plate is preferably parallel to the absorption axis direction of the polarizing film.

Regarding a method for producing the positive A-plate and the positive C-plate, as described in JP6243869B, by laminating films in which liquid crystals are aligned, a thin layer can be obtained. Needless to say, like a film obtained by stretching a polycarbonate resin as described in paragraphs [0055] to [0069] of JP2018-056069A, a film obtained by stretching a norbornene resin as described in JP2006-072309A, and a film obtained by stretching a polyarylate resin as described in JP4757347B, the positive A-plate and the positive C-plate can also be formed of resin.

Regarding the optical characteristics of the positive A-plate and the positive C-plate, particularly from the viewpoint that the tint change is suppressed, wavelength dispersion of Re or Rth preferably exhibits reverse dispersibility.

[Antireflection Plate]

The antireflection plate is configured by combining the light-absorbing anisotropic film according to the embodiment of the present invention as a polarizer with a λ/4 plate described below.

The λ/4 plate is a plate having a function of converting linearly polarized light having a specific wavelength to circularly polarized light (or converting circularly polarized light to linearly polarized light), is a plate (phase difference film) whose in-plane retardation Re(λ) at a specific wavelength of λnm satisfies Re(λ)=λ/4, and is preferably produced by adjusting Re of the positive A-plate to λ/4. In order to suppress the tint change in a case of being viewed from the oblique direction or the light leakage during black display, it is preferable to further combine the positive C-plate. At this time, the total Rth of the antireflection plate is preferably adjusted to be close to zero.

The antireflection plate is suitably used for antireflection application of image display devices such as a liquid crystal display device (LCD), a plasma display panel (PDP), an electroluminescent display (ELD), and a cathode ray tube display device (CRT), and can improve a contrast ratio of display light.

For example, the antireflection plate can be provided on a side of a light extraction surface of the organic EL display device. In this case, the external light becomes linearly polarized light by the polarizer, and then becomes circularly polarized light by passing through the phase difference plate. In a case where the light is reflected by a metal electrode or the like of the organic EL panel, the state of circular polarization is inverted, and in a case where the light passes through the phase difference plate again, the light becomes linearly polarized light which is inclined by 90° from the light at the time of incidence, reaches the polarizer, and is absorbed. As a result, an influence of external light can be suppressed.

The antireflection plate has an excellent antireflection capability for the external light, but has a disadvantage that brightness of image display is greatly reduced. As a brightness enhancing film, it is also preferable to use the cholesteric liquid crystal layer described in JP2017-068111A and JP4011292B in combination with the antireflection plate.

The antireflection plate can be manufactured, for example, by adhering the light-absorbing anisotropic film according to the embodiment of the present invention to the λ/4 positive A-plate and the positive C-plate with an adhesive or the like. In a case where the optical film is configured with the λ/4 positive A-plate and the positive C-plate, the optical film may be adhered to the polarizer on a surface on the positive C-plate side, and may be adhered to the polarizer on a surface on an opposite side.

Alternatively, the antireflection plate can be manufactured by directly forming the λ/4 positive A-plate and the positive C-plate on the polarizer. As described in Example 19 of JP6243869B, it is also preferable that the alignment layer is provided between the polarizer and the positive A-plate. Furthermore, as described in Example 1 of JP6243869B, a protective layer can also be provided between the polarizer and the positive A-plate. Alternatively, a method of forming the λ/4 positive A-plate and the positive C-plate and then forming the light-absorbing anisotropic film according to the embodiment of the present invention can also be used.

An angle between the slow axis direction of the positive A-plate of the antireflection plate and the absorption axis direction of the polarizing film is preferably in a range of 45°±10°. Regarding the optical characteristics of the positive A-plate and the positive C-plate, particularly from the viewpoint that the tint change is suppressed, wavelength dispersion of Re or Rth preferably exhibits reverse dispersibility.

In the manufacturing of the antireflection plate, for example, a step of continuously laminating the polarizer in a long state with the positive A-plate and the positive C-plate in a long state is preferably included. The long antireflection plate is cut according to a size of a screen of an image display device to be used.

[λ/4 Plate]

The optical laminate according to the embodiment of the present invention may include a λ/4 plate on the above-described side of the pressure sensitive adhesive layer opposite to the transparent resin layer side.

Here, the "λ/4 plate" is a plate having a λ/4 function, and specifically, is a plate having a function of converting linearly polarized light having a specific wavelength to circularly polarized light (or converting circularly polarized light to linearly polarized light).

Specific examples of the λ/4 plate include the plates described in US2015/0277006A.

Specific examples of an aspect in which the λ/4 plate has a single-layered structure include a stretched polymer film and a phase difference film in which an optically anisotropic layer having a λ/4 function is provided on a support, and specific examples of an aspect in which the λ/4 plate has a double-layered structure include a broadband λ/4 plate obtained by laminating a λ/4 plate and a λ/2 plate.

The phase difference film provided with an optically anisotropic layer having a λ/4 function is more preferably a phase difference film of one or more layers, which contains at least one of liquid crystalline compounds (disk-like liquid crystal compound or rod-like liquid crystal compound) formed by polymerizing liquid crystal monomers developing nematic liquid crystallinity or a smectic liquid crystallinity.

Furthermore, as the λ/4 plate having excellent optical performance, a liquid crystalline compound having reverse wavelength dispersibility is still more preferably used. Specifically, a liquid crystalline compound represented by General Formula (II) described in WO2017/043438A is preferably used. Regarding a method for producing a λ/4 plate using the liquid crystalline compound having reverse wavelength dispersibility, reference can be made to Examples 1 to 10 in WO2017/043438A or Example 1 in JP2016-091022A.

[Other Functional Layers]

Examples of the functional layer include at least one selected from the group consisting of an antireflection layer, an antiglare layer, and a hard coat layer. Known layer materials are used for the layers. Furthermore, the layer may be laminated in multiple layers.

The antireflection layer refers to a structure which reduces reflection by a structure using light interference, unlike the above-described antireflection plate of a so-called circularly polarizing plate which is configured with the optical film and the polarizing plate of the present invention. As the simplest configuration, the antireflection layer may have a configuration consisting of only a layer of low refractive index. Moreover, in order to further reduce reflectivity, the antireflection layer is preferably configured by combining a layer of high refractive index having a high refractive index with a layer of low refractive index having a low refractive index. Examples of the configuration include a configuration including two layers of the layer of high refractive index/the layer of low refractive index in this order from a lower side and a configuration in which three layers having different refractive indices are laminated in the order of a layer of medium refractive index (layer having a refractive index which is higher than that of an underlayer and lower than that of the layer of high refractive index)/the layer of high refractive index/the layer of low refractive index, and a configuration in which more antireflection layers are laminated is also proposed. Above these, from the viewpoint of durability, optical characteristics, cost, or productivity, it is preferable that the layer of medium refractive index/the layer of high refractive index/the layer of low refractive index are provided in this order on a hard coat layer, and examples thereof include configurations described in JP1996-122504A (JP-H08-122504A), JP1996-110401A (JP-H08-110401A), JP1998-300902A (JP-H10-300902A), JP2002-243906A, and JP2000-111706A. Moreover, an antireflection film having a three-layer configuration, which is excellent in robustness against a film thickness variation, is described in JP2008-262187A. In a case where the antireflection film having a three-layer configuration is installed on a surface of an image display device, an average value of the reflectivity can be 0.5% or less, reflected glare can be significantly reduced, and an image having an excellent stereoscopic effect can be obtained. Furthermore, other functions may be imparted to each layer, and examples thereof include a layer of low refractive index having antifouling properties, a layer of high refractive index having antistatic properties, a hard coat layer having antistatic properties, and a hard coat layer having anti-glare characteristics (for example, JP1998-206603A (JP-H10-206603A), JP2002-243906A, and JP2007-264113A).

[Transparent Support]

In a case where the optical laminate according to the embodiment of the present invention is manufactured, coating is preferably performed on the transparent support. Examples of a material for forming the transparent support include a polycarbonate-based polymer; a polyester-based polymer such as polyethylene terephthalate (PET) and polyethylene naphthalate; an acrylic polymer such as polymethyl methacrylate; a styrene-based polymer such as polystyrene and an acrylonitrile-styrene copolymer (AS resin); a polyolefin-based polymer such as polyethylene, polypropylene, and an ethylene-propylene copolymer; a vinyl chloride-based polymer; an amide-based polymer such as nylon and aromatic polyamide; an imide-based polymer; a sulfone-based polymer; a polyethersulfone-based polymer; a polyetheretherketone-based polymer; a polyphenylene sulfide-based polymer; a vinylidene chloride-based polymer; a vinyl alcohol-based polymer; a vinyl butyral-based polymer; an arylate-based polymer; a polyoxymethylene-based polymer; and an epoxy-based polymer.

In addition, as the material for forming the transparent support, a thermoplastic norbornene-based resin can be preferably used. Examples of such a thermoplastic norbornene-based resin include ZEONEX and ZEONOR manufactured by ZEON CORPORATION, and ARTON manufactured by JSR Corporation.

Furthermore, as the material for forming the transparent support, a cellulose-based polymer represented by triacetyl cellulose (TAC) can also be preferably used.

In the present invention, a thickness of the transparent support is not particularly limited, but is preferably 100 μm or less, more preferably 80 μm or less, and still more preferably 10 to 80 μm.

In a final use form, it is also preferable that the transparent support is used after being peeled at an interface between the transparent support and the transparent oxygen shielding layer or between the transparent support and the photo-alignment layer. Furthermore, according to the intended application, it is also preferable that a film in accordance with functions such as moisture resistance, heat resistance, and bending resistance is selected and is laminated with the transparent support by a pressure sensitive adhesive or the like for use.

[Application]

The optical laminate according to the embodiment of the present invention can be used as a polarizing element (polarizing plate), and specifically, can be used as a linearly polarizing plate or a circularly polarizing plate, for example.

In a case where the optical laminate according to the embodiment of the present invention does not have an optically anisotropic layer such as the λ/4 plate, the optical laminate can be used as a linearly polarizing plate. On the other hand, in a case where the optical laminate according to the embodiment of the present invention has the λ/4 plate, the optical laminate can be used as a circularly polarizing plate.

Since the optical laminate according to the embodiment of the present invention has a high degree of alignment, an anisotropy of a refractive index is large and it is necessary to consider refractive index matching in each of a transmission axis direction and an absorption axis direction. Moreover, in a case where a concentration of the coloring agent exceeds 10%, the refractive index shows a high value of 1.6 or more, and thus in order to reduce internal reflection, a design in which the difference in the refractive indices of respective members is made as small as possible is required. A refractive index matching layer can also be provided, but it is preferable that a design is made to reduce the difference in the refractive indices of respective layers such as the alignment layer, the oxygen shielding layer, the pressure sensitive adhesive layer, the adhesive layer, the surface substrate, and the hard coat layer.

[Method for Manufacturing Optical Laminate]

As one of preferred manufacturing methods for producing the above-described optical laminate according to the embodiment of the present invention, at least a step A of forming a photo-alignment layer on the above-described transparent support and a step B of forming a light-absorbing anisotropic film thereon are included.

Furthermore, the step A of forming a photo-alignment layer consists of a step (A1) of preparing and transporting a transparent support film, a step (A2) of applying a composition liquid for forming a photo-alignment layer, a step (A3) of drying the applied composition liquid, and a step (A4) of irradiating a coating film with light to perform photo-alignment. Next, the step B of forming a light-absorbing anisotropic film consists of a step (B1) of transporting a film including the photo-alignment layer, a step (B2) of applying a composition liquid for forming a light-absorbing anisotropic film, a step (B3) of drying and thermally aging the applied composition liquid, and a step (B4) of irradiating a coating film with UV to perform curing.

[Image Display Device]

An image display device according to the embodiment of the present invention includes the above-described light-absorbing anisotropic film according to the embodiment of the present invention or the optical laminate according to the embodiment of the present invention.

A display element used in the image display device according to the embodiment of the present invention is not particularly limited, and examples thereof include a liquid crystal cell, an organic electroluminescent (hereinafter, abbreviated as "EL") display panel, and a plasma display panel.

Among these, a liquid crystal cell or an organic EL display panel is preferable and a liquid crystal cell is more preferable. That is, as the image display device according to the embodiment of the present invention, a liquid crystal display device using a liquid crystal cell as a display element or an organic EL display device using an organic EL display panel as a display element is preferable, and a liquid crystal display device is more preferable.

[Liquid Crystal Display Device]

The liquid crystal display device which is an example of the image display device according to the embodiment of the present invention is a liquid crystal display device including the above-described optical laminate according to the embodiment of the present invention and a liquid crystal cell.

Furthermore, in the present invention, among the optical laminates provided on both sides of the liquid crystal cell, it is preferable that the optical laminate according to the embodiment of the present invention is used as a polarizing element on a front side, and more preferable that the optical laminate according to the embodiment of the present invention is used as polarizing elements on the front side and a rear side.

Hereinafter, the liquid crystal cell constituting the liquid crystal display device will be described in detail.

<Liquid Crystal Cell>

The liquid crystal cell used for the liquid crystal display device is preferably in a vertical alignment (VA) mode, an optically compensated bend (OCB) mode, an in-plane-switching (IPS) mode, or twisted nematic (TN) mode, but is not limited thereto.

In a liquid crystal cell in the TN mode, rod-like liquid crystalline molecules (rod-like liquid crystal compound) are substantially horizontally aligned with no application of a voltage, and twist-aligned by 60° to 120°. The liquid crystal cell in the TN mode is most frequently used as a color TFT liquid crystal display device, and is described in many documents.

In a liquid crystal cell in the VA mode, rod-like liquid crystalline molecules are substantially vertically aligned with no application of a voltage. The liquid crystal cell in the VA mode includes (1) a narrowly-defined liquid crystal cell in the VA mode in which rod-like liquid crystalline molecules are substantially vertically aligned with no application of a voltage, and are substantially horizontally aligned with the application of a voltage (described in JP1990-176625A (JP-H02-176625A)), (2) a liquid crystal cell (in the multi-domain vertical alignment (MVA) mode) in which the VA mode is made into multi-domains in order to expand the viewing angle (described in SID97, Digest of tech. Papers (proceedings) 28 (1997) 845), (3) an liquid crystal cell in a mode (the n-axially symmetric aligned microcell (ASM) mode) in which rod-like liquid crystalline molecules are substantially vertically aligned with no application of a voltage, and are twistedly aligned in multi-domains with the application of a voltage (described in the proceedings 58 and 59 of Japanese Liquid Crystal Conference (1998)), and (4) a liquid crystal cell in the SURVIVAL mode (announced at liquid crystal display (LCD) international 98). In addition, the liquid crystal cell in the VA mode may be any one of a patterned vertical alignment (PVA) type, an optical alignment type, and polymer-sustained alignment (PSA) type. Details of these modes are described in JP2006-215326A and JP2008-538819A.

In a liquid crystal cell in the IPS mode, rod-like liquid crystalline molecules are substantially aligned in parallel to a substrate, and the liquid crystalline molecules respond in a planar manner with the application of an electric field in parallel to a substrate surface. The IPS mode displays a black image in a case where no electric field is applied thereto, and absorption axes of a pair of upper and tower polarizing plates are orthogonal to each other. A method of improving the viewing angle by reducing light leakage caused in a case where a black image is displayed in an oblique direction using an optical compensation sheet is disclosed in JP1998-054982A (JP-H10-054982A), JP1999-202323A (JP-H11-202323A), JP1997-292522A (JP-H9-292522A), JP1999-133408A (JP-H11-133408A), JP1999-305217A (JP-H11-305217A), JP1998-307291A (JP-H10-307291A), and the like.

[Organic EL Display Device]

As an organic EL display device which is an example of the image display device according to the embodiment of the present invention, an aspect in which the above-described optical laminate according to the embodiment of the present invention and an organic EL display panel are provided in this order from the visibly recognized side is suitably exemplified. In this case, in the optical laminate, a transparent support, an alignment layer which is provided as needed, a light-absorbing anisotropic film, a transparent resin layer, a pressure sensitive adhesive layer, and a λ/4 plate are disposed in this order from the visibly recognized side.

In addition, the organic EL display panel is a display panel configured using an organic EL element in which an organic light emitting layer (organic electroluminescence layer) is interposed between electrodes (between a cathode and an anode). The configuration of the organic EL display panel is not particularly limited, and a known configuration is employed.

As a detailed example of a preferred aspect of the organic EL display device, layer configurations are shown below in order from a visual observation side.

Cover glass/pressure sensitive adhesive layer/(oxygen shielding layer)/(index matching layer)/light-absorbing anisotropic film according to the embodiment of the present invention/(adhesive layer)/(alignment layer)/positive A-plate/(adhesive layer)/positive C-plate/pressure sensitive adhesive layer/touch sensor/pressure sensitive adhesive layer/organic EL element/polyimide substrate/PET film (100 μm)

Hard coat (organic layer)/hard coat (organic-inorganic hybrid layer)/cover resin substrate (polyimide)/pressure sensitive adhesive layer/oxygen shielding layer/(index matching layer)/light-absorbing anisotropic film according to the embodiment of the present invention/(adhesive layer)/(alignment layer)/positive A-plate/(adhesive layer)/positive C-plate/pressure sensitive adhesive layer/touch sensor/pressure sensitive adhesive layer/organic EL device/polyimide substrate/barrier film/polyimide film <Organic EL Display Device for Foldable Application>

As one aspect of the present invention, regarding an organic EL display device for foldable application except for the polarizer, reference can be made to the descriptions in JP2018-056069A. Since cover glass cannot be used, a surface film is required. For example, in paragraphs [0030] to [0040], it is described that a polyimide-based resin is preferable as a substrate having bendability which is capable of bending preferably 200,000 times, more preferably 300,000 times, and still more preferably 500,000 times with a radius of curvature of 3 mm or less (for example, 3 mm, 2 mm, or 1 mm), and an organic-inorganic hybrid material in which silica particles or a cage-like silsesquioxane compound are formulated with an ultraviolet ray curing-type acrylic resin is preferable as a hard coat layer.

EXAMPLES

Hereinafter, the present invention will be described in more detail with reference to Examples. The materials, the amounts of materials used, the ratios, the treatment details, the treatment procedure, or the like shown in the following Examples can be appropriately modified without departing from the spirit of the present invention, Therefore, the scope of the present invention will not be restrictively interpreted by the following Examples.

Production Examples 1 to 28

<Production of Alignment Layer>
With the following composition, a composition liquid 1 for forming an alignment layer was prepared, heated and dissolved at 95° C. for 1 hour while stirring, and filtered with a filter of 0.45 μm.

| Composition of composition liquid 1 for forming alignment layer | |
|---|---|
| PVA 103 (polyvinyl alcohol manufactured by KURARAY CO., LTD.) | 2.00 parts by mass |
| Water | 74.08 parts by mass |
| Methanol | 23.86 parts by mass |

A glass substrate (manufactured by Central Glass Co., Ltd., blue plate glass, size of 300 mm×300 mm, thickness of 1.1 mm) was washed with an alkaline detergent and then pure water was poured thereto, followed by drying the glass substrate.

The composition liquid 1 for forming an alignment layer was applied on the dried glass substrate with a bar of #12, and the applied composition liquid 1 for forming an alignment layer was dried at 110° C. for 2 minutes to form a coating film on the glass substrate.

The obtained coating film was subjected to a rubbing treatment (rotation speed of roller: 1,000 rotations/spacer thickness of 2.9 mm, stage speed of 1.8 m/min) once to produce an alignment layer 1 on the glass substrate.

<Production of Light-Absorbing Anisotropic Film 1>
The following liquid crystal composition P1 was spin-coated on the obtained alignment layer 1 at 1,000 rotations to form a coating film.

The coating film was dried at room temperature for 30 seconds and then further heated at 140° C. for 90 seconds.

Next, the coating film was cooled to room temperature, then heated at 80° C. for 60 seconds, and cooled again to room temperature.

Thereafter, the coating film was irradiated with light for 60 seconds under an irradiation condition of an illuminance of 28 mW/cm$^2$, using a high-pressure mercury lamp, to produce a light-absorbing anisotropic film 1 on the alignment layer 1. Moreover, a front transmittance of the formed light-absorbing anisotropic film 1 was 60% or less.

| Composition of liquid crystal composition P1 | |
|---|---|
| The following liquid crystalline compound M1 | 4.12 parts by mass |
| The following dichroic coloring agent compound D1 | 0.53 parts by mass |
| The following dichroic coloring agent compound D2 | 0.12 parts by mass |
| Polymerization initiator IRGACURE819 (manufactured by BASF SE) | 0.04 part by mass |
| The following interface modifier F1 | 0.02 parts by mass |
| Chloroform | 95.17 parts by mass |

<Production of Light-Absorbing Anisotropic Films 2 to 16>
With the same manner as for the light-absorbing anisotropic film 1, the composition of the liquid crystal composition P1 was replaced with those of the composition of the liquid crystal compositions P2 to P16 as shown in Tables 1 and 2 below to produce light-absorbing anisotropic films 2 to 16. Moreover, a front transmittance of each of the formed light-absorbing anisotropic films 2 to 16 was 60% or less.

<Production of Light-Absorbing Anisotropic Films 17 to 20>
With the same manner as for light-absorbing anisotropic film 1, the composition of the liquid crystal composition P1 was replaced with those of the composition of the liquid crystal compositions P17 to P20 as shown in Table 2 below, and each liquid crystal composition was spin-coated on the obtained alignment layer 1 at 1,000 rotations to form a coating film.

The coating film was dried at room temperature for 30 seconds and then further heated at 140° C. for 90 seconds.

Subsequently, the coating film was cooled to room temperature and then irradiated with light for 60 seconds under an irradiation condition of an illuminance of 28 mW/cm², using a high-pressure mercury lamp, to produce each of light-absorbing anisotropic films 17 to 20 on the alignment layer 1. Moreover, a front transmittance of each of the formed light-absorbing anisotropic films 17 to 20 was 60% or less.

<Production of Light-Absorbing Anisotropic Films 21 to 28>

With the same manner as for light-absorbing anisotropic film 1, the composition of the liquid crystal composition P1 was replaced with those of the composition of the liquid crystal compositions P21 to P28 as shown in Table 3 below, and each liquid crystal composition was spin-coated on the obtained alignment layer 1 at 1,000 rotations to form a coating film.

The coating film was dried at room temperature for 30 seconds and then further heated at 140° C. for 90 seconds.

Next, the coating film was cooled to room temperature, then heated at 80° C. for 60 seconds, and cooled again to room temperature.

Thereafter, the coating film was irradiated with light for 60 seconds under an irradiation condition of an illuminance of 28 mW/cm², using a high-pressure mercury lamp, to produce each of light-absorbing anisotropic films 21 to 28 on the alignment layer 1. Moreover, a front transmittance of each of the formed light-absorbing anisotropic films 21 to 28 was 60% or less.

TABLE 1

| | Liquid crystal composition | | | | | | | | | |
|---|---|---|---|---|---|---|---|---|---|---|
| | P1 | P2 | P3 | P4 | P5 | P6 | P7 | P8 | P9 | P10 |
| Dichroic azo coloring agent compound D1 | 0.53 | 0.53 | 0.53 | 0.53 | 0.53 | 0.53 | 0.53 | 0.53 | 0.53 | — |
| Dichroic azo coloring agent compound D2 | 0.12 | 0.12 | 0.12 | 0.12 | 0.12 | 0.12 | 0.12 | 0.12 | 0.12 | — |
| Dichroic azo coloring agent compound D3 | — | — | — | — | — | — | — | — | — | 0.49 |
| Dichroic azo coloring agent compound D4 | — | — | — | — | — | — | — | — | — | 0.11 |
| Dichroic azo coloring agent compound D5 | — | — | — | — | — | — | — | — | — | — |
| Dichroic azo coloring agent compound D6 | — | — | — | — | — | — | — | — | — | — |
| Dichroic azo coloring agent compound D7 | — | — | — | — | — | — | — | — | — | — |
| Liquid crystalline compound M1 | 4.12 | 4.12 | 4.12 | 4.12 | 4.12 | 4.12 | 4.12 | 4.12 | 4.12 | — |
| Liquid crystalline compound M2 | — | — | — | — | — | — | — | — | — | 4.12 |
| Liquid crystalline compound M3 | — | — | — | — | — | — | — | — | — | — |
| Liquid crystalline compound M4 | — | — | — | — | — | — | — | — | — | — |
| Specific compound (1)-1 | — | 0.003 | 0.006 | 0.012 | 0.037 | 0.110 | 0.329 | — | — | — |
| Specific compound (1)-2 | — | — | — | — | — | — | — | 0.014 | — | — |
| Specific compound (1)-3 | — | — | — | — | — | — | — | — | 0.019 | — |
| Polymerization initiator IRGACURE819 | 0.04 | 0.04 | 0.04 | 0.04 | 0.04 | 0.04 | 0.04 | 0.04 | 0.04 | 0.04 |
| Interface modifier F1 | 0.02 | 0.02 | 0.02 | 0.02 | 0.02 | 0.02 | 0.02 | 0.02 | 0.02 | 0.02 |
| Chloroform | 95.17 | 95.17 | 95.16 | 95.16 | 95.13 | 95.06 | 94.84 | 95.16 | 95.15 | 95.22 |
| Content mass ratio *1 of dichroic azo coloring agent compound | 15.8 | 15.8 | 15.8 | 15.8 | 15.8 | 15.8 | 15.8 | 15.8 | 15.8 | 14.6 |
| Content molar ratio *2 of specific compound | 0.0 | 1.5 | 3.0 | 5.9 | 18.2 | 54.2 | 162.0 | 6.1 | 6.1 | 0.0 |

*1: content mass ratio (% by mass) of dichroic azo coloring agent compound to liquid crystalline compound
*2: content molar ratio (% by mole) of specific compound to dichroic azo coloring agent compound

TABLE 2

| | Liquid crystal composition | | | | | | | | | |
|---|---|---|---|---|---|---|---|---|---|---|
| | P11 | P12 | P13 | P14 | P15 | P16 | P17 | P18 | P19 | P20 |
| Dichroic azo coloring agent compound D1 | — | 0.53 | 0.53 | — | — | — | — | — | — | — |
| Dichroic azo coloring agent compound D2 | — | 0.12 | 0.12 | — | — | — | — | — | — | — |
| Dichroic azo coloring agent compound D3 | 0.49 | — | — | — | — | — | 0.49 | 0.49 | 0.49 | 0.49 |
| Dichroic azo coloring agent compound D4 | 0.11 | — | — | — | — | — | 0.11 | 0.11 | 0.11 | 0.11 |

TABLE 2-continued

| | Liquid crystal composition | | | | | | | | | |
|---|---|---|---|---|---|---|---|---|---|---|
| | P11 | P12 | P13 | P14 | P15 | P16 | P17 | P18 | P19 | P20 |
| Dichroic azo coloring agent compound D5 | — | — | — | 0.15 | 0.15 | 0.15 | — | — | — | — |
| Dichroic azo coloring agent compound D6 | — | — | — | 0.15 | 0.15 | 0.15 | — | — | — | — |
| Dichroic azo coloring agent compound D7 | — | — | — | 0.15 | 0.15 | 0.15 | — | — | — | — |
| Liquid crystalline compound M1 | — | — | — | 4.12 | 4.12 | 1.18 | — | — | — | — |
| Liquid crystalline compound M2 | 4.12 | — | — | — | — | — | — | — | — | — |
| Liquid crystalline compound M3 | — | 4.12 | 4.12 | — | — | — | — | — | — | — |
| Liquid crystalline compound M4 | — | — | — | — | — | — | 4.12 | 4.12 | 4.12 | 4.12 |
| Specific compound (1)-1 | 0.006 | — | 0.012 | — | 0.014 | 0.014 | — | 0.011 | 0.102 | 0.305 |
| Specific compound (1)-2 | — | — | — | — | — | — | — | — | — | — |
| Specific compound (1)-3 | — | — | — | — | — | — | — | — | — | — |
| Polymerization initiator IRGACURE819 | 0.04 | 0.04 | 0.04 | 0.04 | 0.04 | 0.04 | 0.04 | 0.04 | 0.04 | 0.04 |
| Interface modifier F1 | 0.02 | 0.02 | 0.02 | 0.02 | 0.02 | 0.02 | 0.02 | 0.02 | 0.02 | 0.02 |
| Chloroform | 95.21 | 95.17 | 95.16 | 95.37 | 95.36 | 98.30 | 95.22 | 95.21 | 95.12 | 94.92 |
| Content mass ratio *1 of dichroic azo coloring agent compound | 14.6 | 15.8 | 15.8 | 10.9 | 10.9 | 38.1 | 14.6 | 14.6 | 14.6 | 14.6 |
| Content molar ratio *2 of specific compound | 3.0 | 0.0 | 5.9 | 0.0 | 6.0 | 6.0 | 0.0 | 5.8 | 54.2 | 161.9 |

*1: content mass ratio (% by mass) of dichroic azo coloring agent compound to liquid crystalline compound
*2: content molar ratio (% by mole) of specific compound to dichroic azo coloring agent compound

TABLE 3

| | Liquid crystal composition | | | | | | | |
|---|---|---|---|---|---|---|---|---|
| | P21 | P22 | P23 | P24 | P25 | P26 | P27 | P28 |
| Dichroic azo coloring agent compound D1 | 0.53 | 0.53 | 0.71 | 0.71 | 0.91 | 0.91 | 1.02 | 1.02 |
| Dichroic azo coloring agent compound D2 | 0.12 | 0.12 | 0.16 | 0.16 | 0.21 | 0.21 | 0.23 | 0.23 |
| Liquid crystalline compound M1 | 4.12 | 4.12 | 3.95 | 3.95 | 3.70 | 3.70 | 3.62 | 3.62 |
| Specific compound (1)-1 | — | — | — | 0.008 | — | 0.010 | — | 0.012 |
| Specific compound (1)-4 | 0.006 | — | — | — | — | — | — | — |
| Specific compound (1)-5 | — | 0.009 | — | — | — | — | — | — |
| Polymerization initiator IRGACURE819 | 0.04 | 0.04 | 0.04 | 0.04 | 0.04 | 0.04 | 0.04 | 0.04 |
| Interface modifier F1 | 0.02 | 0.02 | 0.02 | 0.02 | 0.02 | 0.02 | 0.02 | 0.02 |
| Chloroform | 95.16 | 95.16 | 95.12 | 95.11 | 95.12 | 95.11 | 95.07 | 95.06 |
| Content mass ratio *1 of dichroic azo coloring agent compound | 15.8 | 15.8 | 22.0 | 22.0 | 30.3 | 30.3 | 34.5 | 34.5 |
| Content molar ratio *2 of specific compound | 5.9 | 5.9 | 0.0 | 2.9 | 0.0 | 2.9 | 0.0 | 3.1 |

*1: content mass ratio (% by mass) of dichroic azo coloring agent compound to liquid crystalline compound
*2: content molar ratio (% by mole) of specific compound to dichroic azo coloring agent compound The structures of the dichroic azo coloring agent compounds and the like in Tables 1 to 3 are shown below.

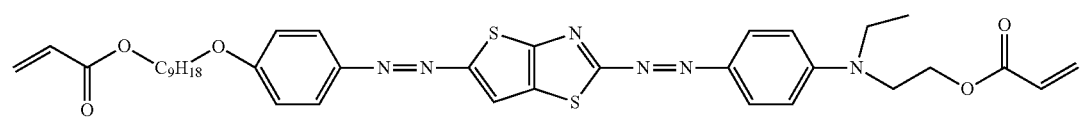

Dichroic azo coloring agent compound D1

-continued

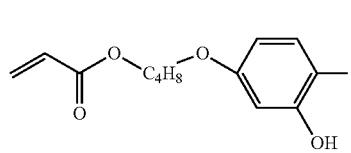 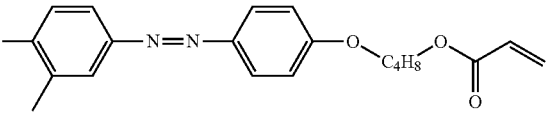

Dichroic azo coloring agent compound D2

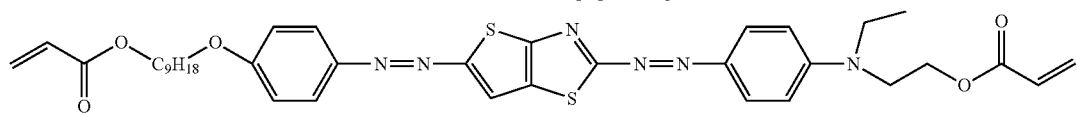

Dichroic azo coloring agent compound D3

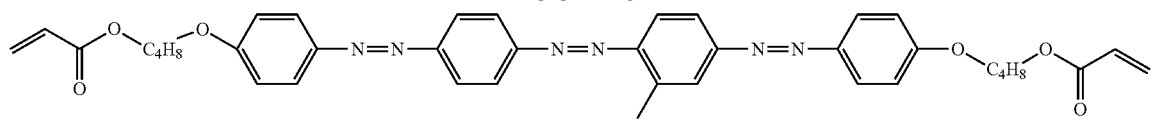

Dichroic azo coloring agent compound D4

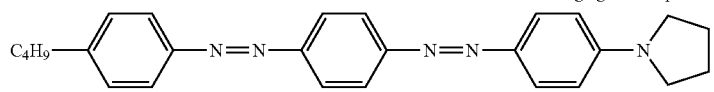

Dichroic azo coloring agent compound D5

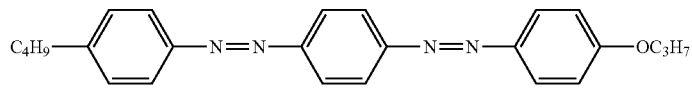

Dichroic azo coloring agent compound D6

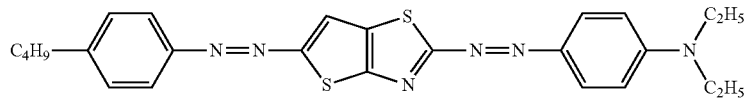

Dichroic azo coloring agent compound D7

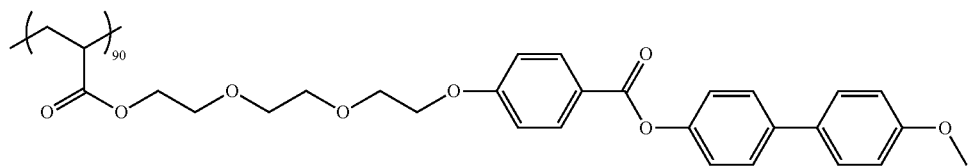
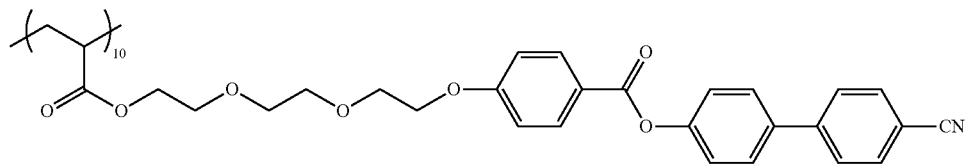

Liquid crystalline compound M1 (average molecular weight of 16,000)

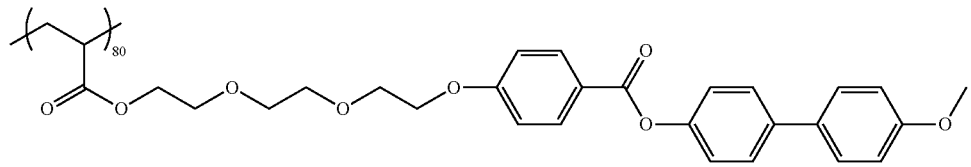
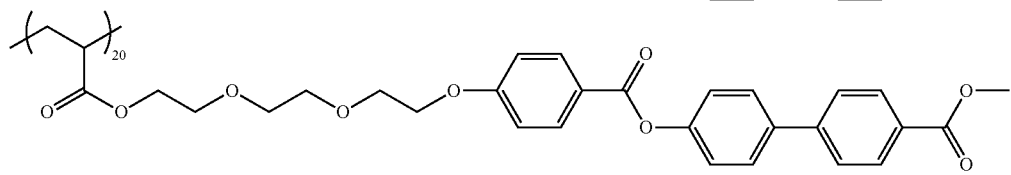

Liquid crystalline compound M2 (average molecular weight of 15,000)

-continued

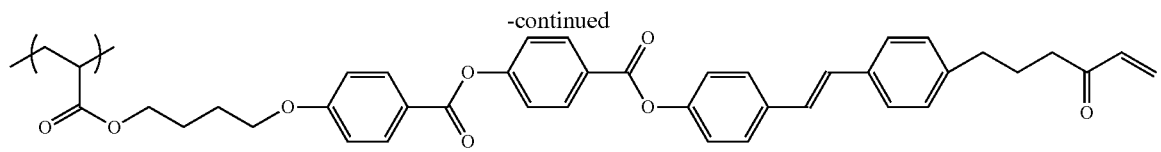

Liquid crystalline compound M3 (average molecular weight of 18,000)

(Compound A)

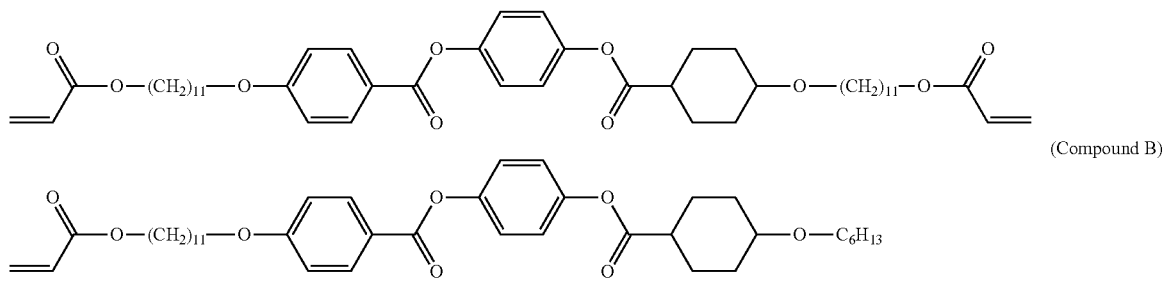

(Compound B)

Liquid crystalline compound M4 (mixing so that the following compound A/the following compound B was 75/25)

Specific compound (1)-1

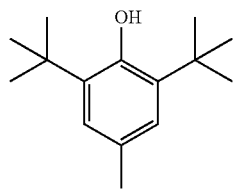

Specific compound (1)-2

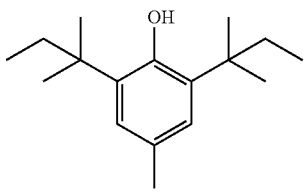

Specific compound (1)-3

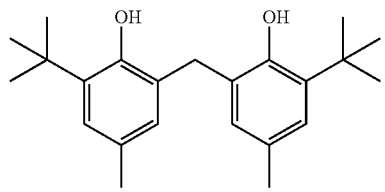

Specific compound (1)-4

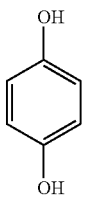

Specific compound (1)-5

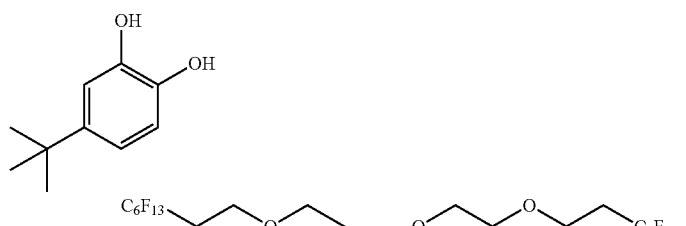

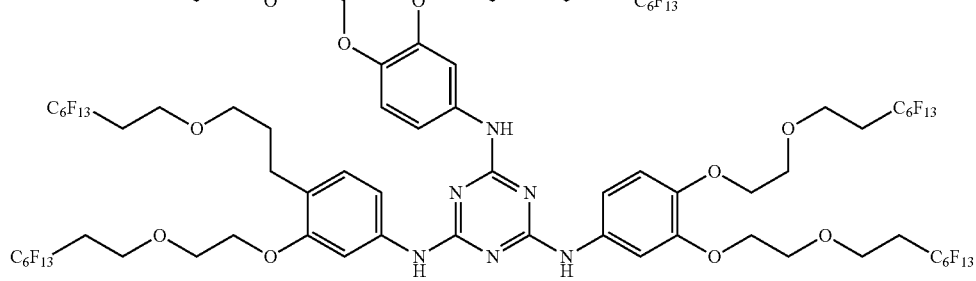

Interface modifier F1

<Evaluation of Degree of Alignment of Light-Absorbing Anisotropic Films 1 to 28>

A degree of alignment was calculated according to the following expression by setting each light-absorbing aniso- tropic film of Production Examples on a sample table in a state where a linear polarizer was inserted into a side of a light source of an optical microscope (manufactured by Nikon Corporation, product name "ECLIPSE E600 POL"), and measuring an absorbance of the light-absorbing anisotropic film in a wavelength range of 400 to 700 nm using a multi-channel spectrometer (manufactured by Ocean Optics Inc., product name "QE65000"). The results are shown in Table 4 below.

Degree of alignment: $S=[(Az0/Ay0)-1]/[(Az0/Ay0)+2]$

Az0: Absorbance with respect to polarized light in an absorption axis direction of the light-absorbing anisotropic film Ay0: Absorbance with respect to polarized light in a polarizing axis direction of the light-absorbing anisotropic film coloring agent compound to the liquid crystalline compound was high, the degree of alignment was inferior to that in Production Example 15.

Production Examples 29 and 30

<Preparation of Composition Liquid A1 for Forming Oxygen Shielding Layer>

With the following composition, a composition liquid A1 for forming an oxygen shielding layer was prepared, heated and dissolved at 95° C. for 1 hour while stirring, and filtered with a filter of 0.45 μm.

TABLE 4

| | Light-absorbing anisotropic film | | | | | | | | |
|---|---|---|---|---|---|---|---|---|---|
| | | | | Content mass | | | Evaluation result | | |
| | Liquid crystal composition | Dichroic azo coloring agent compound | | Liquid crystalline compound | ratio *1 of dichroic azo coloring agent compound | Specific compound (1) | Content molar ratio *2 of specific compound (1) | Degree of alignment | Effect of specific compound (1) | Note |
| Production Example 1 | P1 | D1 | D2 — | M1 | 15.8 | — | — | 0.91 | — | Comparative Example |
| Production Example 2 | P2 | D1 | D2 — | M1 | 15.8 | (1)-1 | 1.5 | 0.92 | 0.01 | Example |
| Production Example 3 | P3 | D1 | D2 — | M1 | 15.8 | (1)-1 | 3.0 | 0.93 | 0.02 | Example |
| Production Example 4 | P4 | D1 | D2 — | M1 | 15.8 | (1)-1 | 5.9 | 0.94 | 0.03 | Example |
| Production Example 5 | P5 | D1 | D2 — | M1 | 15.8 | (1)-1 | 18.2 | 0.93 | 0.02 | Example |
| Production Example 6 | P6 | D1 | D2 — | M1 | 15.8 | (1)-1 | 54.2 | 0.93 | 0.01 | Example |
| Production Example 7 | P7 | D1 | D2 — | M1 | 15.8 | (1)-1 | 162.0 | 0.92 | 0.01 | Example |
| Production Example 8 | P8 | D1 | D2 — | M1 | 15.8 | (1)-2 | 6.1 | 0.93 | 0.02 | Example |
| Production Example 9 | P9 | D1 | D2 — | M1 | 15.8 | (1)-3 | 6.1 | 0.92 | 0.01 | Example |
| Production Example 10 | P10 | D3 | D4 — | M2 | 14.6 | — | — | 0.93 | — | Comparative Example |
| Production Example 11 | P11 | D3 | D4 — | M2 | 14.6 | (1)-1 | 3.0 | 0.95 | 0.02 | Example |
| Production Example 12 | P12 | D1 | D2 — | M3 | 15.8 | — | — | 0.87 | — | Comparative Example |
| Production Example 13 | P13 | D1 | D2 — | M3 | 15.8 | (1)-1 | 5.9 | 0.89 | 0.02 | Example |
| Production Example 14 | P14 | D5 | D6 D7 | M1 | 10.9 | — | — | 0.85 | — | Comparative Example |
| Production Example 15 | P15 | D5 | D6 D7 | M1 | 10.9 | (1)-1 | 6.0 | 0.86 | 0.01 | Example |
| Production Example 16 | P16 | D5 | D6 D7 | M1 | 38.1 | (1)-1 | 6.0 | 0.82 | — | Comparative Example |
| Production Example 17 | P17 | D3 | D4 — | M4 | 14.6 | — | — | 0.88 | — | Comparative Example |
| Production Example 18 | P18 | D3 | D4 — | M4 | 14.6 | (1)-1 | 5.8 | 0.90 | 0.02 | Example |
| Production Example 19 | P19 | D3 | D4 — | M4 | 14.6 | (1)-1 | 54.2 | 0.89 | 0.01 | Example |
| Production Example 20 | P20 | D3 | D4 — | M4 | 14.6 | (1)-1 | 161.9 | 0.89 | 0.01 | Example |
| Production Example 21 | P34 | D1 | D2 — | M1 | 15.8 | (1)-4 | 5.9 | 0.92 | 0.01 | Example |
| Production Example 22 | P35 | D1 | D2 — | M1 | 15.8 | (1)-5 | 5.9 | 0.92 | 0.01 | Example |
| Production Example 23 | P36 | D1 | D2 — | M1 | 22.0 | (1)-1 | — | 0.91 | — | Comparative Example |
| Production Example 24 | P37 | D1 | D2 — | M1 | 22.0 | (1)-1 | 2.9 | 0.93 | 0.02 | Example |
| Production Example 25 | P38 | D1 | D2 — | M1 | 30.3 | (1)-1 | — | 0.91 | — | Comparative Example |
| Production Example 26 | P39 | D1 | D2 — | M1 | 30.3 | (1)-1 | 2.9 | 0.93 | 0.02 | Example |
| Production Example 27 | P40 | D1 | D2 — | M1 | 34.5 | (1)-1 | — | 0.91 | — | Comparative Example |
| Production Example 28 | P41 | D1 | D2 — | M1 | 34.5 | (1)-2 | 3.1 | 0.93 | 0.02 | Example |

*1: content mass ratio (% by mass) of dichroic azo coloring agent compound to liquid crystalline compound

*2: content molar ratio (% by mole) of specific compound to dichroic azo coloring agent compound From the results shown in Table 4, it was found that the light-absorbing anisotropic film according to the embodiment of the present invention was improved in the degree of alignment by containing the specific compound (1).

In addition, it was confirmed that in Production Example 16 in which the content mass ratio of the dichroic azo

| Composition liquid A1 for forming oxygen shielding layer | |
|---|---|
| The following modified-PVA 1 | 2.0 parts by mass |
| Pure water | 70.0 parts by mass |
| Isopropyl alcohol | 20.0 parts by mass |

| Composition liquid A1 for forming oxygen shielding layer | |
|---|---|
| Methanol | 8.0 parts by mass |
| Photopolymerization initiator (IRGACURE2959 manufactured by BASF SE) | 0.06 part by mass |

The modified-PVA 1 having the following structural formula was synthesized with PVA 103 as a raw material by a method described in JP1997-152509A (JP-H09-152509A).

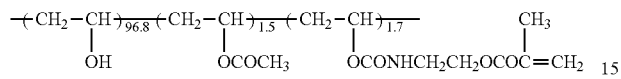

<Preparation of Composition Liquid E1 for Forming Photo-Alignment Layer>

With the following composition, a composition liquid E1 for forming a photo-alignment layer was prepared, dissolved for 1 hour while stirring, and filtered with a filter of 0.45 μm.

| Composition liquid E1 for forming photo-alignment layer | |
|---|---|
| The following photo-alignment material E-1 | 0.3 parts by mass |
| 2-Butoxyethanol | 41.6 parts by mass |
| Dipropylene glycol monomethyl ether | 41.6 parts by mass |
| Pure water | 16.5 parts by mass |

Photo-alignment material E-1

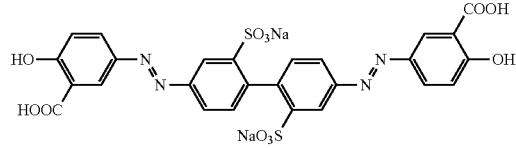

<Preparation of Liquid Crystal Composition P29>

With the following composition, a liquid crystal composition P29 was prepared, heated and dissolved at 50° C. for 3 hours while stirring, and filtered with a filter of 0.45 μm.

The specific compound (1)-1 was added in an amount of 6% by mole of the coloring agent.

| Liquid crystal composition P29 | |
|---|---|
| The above dichroic azo coloring agent compound D3 | 9.3 parts by mass |
| The above dichroic azo coloring agent compound D4 | 2.1 parts by mass |
| The above liquid crystalline compound M2 | 72.2 parts by mass |
| Polymerization initiator IRGACURE819 (manufactured by BASF SE) | 0.8 part by mass |
| The following interface modifier F-2 | 0.6 parts by mass |
| The above specific compound (1)-1 | 0.2 parts by mass |
| Cyclopentanone | 640.4 parts by mass |
| Tetrahydro furan | 274.4 parts by mass |

Interface modifier F-2

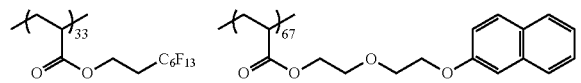

<Preparation of Liquid Crystal Composition P30>

With the following composition, a liquid crystal composition P30 was prepared, heated and dissolved at 50° C. for 3 hours while stirring, and filtered with a filter of 0.45 μm.

The specific compound (1)-1 was added in an amount of 6% by mole of the coloring agent.

| Liquid crystal composition P30 | |
|---|---|
| The above dichroic azo coloring agent compound D3 | 9.3 parts by mass |
| The above dichroic azo coloring agent compound D4 | 2.1 parts by mass |
| The above liquid crystalline compound M4 | 72.2 parts by mass |
| Polymerization initiator IRGACURE819 (manufactured by BASF SE) | 0.8 part by mass |
| The above interface modifier F-2 | 0.6 parts by mass |
| The above compound (1)-1 | 0.2 parts by mass |
| Cyclopentanone | 640.4 parts by mass |
| Tetrahydrofuran | 274.4 parts by mass |

Production of Optical Laminate 29 of Production Example 29

(Production of Oxygen Shielding Layer)

A surface of a TAC substrate (TG40, manufactured by FUJIFILM Corporation) having a thickness of 40 μm was subjected to a saponification treatment and then was coated with the composition liquid A1 for forming an oxygen shielding layer having the following composition with a wire bar. Thereafter, the substrate was dried with hot air at 100° C. for 2 minutes to obtain a transparent support 1 in which a polyvinyl alcohol (PVA) transparent oxygen shielding layer having a thickness of 0.8 μm was formed on the TAC substrate.

(Production of Photo-Alignment Layer)

The above-described composition liquid E1 for forming a photo-alignment layer was applied onto the transparent support 1 and dried at 60° C. for 2 minutes. Thereafter, the obtained coating film was irradiated with linearly polarized ultraviolet rays (an illuminance of 4.5 mW, an irradiation amount of 500 mJ/cm$^2$) using a polarized ultraviolet exposure device to produce a photo-alignment layer 1 having a thickness of 0.03 μm.

(Formation of Light-Absorbing Anisotropic Film)

The liquid crystal composition P29 was applied onto the obtained photo-alignment layer 1 with a wire bar.

Next, the layer was heated at 140° C. for 90 seconds and cooled to room temperature (23° C.).

Subsequently, the layer was heated at 80° C. for 60 seconds and cooled again to room temperature.

Thereafter, by irradiating the layer with light for 60 seconds under an irradiation condition of an illuminance of 28 mW/cm$^2$, using a high-pressure mercury lamp, a light-absorbing anisotropic film having a thickness of 0.6 μm was formed, whereby an optical laminate 29 of Production Example 29 could be produced. Moreover, a front transmittance of the formed light-absorbing anisotropic film was 60% or less.

The degree of alignment measured by the above method was 0.97, and a coating-type polarizer having a high degree of alignment close to a level of an iodine polarizer could be realized.

Production of Optical Laminate 30 of Production Example 30

(Formation of Light-Absorbing Anisotropic Film)

The liquid crystal composition P30 was applied onto the photo-alignment layer 1 obtained in the same manner as in Production Example 29 with a wire bar of #4.

Subsequently, the layer was heated at 120° C. for 60 seconds and cooled to room temperature.

Thereafter, by irradiating the layer with light for 60 seconds under an irradiation condition of an illuminance of 28 mW/cm², using a high-pressure mercury lamp, a light-absorbing anisotropic film having a thickness of 0.6 μm was formed, whereby an optical laminate 30 of Production Example 30 could be produced. Moreover, a front transmittance of the formed light-absorbing anisotropic film was 60% or less.

Production Examples 31 and 32

The optical laminate produced in the same manner as in Production Examples 29 and 30 was placed in a vacuum film deposition apparatus, an oxygen shielding layer having a thickness of 20 non and consisting of silicon oxide represented by SiOxCy was formed on the surface of the light-absorbing anisotropic film by a plasma CVD method under the following conditions, and thus laminates 31 and 32 in which the oxygen shielding layer was formed on the light-absorbing anisotropic film were produced.

Used gas: mixed gas of 5 sccm of hexamethyldisiloxane (HMDSO)/50 scorn of oxygen
Applied frequency: 13.56 MHz
Applied electric power: 0.5 kW
<Evaluation of Light Resistance>
Xenon light was radiated at 150 W/m² (300 to 400 nm) for 300 hours from each support side of the produced laminates 31 and 32 with a SUPER XENON WEATHER METER "SX-75" (manufactured by Suga Test instruments Co., Ltd., condition of 60° C. and 50% RH). After a lapse of a predetermined time, a change in the degree of alignment of the laminate was measured. In the laminates which were produced in Production Examples 31 and 32 and in which the oxygen shielding layer was formed on the light-absorbing anisotropic film, a decrease in the degree of alignment was suppressed as compared with laminates produced in Production Examples 29 and 30.

Production Examples 33 and 34

[Production of λ/4 Phase Difference Film 1]
<Preparation of Composition 1 for Forming Photo-Alignment Layer>
(Synthesis of Polymer J-1)
Into a reaction vessel comprising a stirrer, a thermometer, a dripping funnel, and a reflux cooling pipe were introduced 100.0 parts by mass of 2-(3,4-epoxycyclohexyl)ethyltrimethoxysilane, 500 parts by mass of methyl isobutyl ketone, and 10.0 parts by mass of triethylamine, and the mixture was stirred at room temperature. Next, 100 parts by mass of deionized water was added dropwise to the obtained mixture for 30 minutes with the dripping funnel, and then allowed to undergo a reaction at 80° C. for 6 hours while mixing the mixture under reflux. After completion of the reaction, the organic phase was extracted and washed with a 0.2%-by-mass aqueous ammonium nitrate solution until water after the washing became neutral. Thereafter, the solvent and water were distilled off under reduced pressure from the obtained organic phase to obtain a polyorganosiloxane having an epoxy group as a viscous transparent liquid.

The polyorganosiloxane having an epoxy group was subjected to ¹H-Nuclear Magnetic Resonance (NMR) analysis, and thus, it was confirmed that peaks based on an oxiranyl group around a chemical shift (δ) of 3.2 ppm were obtained as per a theoretical strength, and a side reaction of the epoxy group did not occur during the reaction. A weight-average molecular weight Mw and an epoxy equivalent of the polyorganosiloxane having an epoxy group were 2,200 and 186 g/mol, respectively.

Next, into a 100-mL three-neck flask were introduced 10.1 parts by mass of the polyorganosiloxane having an epoxy group obtained above, 0.5 parts by mass of an acryloyl group-containing carboxylic acid (manufactured by TOAGOSEI CO., LTD., product name "ARONIX M-5300", ω-carboxypolycaprolactone acrylate (a degree of polymerization n≈2)), 20 parts by mass of butyl acetate, 1.5 parts by mass of a cinnamic acid derivative obtained by the method of Synthesis Example 1 of JP2015-026050A, and 0.3 parts by mass of tetrabutylammonium bromide, and the obtained mixture was stirred at 90° C. for 12 hours. After stirring, the mixture was diluted with butyl acetate in the same amount (mass) as that of the obtained mixture, and the diluted mixture was washed with water three times. An operation in which the obtained mixture was concentrated and diluted with butyl acetate was repeated twice to finally obtain a solution containing polyorganosiloxane (the following polymer J-1) having a photo-aligned group. A weight-average molecular weight Mw of the polymer J-1 was 9,000. in addition, as a result of ¹H-NMR analysis, the amount of the components having a cinnamate group in the polymer J-1 was 23.7% by mass.

Polymer J-1

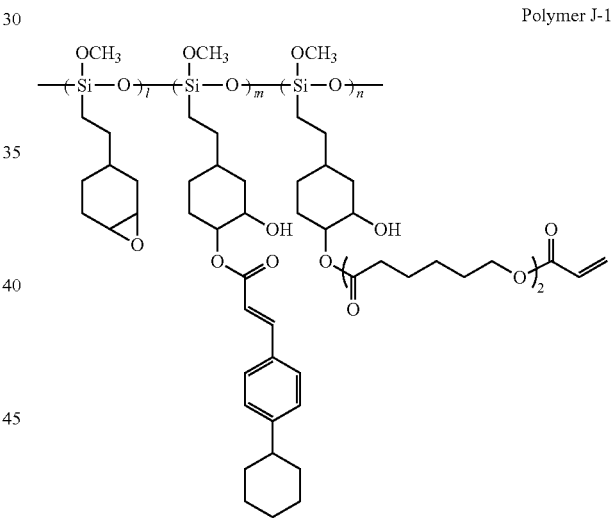

(Preparation of Composition 1 for Forming Photo-Alignment Layer)

The following components were mixed to prepare a composition 1 for forming a photo-alignment layer.

| | |
|---|---|
| The above polymer J-1 | 10.67 parts by mass |
| The following low-molecular compound R-1 | 5.17 parts by mass |
| The following additive (B-1) | 0.53 parts by mass |
| Butyl acetate | 8287.37 parts by mass |
| Propylene glycol monomethyl ether acetate | 2071.85 parts by mass |

Low-molecular compound R-1

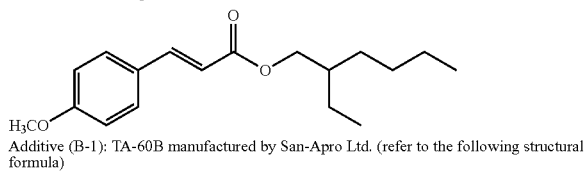

Additive (B-1): TA-60B manufactured by San-Apro Ltd. (refer to the following structural formula)

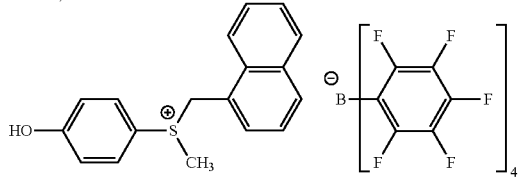

<Preparation of Coating Liquid for Optically Anisotropic Layer>

A coating liquid for an optically anisotropic layer having the following composition was prepared.

| Coating liquid for optically anisotropic layer | |
|---|---|
| The following liquid crystalline compound L-3 | 42.00 parts by mass |
| The following liquid crystalline compound L-4 | 42.00 parts by mass |
| The following polymerizable compound A-1 | 16.00 parts by mass |
| The following low-molecular compound B-2 | 6.00 parts by mass |
| The following polymerization initiator S-1 (oxime-type) | 0.50 parts by mass |
| The following leveling agent G-1 | 0.20 parts by mass |
| HISOLVE MTEM (manufactured by TOHO Chemical Industry Co., Ltd.) | 2.00 parts by mass |
| NK ESTER A-200 (manufactured by Shin-Nakamura Chemical Co., Ltd.) | 1.00 part by mass |
| Methyl ethyl ketone | 424.8 parts by mass |

In addition, a group adjacent to the acryloyloxy group of each of the following liquid crystalline compounds L-3 and L-4 represents a propylene group (a group in which is a methyl group is substituted with an ethylene group), and the following liquid crystalline compounds L-3 and L-4 represent a mixture of regioisomers having different positions of the methyl groups.

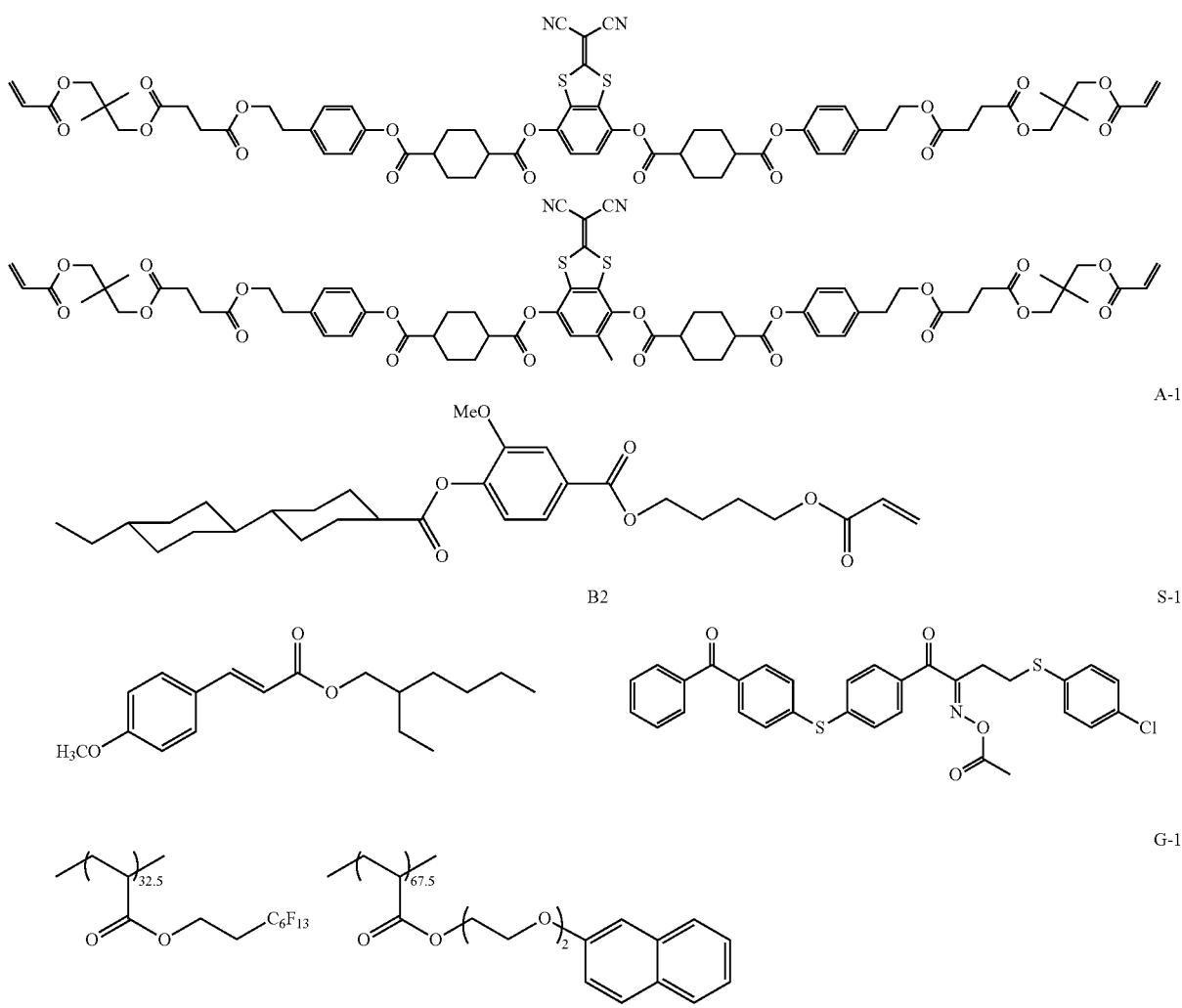

<Production of Cellulose Acylate Film 1>

(Production of Core Layer Cellulose Acylate Dope)

The following composition was introduced into a mixing tank and stirred to dissolve the respective components, thereby preparing a cellulose acetate solution for use as a core layer cellulose acylate dope.

| Core layer cellulose acylate dope | |
|---|---|
| Cellulose acetate having degree of acetyl substitution of 2.88 | 100 parts by mass |
| Polyester compound B described in Examples of JP2015-227955A | 12 parts by mass |
| The following compound F | 2 parts by mass |
| Methylene chloride (first solvent) | 430 parts by mass |
| Methanol (second solvent) | 64 parts by mass |

Compound F

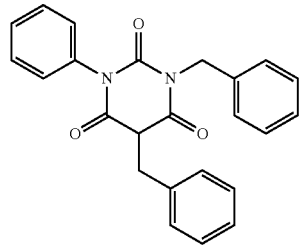 [SMILES: O=C1C(Cc2ccccc2)C(=O)N(c2ccccc2)C(=O)N1Cc1ccccc1]

(Production of Outer Layer Cellulose Acylate Dope)

To 90 parts by mass of the core layer cellulose acylate dope was added 10 parts by mass of the following matting agent solution to prepare a cellulose acetate solution for use as an outer layer cellulose acylate dope.

| Matting agent solution | |
|---|---|
| Silica particle having average particle size of 20 nm (AEROSIL R972, manufactured by NIPPON AEROSIL CO., LTD.) | 2 parts by mass |
| Methylene chloride (first solvent) | 76 parts by mass |
| Methanol (second solvent) | 11 parts by mass |
| The above core layer cellulose acylate dope | 1 part by mass |

(Production of Cellulose Acylate Film 1)

The core layer cellulose acylate dope and the outer layer cellulose acylate dope were filtered through filter paper having an average pore diameter of 34 μm and a sintered metal filter having an average pore diameter of 10 μm, and then three layers of the core layer cellulose acylate dope and the outer layer cellulose acylate dopes on both sides thereof were cast on a dram at 20° C. from casting ports at the same time (band casting machine).

Subsequently, the film was peeled in the state where the solvent content reached approximately 20% by mass, the both terminals of the film in the width direction were fixed with tenter clips, and the film was dried while being stretched at a stretching ratio of 1.1 times in the cross direction.

Thereafter, the film was transported between rolls in a heat treatment device and further dried to produce an optical film having a thickness of 40 μm, which was used as a cellulose acylate film 1. An in-plane retardation of the obtained cellulose acylate film 1 was 0 nm.

<Production of λ/4 Phase Difference Film 1>

The composition 1 for forming a photo-alignment layer prepared in advance was applied onto a surface on one side of the produced cellulose acylate film 1 with a bar coater.

After the application, the film was dried on a hot plate at 120° C. for 1 minute to remove the solvent, thereby forming a photoisomerization composition layer having a thickness of 0.3 μm.

The obtained photoisomerization composition layer was irradiated with polarized ultraviolet rays (10 mJ/cm$^2$, using an ultra-high-pressure mercury lamp) to form a photo-alignment layer.

Subsequently, the coating liquid for an optically anisotropic layer prepared in advance was applied onto the photo-alignment layer with a bar coater to form a composition layer.

The formed composition layer was first heated on a hot plate to 110° C. and then cooled to 60° C. to stabilize the alignment.

Thereafter, while keeping the temperature at 60° C., the alignment was fixed by irradiation with ultraviolet rays (500 mJ/cm$^2$, using an ultra-high-pressure mercury lamp) under a nitrogen atmosphere (an oxygen concentration of 100 ppm) to form an optically anisotropic layer having a thickness of 2.3 μm, whereby a λ/4 phase difference film 1 was produced. An in-plane retardation of the obtained λ/4 phase difference film 1 was 140 nm.

[Production of Positive C-Plate Film 1]

A commercially available triacetyl cellulose film "Z-TAC" (manufactured by FUJIFILM Corporation) was used as a temporary support (the film was referred to as a cellulose acylate film 2).

The cellulose acylate film 2 was allowed to pass through a dielectric heating roll at a temperature of 60° C., the film surface temperature was elevated up to 40° C., then an alkali solution having the composition shown below was applied onto one surface of the film at an application amount of 14 ml/m$^2$ using a bar coater, and the film was transported for 10 seconds under a steam-type far infrared heater manufactured by NORITAKE CO., LIMITED while heating at 110° C.

Next, pure water was applied at 3 ml/m$^2$ using the same bar coater.

Subsequently, water-washing using a fountain coater and drainage using an air knife were repeated three times, and then, the film was transported to a drying zone at 70° C. for 10 seconds for drying to produce a cellulose acylate film 2 which had been subjected to an alkali saponification treatment.

| Composition (parts by mass) of alkali solution | |
|---|---|
| Potassium hydroxide | 4.7 parts by mass |
| Water | 15.8 parts by mass |
| Isopropanol | 63.7 parts by mass |
| Fluorine-containing surfactant SF-1 ($C_{14}H_{29}O(CH_2CH_2O)_{20}H$) | 1.0 part by mass |
| Propylene glycol | 14.8 parts by mass |

A coating liquid for forming an alignment layer having the following composition was continuously applied with a wire bar of #8, using the cellulose acylate film 2 which had been subjected to an alkali saponification treatment. The resultant was dried with hot air at 60° C. for 60 seconds and further dried with hot air at 100° C. for 120 seconds to form an alignment layer.

| Composition of coating liquid for forming alignment layer | |
|---|---|
| Polyvinyl alcohol (manufactured by KURARAY CO., LTD., PVA 103) | 2.4 parts by mass |
| Isopropyl alcohol | 1.6 parts by mass |
| Methanol | 36 parts by mass |
| Water | 60 parts by mass |

The following coating liquid N was applied onto the cellulose acylate film 2 having the alignment layer produced above, aged at 60° C. for 60 seconds, and then irradiated with ultraviolet rays at 1000 mJ/cm$^2$ in air using an air-cooled metal halide lamp (manufactured by EYE GRAPHICS Co., Ltd.) at 70 mW/cm$^2$, and the alignment state was fixed to vertically align a rod-like polymerizable liquid crystal compound, thereby producing a positive C-plate film 1. The Rth at a wavelength of 550 nm was −60 nm.

| Composition of coating liquid N for optically anisotropic layer | |
|---|---|
| The following liquid crystalline compound L-1 | 80 parts by mass |
| The following liquid crystalline compound L-2 | 20 parts by mass |
| The following vertical alignment agent (S01) for liquid crystalline compound | 1 part by mass |
| Ethylene oxide-modified trimethylol propane triacrylate (V#360, manufactured by OSAKA ORGANIC CHEMICAL INDUSTRY LTD.) | 8 parts by mass |
| IRGACURE907 (manufactured by BASF SE) | 3 parts by mass |
| KAYACURE DETX (manufactured by Nippon Kayaku Co., Ltd.) | 1 part by mass |
| The following compound B03 | 0.4 parts by mass |
| Methyl ethyl ketone | 170 parts by mass |
| Cyclohexanone | 30 parts by mass |

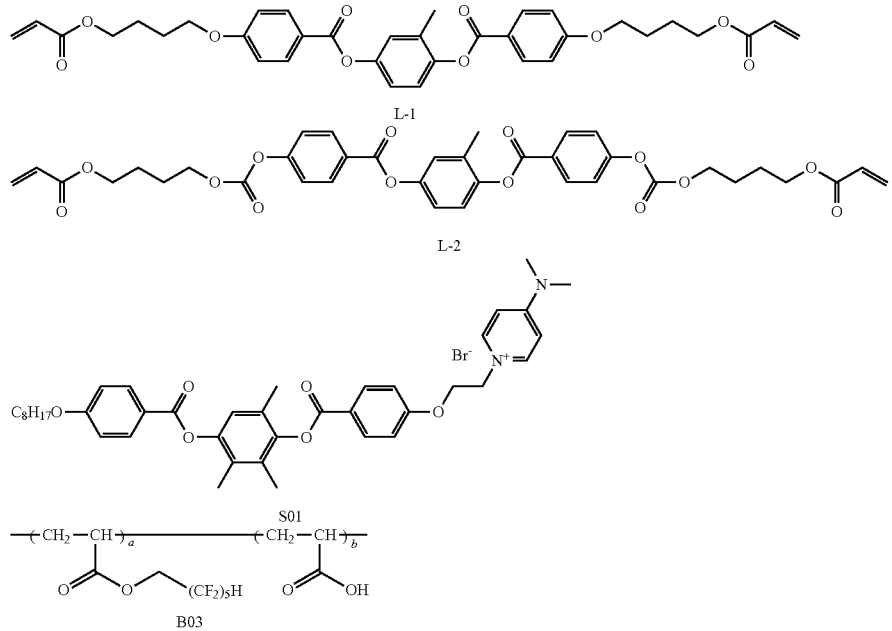

[Production of Circularly Polarizing Plate]

The side of the optically anisotropic layer of the positive C-plate film 1 produced above was adhered to the side of the optically anisotropic layer of the λ/4 phase difference film 1 through a pressure sensitive adhesive, and the cellulose acylate film 2 and the alignment layer were removed. Moreover, each of the optical laminates 31 and 32 produced in Production Examples 31 and 32 was adhered to the side of the λ/4 phase difference film through a pressure sensitive adhesive to obtain a circularly polarizing plate. A very thin circularly polarizing plate (about 50 μm) was obtained as compared with a normal circularly polarizing plate (about 110 μm).

GALAXY S5 manufactured by SAMSUNG, having an organic EL panel (organic EL display element) installed therein, was disassembled, the touch panel with a circularly polarizing plate was peeled from the organic EL display device, the circularly polarizing plate was further peeled from the touch panel, and the organic EL display element, the touch panel, and the circularly polarizing plate were each isolated. Subsequently, the isolated touch panel was adhered again to the organic EL display element, and the circularly polarizing plate produced above was adhered to the touch panel so that the positive C-plate film 1 side was the panel side, thereby producing an organic EL display device.

With regard to the produced organic EL display device, the same evaluation as in a case of using PURE-ACE WR (manufactured by TEIJIN LIMITED) as a λ/4 plate was performed, and thus, it was confirmed that the same effect was exhibited even in a case of using the optical laminate of the λ/4 phase difference film 1 and the positive C-plate film 1 as a λ/4 plate.

Production Examples 35 to 38

(Production of Adhesive A)

A photocurable adhesive A was produced in the same manner as for the adhesive A of JP2018-017996A.

(Production of Adhesive B)
A photocurable adhesive B was produced in the same manner as in Example 8 of JP2018-035361A.
(Production of Adhesive C)
A photocurable adhesive C was produced in the same manner as in Example 12 of JP2018-035361A.
(Production of Adhesive D)
A photocurable adhesive D was produced in the same manner as for the adhesive D of JP2018-017996A.

The adhesives A to D were used instead of the pressure sensitive adhesive at the time of producing the circularly polarizing plate in Production Example 31 to produce organic EL display devices, which were used as Production Examples 35 to 38. As in Production Example 31, it was confirmed that the reflection of the external light was suppressed.

Production Examples 39 to 41

(Production of Pressure Sensitive Adhesive A)
A pressure sensitive adhesive A was produced in the same manner as for the pressure sensitive adhesive of Example 1 of JP2017-134414A.
(Production of Pressure Sensitive Adhesive B)
A pressure sensitive adhesive B was produced in the same manner as in Example 1 of JP2017-165941A.
(Production of Pressure Sensitive Adhesive C)
A pressure sensitive adhesive C was produced in the same manner as in Comparative Example 1 of JP2017-165941A.

The pressure sensitive adhesive A to C were used for adhering the circularly polarizing plate to the touch panel in Production Example 35 to produce organic EL display devices, which were used as Production Examples 39 to 41. As in Production Example 31, it was confirmed that the reflection of the external light was suppressed.

EXPLANATION OF REFERENCES

10, 20: Optical laminate
12: Transparent support
14: Oxygen shielding layer
16: Photo-alignment layer
18: Light-absorbing anisotropic film

What is claimed is:
1. A light-absorbing anisotropic film,
comprising a dichroic azo coloring agent compound, a liquid crystalline compound, and a compound represented by Formula (1), and has a front transmittance of 60% or less, and
the content mass ratio of the dichroic azo coloring agent compound to the liquid crystalline compound is 5% to 35% by mass,

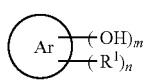

in Formula (1),
Ar represents an aromatic hydrocarbon ring having any one ring structure of a monocyclic structure, a condensed ring structure, or a polycyclic structure;
$R^1$ each represents any one group selected from the group consisting of an alkyl group, an alkenyl group, an alkynyl group, an aryl group, a monovalent heterocyclic group, and a silyl group;
m represents an integer of 1 to 3; and
n represents an integer of 1 to 6, and in a case where n is an integer of 2 to 6, a plurality of $R^1$'s may be the same as or different from each other and may be bonded to each other to form a ring.

2. The light-absorbing anisotropic film according to claim 1,
wherein the content mass ratio of the dichroic azo coloring agent compound to the liquid crystalline compound is 5% to 25% by mass.

3. The light-absorbing anisotropic film according to claim 1,
wherein the content mass ratio of the dichroic azo coloring agent compound to the liquid crystalline compound is more than 10% by mass and 25% by mass or less.

4. The light-absorbing anisotropic film according to claim 1,
wherein the content molar ratio of the compound represented by Formula (1) to the dichroic azo coloring agent compound is 1% to 50%.

5. The light-absorbing anisotropic film according to claim 1,
wherein the content molar ratio of the compound represented by Formula (1) to the dichroic azo coloring agent compound is 3.5% to 10%.

6. The light-absorbing anisotropic film according to claim 1,
wherein m in Formula (1) is 1.

7. The light-absorbing anisotropic film according to claim 1,
wherein the light-absorbing anisotropic film contains a dichroic azo coloring agent compound represented by Formula (3),

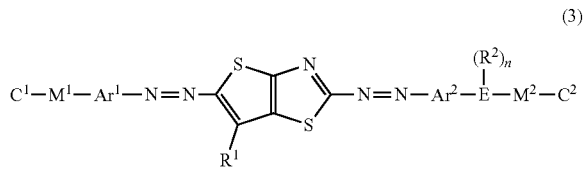

in Formula (3),
$C^1$ and $C^2$ each independently represent a monovalent substituent, provided that at least one of $C^1$ or $C^2$ represents a crosslinkable group;
$M^1$ and $M^2$ each independently represent a divalent linking group containing a main chain, wherein the number of atoms in a main chain of at least one of $M^1$ or $M^2$ is 4 or more;
$Ar^j$ and $Ar^e$ each independently represent any one group of a phenylene group which may have a substituent, a naphthylene group which may have a substituent, or a biphenylene group which may have a substituent;
E represents any one atom of a nitrogen atom, an oxygen atom, or a sulfur atom;
$R^1$ represents a hydrogen atom or a substituent;
$R^2$ represents a hydrogen atom or an alkyl group which may have a substituent; and
n represents 0 or 1, provided that in a case where E is a nitrogen atom, n is 1 and in a case where E is an oxygen atom or a sulfur atom, n is 0.

8. The light-absorbing anisotropic film according to claim 1,
wherein the light-absorbing anisotropic film contains a high-molecular weight liquid crystalline compound having a repeating unit represented by Formula (6),

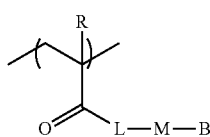
(6)

in Formula (6),
R represents a hydrogen atom or a methyl group;
L represents a single bond or a divalent linking group;
B represents a hydrogen atom, a halogen atom, a cyano group, an alkyl group, an alkoxy group, an amino group, an oxycarbonyl group, an acyloxy group, an acylamino group, an alkoxycarbonylamino group, a sulfonylamino group, a sulfamoyl group, a carbamoyl group, an alkylthio group, a sulfonyl group, a sulfinyl group, a ureido group, or a crosslinkable group; and
M represents a mesogenic group represented by Formula (1-1),

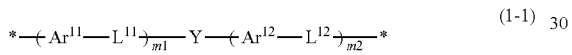
(1-1)

in Formula (1-1),
$Ar^{11}$ and $Ar^{12}$ each independently represent a phenylene group or a biphenylene group which may have a substituent;
$L^{11}$ and $L^{12}$ each independently represent a single bond or a divalent linking group including no azo group;
Y represents an imino group, a —OCO—CH=CH— group, or a —CH=CH—CO$_2$— group;
m1 and m2 each independently represent an integer of 1 to 3;
in a case where m1 is an integer of 2 or 3, a plurality of $Ar^{11}$'s may be the same as or different from each other and a plurality of $L^{11}$'s may be the same as or different from each other; and
in a case where m2 is an integer of 2 or 3, a plurality of $Ar^{12}$'s may be the same as or different from each other and a plurality of $L^{12}$'s may be the same as or different from each other.

9. The light-absorbing anisotropic film according to claim 1,
wherein the compound represented by Formula (1) is dibutylhydroxytoluene.

10. An optical laminate comprising:
the light-absorbing anisotropic film according to claim 1; and
a photo-alignment layer,
wherein the light-absorbing anisotropic film is formed on the photo-alignment layer.

11. An optical laminate comprising, in the following order:
a first oxygen shielding layer;
the light-absorbing anisotropic film according to claim 1 or the optical laminate according to claim 10; and
a second oxygen shielding layer.

12. The optical laminate according to claim 10, further comprising:
a λ/4 plate.

13. An image display device comprising:
the light-absorbing anisotropic film according to claim 1 or the optical laminate according to claim 10; and
an image display element.

14. The light-absorbing anisotropic film according to claim 6,
wherein the content mass ratio of the dichroic azo coloring agent compound to the liquid crystalline compound is more than 10% by mass and 25% by mass or less.

15. The light-absorbing anisotropic film according to claim 6,
wherein the content molar ratio of the compound represented by Formula (1) to the dichroic azo coloring agent compound is 1% to 50%.

16. The light-absorbing anisotropic film according to claim 6,
wherein the content molar ratio of the compound represented by Formula (1) to the dichroic azo coloring agent compound is 3.5% to 10%.

17. The light-absorbing anisotropic film according to claim 6,
wherein m in Formula (1) is 1.

18. The light-absorbing anisotropic film according to claim 6,
wherein the light-absorbing anisotropic film contains a dichroic azo coloring agent compound represented by Formula (3),

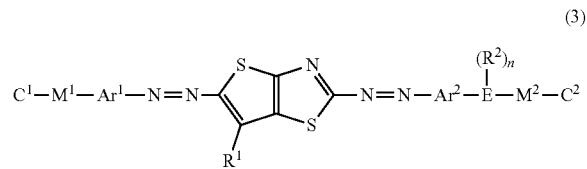
(3)

in Formula (3),
$C^1$ and $C^2$ each independently represent a monovalent substituent, provided that at least one of $C^1$ or $C^2$ represents a crosslinkable group;
$M^1$ and $M^2$ each independently represent a divalent linking group containing a main chain, wherein the number of atoms in a main chain of at least one of $M^1$ or $M^2$ is 4 or more;
$Ar^1$ and $Ar^2$ each independently represent any one group of a phenylene group which may have a substituent, a naphthylene group which may have a substituent, or a biphenylene group which may have a substituent;
E represents any one atom of a nitrogen atom, an oxygen atom, or a sulfur atom;
$R^1$ represents a hydrogen atom or a substituent;
$R^2$ represents a hydrogen atom or an alkyl group which may have a substituent; and
n represents 0 or 1, provided that in a case where E is a nitrogen atom, n is 1 and in a case where E is an oxygen atom or a sulfur atom, n is 0.

19. An optical laminate comprising:
the light-absorbing anisotropic film according to claim 6; and
a photo-alignment layer,
wherein the light-absorbing anisotropic film is formed on the photo-alignment layer.

20. An image display device comprising:
the light-absorbing anisotropic film according to claim 6 or the optical laminate according to claim 19; and
an image display element.

* * * * *